US008058652B2

(12) United States Patent
Honda

(10) Patent No.: US 8,058,652 B2
(45) Date of Patent: Nov. 15, 2011

(54) SEMICONDUCTOR DEVICE USED AS ELECTRO-OPTICAL DEVICE HAVING CHANNEL FORMATION REGION CONTAINING FIRST ELEMENT, AND SOURCE OR DRAIN REGION CONTAINING SECOND ELEMENT

(75) Inventor: Tatsuya Honda, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/258,116

(22) Filed: Oct. 26, 2005

(65) Prior Publication Data

US 2006/0091394 A1    May 4, 2006

(30) Foreign Application Priority Data

Oct. 28, 2004  (JP) .................................. 2004-314346

(51) Int. Cl.
*H01L 29/76* (2006.01)

(52) U.S. Cl. ................. 257/66; 257/57; 257/59; 257/72; 257/E29.273

(58) Field of Classification Search .................... 257/66, 257/57, 59, 72, E29.273
See application file for complete search history.

(56) References Cited

U.S. PATENT DOCUMENTS

| 4,065,781 | A | * | 12/1977 | Gutknecht | ....................... | 257/66 |
| 5,153,690 | A | * | 10/1992 | Tsukada et al. | ................. | 257/61 |
| 5,569,936 | A | | 10/1996 | Zhang et al. | | |
| 5,595,923 | A | | 1/1997 | Zhang et al. | | |
| 5,705,829 | A | | 1/1998 | Miyanaga et al. | | |
| 5,801,398 | A | * | 9/1998 | Hebiguchi | ...................... | 257/66 |
| 5,821,565 | A | | 10/1998 | Matsuzaki et al. | | |
| 6,472,684 | B1 | | 10/2002 | Yamazaki et al. | | |
| 6,509,602 | B2 | | 1/2003 | Yamazaki et al. | | |
| 6,756,640 | B2 | | 6/2004 | Yamazaki et al. | | |
| 7,026,713 | B2 | * | 4/2006 | Hoffman et al. | .............. | 257/749 |

(Continued)

FOREIGN PATENT DOCUMENTS

| CN | 1094851 | 11/1994 |
| CN | 1522470 | 8/2004 |
| JP | 11-154714 | 6/1999 |
| JP | 2003-017706 | 1/2003 |

OTHER PUBLICATIONS

Office Action (Application No. 200510118808.0) dated Jul. 4, 2008.

*Primary Examiner* — Anh Phung
*Assistant Examiner* — Allison P Bernstein
(74) *Attorney, Agent, or Firm* — Eric J. Robinson; Robinson Intellectual Property Law Office, P.C.

(57) ABSTRACT

A semiconductor device having an island semiconductor film which is a channel formation region and a semiconductor film which is a source or drain region being in contact with a side face of the island semiconductor film, and a method for manufacturing the semiconductor device are disclosed. The manufacturing costs can be suppressed by forming the island semiconductor film which is to be a channel formation region and the semiconductor film which is to be a source or drain region without using a doping apparatus. The source or drain region is in contact with the side surface of the island semiconductor film which is the channel formation region, a depletion layer is broaden not only in a film thickness direction but also in the crosswise direction and an electric field due to drain voltage is relieved. Therefore, a semiconductor device with high reliability can be manufactured.

19 Claims, 33 Drawing Sheets

U.S. PATENT DOCUMENTS

| | | |
|---|---|---|
| 7,238,557 B2 | 7/2007 | Hayakawa |
| 2004/0149680 A1* | 8/2004 | Ohmi .............................. 216/13 |
| 2004/0222424 A1 | 11/2004 | Yamazaki et al. |
| 2005/0012097 A1 | 1/2005 | Yamazaki |
| 2006/0124930 A1* | 6/2006 | Chen et al. ...................... 257/57 |
| 2009/0035923 A1 | 2/2009 | Ohtani et al. |

* cited by examiner

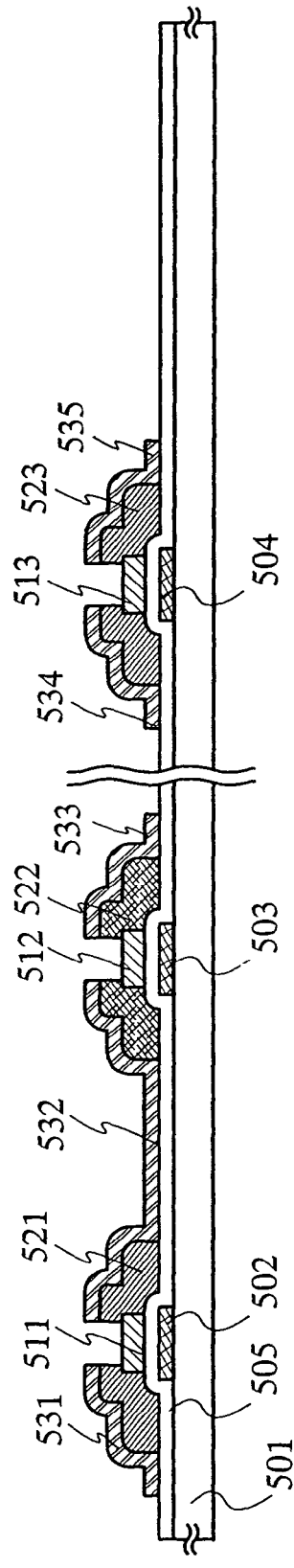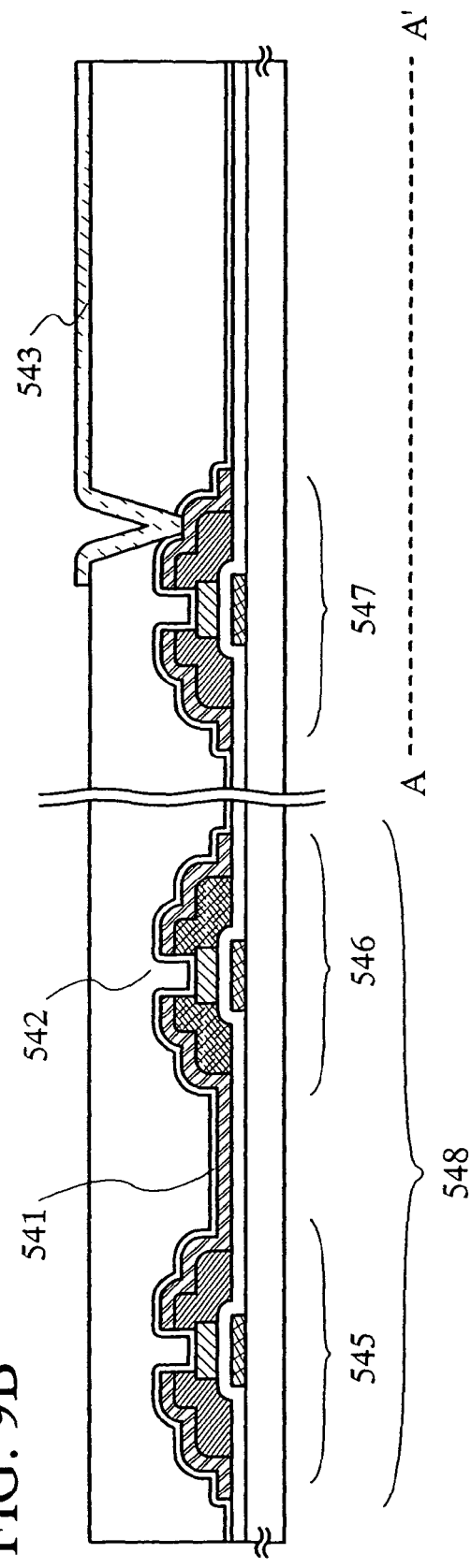
FIG. 9A
FIG. 9B 501, 581, 701

555

561

SEMICONDUCTOR DEVICE USED AS ELECTRO-OPTICAL DEVICE HAVING CHANNEL FORMATION REGION CONTAINING FIRST ELEMENT, AND SOURCE OR DRAIN REGION CONTAINING SECOND ELEMENT

BACKGROUND OF THE INVENTION

1. Field of the Invention

The present invention relates to a semiconductor element such as a thin film transistor (hereinafter, TFT) or a method for manufacturing a semiconductor device having a circuit composed of such the semiconductor element. For example, the present invention relates to an electro-optical device as typified by a liquid crystal display panel, an EL (electroluminescence) display device, an EC display device, or the like. Further, the present invention relates to an electrical device for improving processing speed formed by a TFT, for example, a central processing unit (CPU) and a method for manufacturing the electrical device. More specifically, the present invention relates to an electronic device mounted with the electro-optical device and the electrical device.

2. Related Art

In recent years, a TFT with higher mobility than ever is required at the request of growing a display panel in size and driving of a display panel which has an internal driver, an EL display panel, or the like.

Therefore, a TFT which has higher characteristics than those of a TFT using an amorphous semiconductor film and which is formed by a crystalline semiconductor film with a large crystal grain has been developed. The TFT using the crystalline semiconductor film has an advantage of having higher mobility than that of a TFT using an amorphous semiconductor film.

On the other hand, energy of hot carriers generated in the TFT using the crystalline semiconductor film is larger than that in the TFT using an amorphous semiconductor film because of high mobility.

As a result, deterioration of the TFT using the crystalline semiconductor film such as hot carrier deterioration is worse than that of the TFT using an amorphous semiconductor film.

When the crystallinity of the semiconductor film is improved and the level of mobility approaches that of a single crystal semiconductor, reliability of the device becomes large problem. It becomes required to suppress the deterioration of the device.

In order to improve the reliability of the device against deterioration due to hot carriers or the like, it is important to relieve an electrical field in a junction region of a source or drain region.

As a method for forming the source or drain region, there is a method, that is, a film containing a donor impurity (impurity imparting n-type conductivity) or an acceptor impurity (impurity imparting p-type conductivity) is deposited by a CVD apparatus or the like (FIG. 2A).

FIG. 2A shows an n-channel TFT in which a source or drain region is formed by depositing a film containing a donor impurity or an acceptor impurity. In FIG. 2A, reference numeral 1001 denotes a substrate; 1002, a gate electrode; 1003, a gate insulating film; 1004, a semiconductor film containing an element belonging to group 13 in the periodic table (an acceptor impurity, an impurity imparting p-type conductivity); 1005 a semiconductor film containing an element belonging to group 15 (a donor impurity, an impurity imparting n-type conductivity); and 1006, a source or drain electrode.

A semiconductor film 1005 containing an element belonging to group 15 becomes a source or drain region, whereas a region interposed between the source and drain regions 1005 among a semiconductor film 1004 containing an element belonging to group 13 becomes a channel formation region. In FIG. 2A, a region indicated by Lov is a region in which the source or drain region 1005 is overlapped with the gate electrode 1002.

However, this structure makes broadening of a depletion layer 1007 only to the extent of a thickness (approximately 200 nm) of the semiconductor film 1004 as indicated by an arrow in the diagram when drain voltage is applied (FIG. 2B), and so a large electric field is generated in the depletion layer 1007. There is a problem that carriers which receive large energy from the electric field become hot carriers which bring about avalanche or which are injected in an interface between the gate insulating film 1003 and the semiconductor film 1004 or in the gate insulating film 1003 to deteriorate the element.

As another method for manufacturing the bottom gate TFT, there is a method of injecting a donor impurity or an acceptor impurity with a doping apparatus to a region which becomes a source or drain region (FIG. 2C).

In FIG. 2C, reference numeral 1101 denotes a substrate; 1102, a gate electrode; 1103, gate insulating film; 1104, a semiconductor film containing an element belonging to group 15; 1106, a region added with an element belonging to group 13 among a semiconductor film 1104; 1105, a region which is not added with an element belonging to group 13 among a semiconductor film 1104; and 1107, a source or drain electrode.

The region 1106 added with an element belonging to group 13 among a semiconductor film 1104 is a channel formation region, whereas the region 1105 which is not added with an element belonging to group 13 among a semiconductor film 1104 is a source region or drain region. In FIG. 2C, a region indicated by Lov is a region in which the source or drain region 1105 is overlapped with the gate electrode 1102.

The channel formation region 1106 may be formed by depositing the semiconductor film 1104 containing an element belonging to group 15 by a plasma CVD and introducing an element belonging to group 13 with a doing apparatus. Alternatively, the channel formation region 1106 and the source or drain region 1105 may be formed by adding selectively elements belonging to groups 13 and 15 after forming an intrinsic semiconductor film (refer to Unexamined patent publication No. 11-154714).

A doping apparatus is expensive, and so manufacturing costs can be reduced by using a method of depositing a semiconductor film containing an impurity without a doping apparatus.

SUMMARY OF THE INVENTION

It is an object of the present invention to reduce manufacturing costs by reducing the use of a doping apparatus and to improve reliability of a TFT by relieving an electric field due to drain voltage in a method for manufacturing the TFT.

In accordance with the present invention, broadening of the depletion layer due to the drain voltage can be enlarged by increasing a region where a semiconductor film containing an impurity in the vicinity of a drain region is overlapped with a channel formation region.

The present invention provides a semiconductor device comprising a gate electrode formed over a substrate; a gate insulating film formed over the gate electrode; an island semiconductor film containing an element belonging to group 13 in a periodic table formed over the gate insulating film; a semiconductor film containing an element belonging to group 15 in a periodic table being in contact with a part of a top surface and a side face of the island semiconductor film containing an element belonging to group 13; and an electrode formed over the semiconductor film containing an element belonging to group 15; wherein the island semiconductor film containing an element belonging to group 13 is a channel formation region, and the semiconductor film containing an element belonging to group 15 is a source or drain region.

The present invention provides a semiconductor device comprising a gate electrode formed over a substrate; a gate insulating film formed over the gate electrode; an island semiconductor film containing an element belonging to group 13 in a periodic table formed over the gate insulating film; a semiconductor film containing an element belonging to group 13 in a periodic table in higher density than that in the island semiconductor film, the semiconductor film being in contact with a part of a top surface and a side face of the island semiconductor film containing an element belonging to group 13; and an electrode formed over the semiconductor film containing an element belonging to group 13; wherein the semiconductor film containing an element belonging to group 13 is a channel formation region, and the semiconductor film containing an element belonging to group 15 is a source or drain region.

The present invention provides a semiconductor device comprising a gate electrode formed over a substrate; a gate insulating film formed over the gate electrode; an island semiconductor film containing an element belonging to group 13 in a periodic table formed over the gate insulating film; a semiconductor film containing an element belonging to group 13 in a periodic table in higher density than that in the island semiconductor film, the semiconductor film being in contact with a part of a top surface and a side face of the island semiconductor film containing an element belonging to group 13; and an electrode formed over the semiconductor film containing an element belonging to group 13; wherein the semiconductor film containing an element belonging to group 13 is a channel formation region, and the semiconductor film containing an element belonging to group 13 is a source or drain region.

The present invention provides a method for manufacturing a semiconductor device comprising the steps of forming a gate electrode over a substrate; forming a gate insulating film over the gate electrode; forming an island semiconductor film containing an element belonging to group 13 in a periodic table over the gate insulating film; forming a semiconductor film containing an element belonging to group 13 in a periodic table in higher density than that in the island semiconductor film containing an element belonging to group 13, the semiconductor film being in contact with a part of a top surface and a side face of the island semiconductor film containing an element belonging to group 13; and forming an electrode over the semiconductor film containing an element belonging to group 13; wherein the island semiconductor film containing an element belonging to group 13 is a channel formation region, and the semiconductor film containing an element belonging to group 13 is a source or drain region.

The present invention provides a method for manufacturing a semiconductor device comprising the steps of forming a gate electrode over a substrate; forming a gate insulating film over the gate electrode; forming an amorphous semiconductor film containing an element belonging to group 13 in a periodic table over the gate insulating film; introducing a catalyst element for promoting crystallization into the amorphous semiconductor film containing an element belonging to group 13; forming a crystalline semiconductor film by heating the amorphous semiconductor film containing an element belonging to group 13; forming an island crystalline semiconductor film by the crystalline semiconductor film; forming a semiconductor film containing an element group 15 being in contact with a part of a top surface and a side face of the island crystalline semiconductor film; removing the catalyst element in the island crystalline semiconductor film by being moved to the semiconductor film containing an element group 15 by heating the island crystalline semiconductor film and the semiconductor film containing an element group 15; and forming an electrode over the semiconductor film containing an element group 15; wherein the island crystalline semiconductor film containing an element group 15 is a channel formation region, and the semiconductor film containing an element group 15 is a source or drain region.

In the present invention, the island semiconductor film is a crystalline semiconductor film.

In the present invention, the catalyst element is one element or a plurality of elements selected from the group consisting of nickel (Ni), germanium (Ge), iron (Fe), palladium (Pd), tin (Sn), lead (Pb), cobalt (Co), platinum (Pt), copper (Cu), and gold (Au).

In accordance with the present invention, reliability of a TFT is improved by relieving an electric field due to a drain voltage applied to a depletion layer.

Further, manufacturing costs can be reduced since the TFT can be manufactured by reducing the use of a doping apparatus.

These and other objects, features and advantages of the present invention will become more apparent upon reading of the following detailed description along with the accompanied drawings.

BRIEF DESCRIPTION OF THE DRAWINGS

FIGS. 9A and 9B are views for showing a manufacturing process of a liquid crystal display device according to the present invention;

DESCRIPTION OF THE INVENTION

Embodiment is explained with reference to FIGS. 1A and 1B.

Figure 1A:
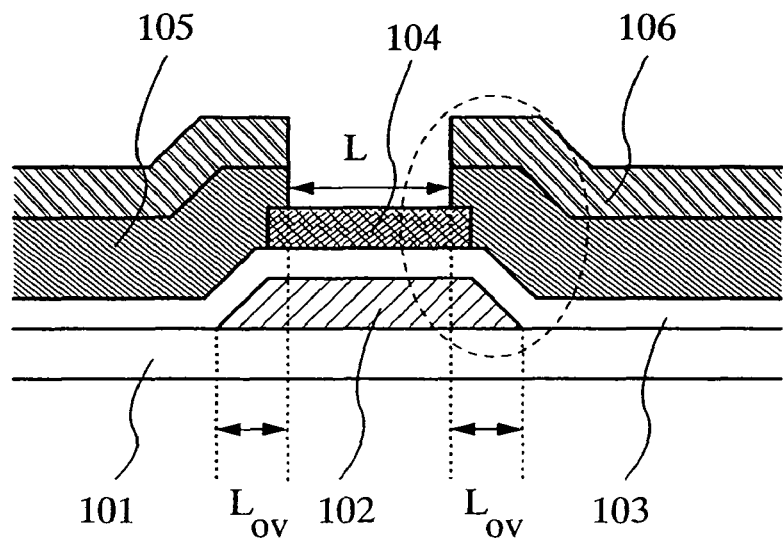
FIGS. 1A and 1B are cross-sectional views for showing a TFT according to the present invention.
Figure 1B:
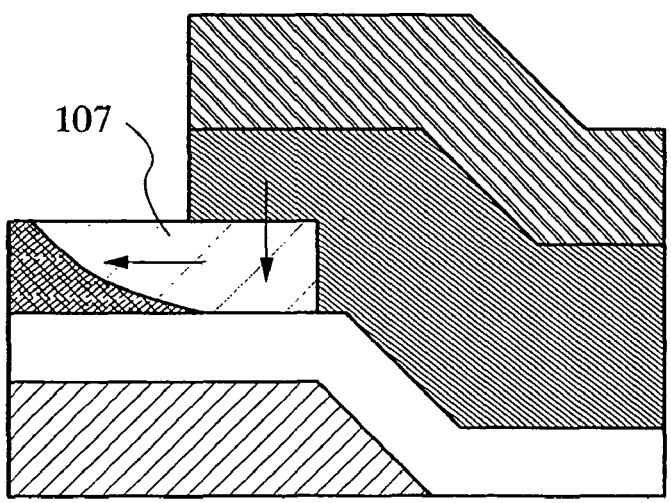

In FIG. 1A, reference numeral 101 denotes a substrate; 102, a gate electrode; 103, a gate insulating film; 104, an island crystalline semiconductor film containing an element belonging to group 13; 105, a semiconductor film containing an element belonging to group 15; and 106, a source or drain region. The semiconductor film 105 becomes a source or drain region. The island crystalline semiconductor film 104 becomes a channel formation region. In FIG. 1A, a region indicated by Lov is a region in which a source or drain region 105 is overlapped with a gate electrode 102.

In a TFT structure shown in FIG. 1A, the semiconductor film 105 which is the source or drain region is in contact with a part of a top surface and a side face of the island crystalline semiconductor film 104 which is the channel formation region. That is, the source region or drain region 105 and the channel formation region 104 are adjacent to each other both in a film thickness direction and a crosswise direction (a direction parallel to a substrate) of the island crystalline semiconductor film 104. A drain electric field at applying drain voltage acts in the direction of the channel formation region 104 from the source or drain region 105, and the depletion layer 107 can broaden not only in the thickness direction but also the crosswise direction as indicated by arrow, and so drain voltage is relieved (FIG. 1B).

As a result, reliability of a TFT is improved since hot carriers generation is suppressed. Typically, a length between a source and a drain (channel length) is several micro meters. On the other hand, a thickness of the channel formation region 104 is approximately 200 nm. Therefore, the depletion layer 107 cannot sufficiently broaden in the longitudinal direction but can broaden in the crosswise direction largely. As used herein, the term "longitudinal direction" refers to a direction in which films are stacked, whereas the term "crosswise direction" refers to a direction parallel to a substrate. Therefore, reliability of a device is improved in the case of having the structure in which the source or drain region 105 and the channel formation region 104 are arranged side-by-side as shown in FIG. 1A.

The TFT explained in this embodiment is an n-channel TFT. In the case that the TFT is a p-channel TFT, the source or drain region 105 in the diagram may be formed by a semiconductor film containing an element belonging to group 13 instead of using a semiconductor film containing an element belonging to group 15. In that case, density of a p-type impurity in the source or drain region 105 is required to be higher than that of the channel formation region 104.

Example 1

This example is explained with reference to FIGS. 1A to 2B and FIGS. 4 to 7.

In this example, characteristics of a TFT manufactured according to the conventional method and those of a TFT manufactured according to the present invention are compared with each other.

Parameters of n-channel TFTs in FIG. 2A (Type A), FIG. 2C (Type B), and FIG. 1A (Type C) are set as follows. Drain voltage dependence of drain current and gate voltage dependence of drain current were calculated.

Figure 2A:
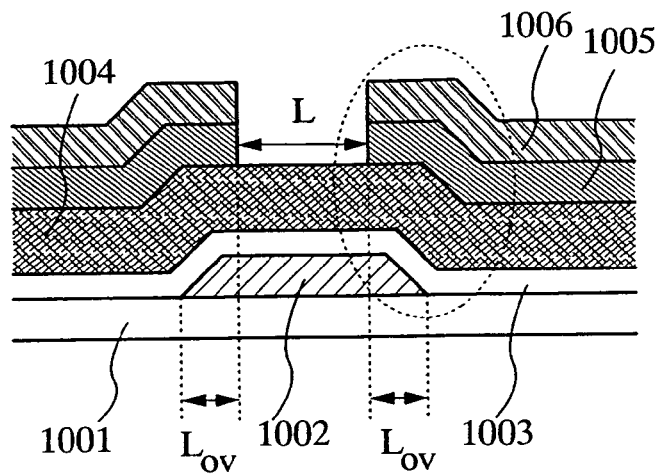
FIGS. 2A to 2C are cross-sectional views for showing the conventional TFT.
Figure 2B:
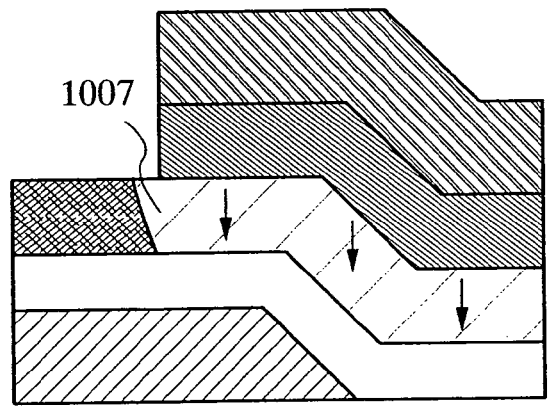

In the TFT (Type A) shown in FIG. 2A, as referred to above, a semiconductor film 1005 containing an element belonging to group 15 in the periodic table serving as a source or drain region over a semiconductor film 1004 containing an element belonging to group 13 in the periodic table having a channel formation region is formed.

Figure 2C:
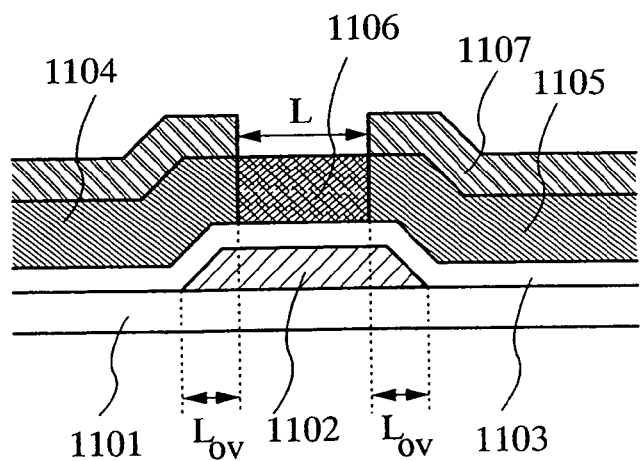

In the TFT (Type B) shown in FIG. 2C, as referred to above, a channel formation region 1106 formed by adding an element belonging to group 13 in the periodic table and a source or drain region 1105 containing an element belonging to group 15 in the periodic table are formed in a semiconductor film 1104.

In the TFT (Type C) shown in FIG. 1A, as referred to above, a source or drain region 105 being in contact with the side face of a channel formation region 104 and an island crystalline semiconductor film 104 which is a channel formation region are formed.

A thickness, a length, and an amount of injection of dopant were set as follows: a gate insulating film: a silicon oxide film, and a thickness of 100 nm; a channel formation region: a silicon film, a thickness of 100 nm, boron dope $1\times10^{16}$ cm$^{-3}$, and 1 µm of Lov; a gate electrode: molybdenum (Mo), a thickness of 100 nm, and a length of 6 µm; and a source or drain region: phosphorus dope $1\times10^{20}$ cm$^{-3}$, and a length of 1 µm. Note that the width of the TFT is set to be 1 µm.

Avalanche, recombination between bands, tunnel current between bands, and a high electric field model were used as a physical model. Semiconductor silicon was calculated on the assumption that it is in an ideal state without defect. ISE TCAD GENESISe 7.0 was used as calculation software.

Figure 4:
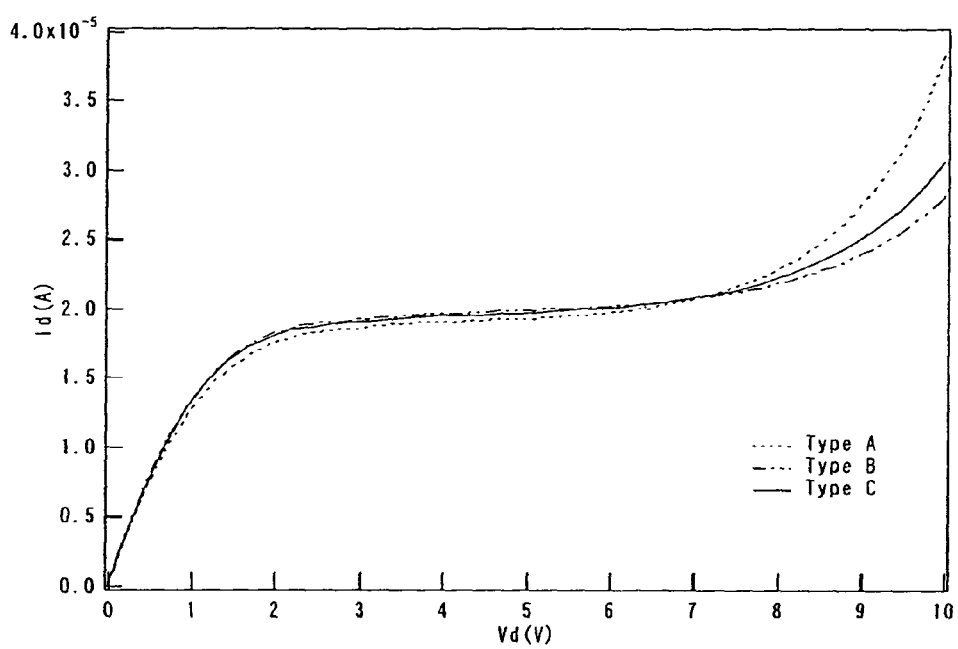
FIG. 4 is a view for showing drain current-drain voltage dependence of a TFT.

FIG. 4 shows the calculation results of drain current-drain voltage dependence in the TFTs in Type A to Type C. Here, gate voltage was 3.0 V in all of the TFTs.

As is clear from FIG. 4, drain current of the Type A TFT (FIG. 2A) is considerably increased in the region at the drain voltage of around 8 V compared to the TFTs having the other structures. Since a region at high drain voltage is a saturated region, the drain current is ideally stabilized irrespective of the drain voltage. The reason why drain current is not stabilized is that carriers are accelerated due to high drain voltage and become into hot carriers, avalanche (hot carriers are dispersed in a crystal lattice to lose energy and the energy is accepted by a crystal to produce a pair of an electron and a hole) or the like is brought about, and surplus carriers are generated in a channel formation region. The surplus carriers increase the drain current. In addition, an energy band is considerably bent by the high drain electric field and a band gap of a depletion layer in the vicinity of a drain region is extremely narrowed, and so tunnel current between bands (balance band-conductive band) is generated.

As shown in FIG. 4, the increase of saturated current in the saturated region with the increase of the drain voltage means that hot carriers are generated in the channel formation region. The hot carriers break a crystal lattice of a channel formation region, and the hot carriers which are injected in a gate insulating film interface and a gate insulating film deteriorate threshold voltage, mobility, or the like. In the case that a TFT operates in the saturated region, the hot carriers cause variation of TFT characteristics or deterioration of operation. Therefore, it is required to inhibit the generation of hot carriers in order to keep the reliability of a TFT.

As shown in FIG. 4, hot carriers in the Type A TFT (FIG. 2A) are not sufficiently inhibited. On the other hand, characteristics of the Type C TFT (FIG. 1A) according to this example are close to those of the Type B TFT (FIG. 2C) and hot carriers are inhibited.

Figure 5:
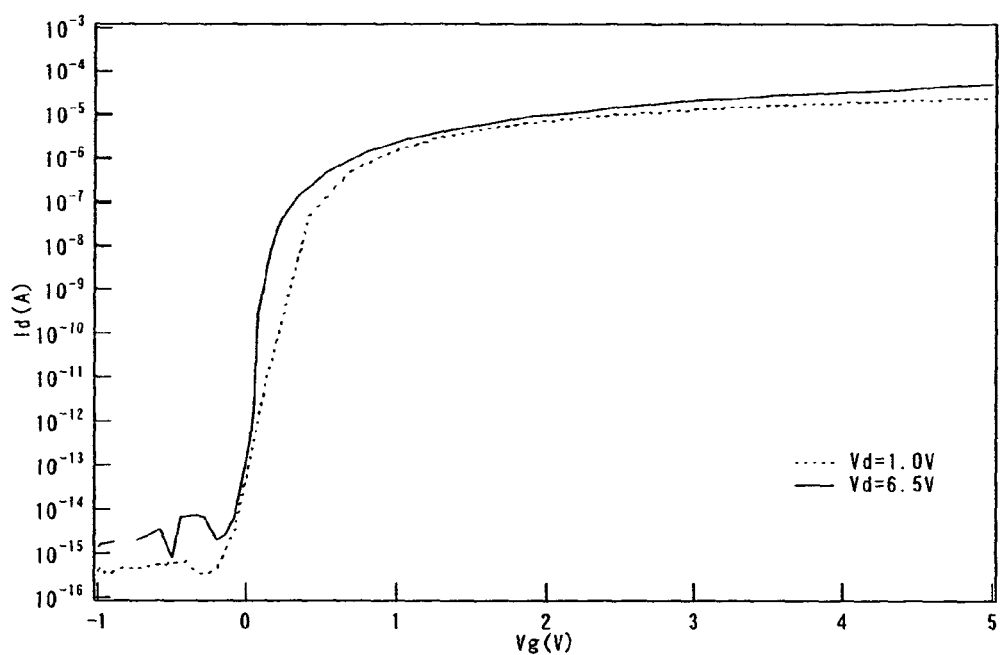
FIG. 5 is a view for showing drain current-drain voltage dependence of the conventional TFT.
Figure 6:
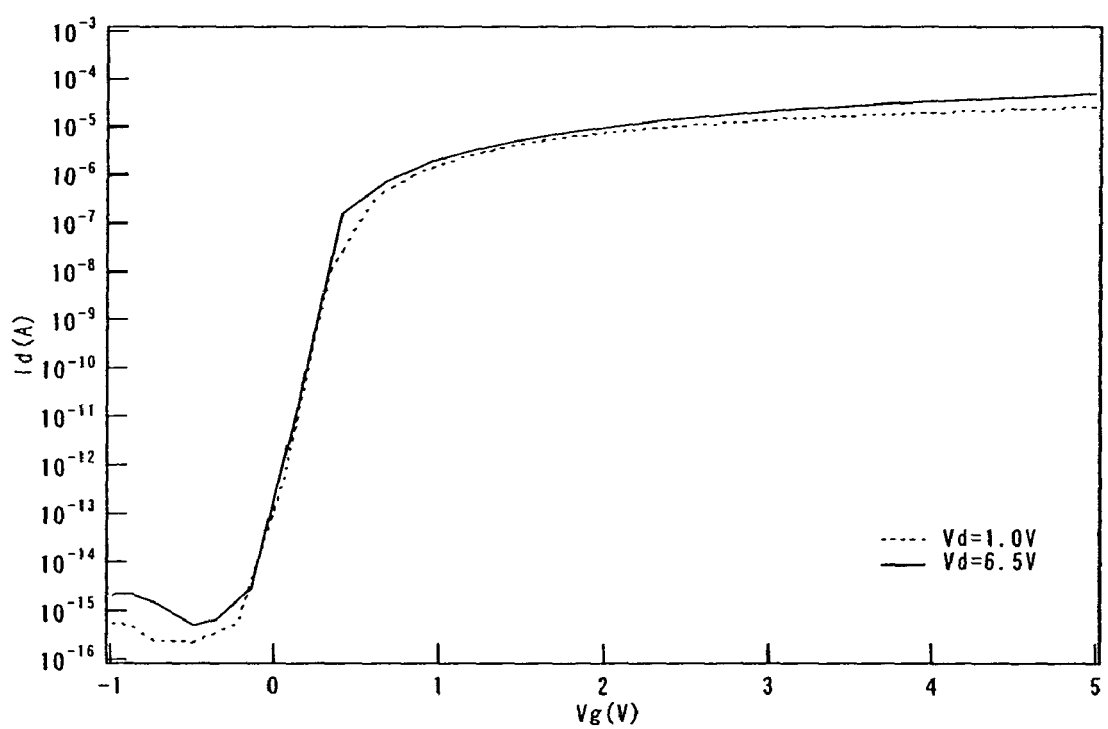
FIG. 6 is a view for showing drain current-drain voltage dependence of the conventional TFT.
Figure 7:
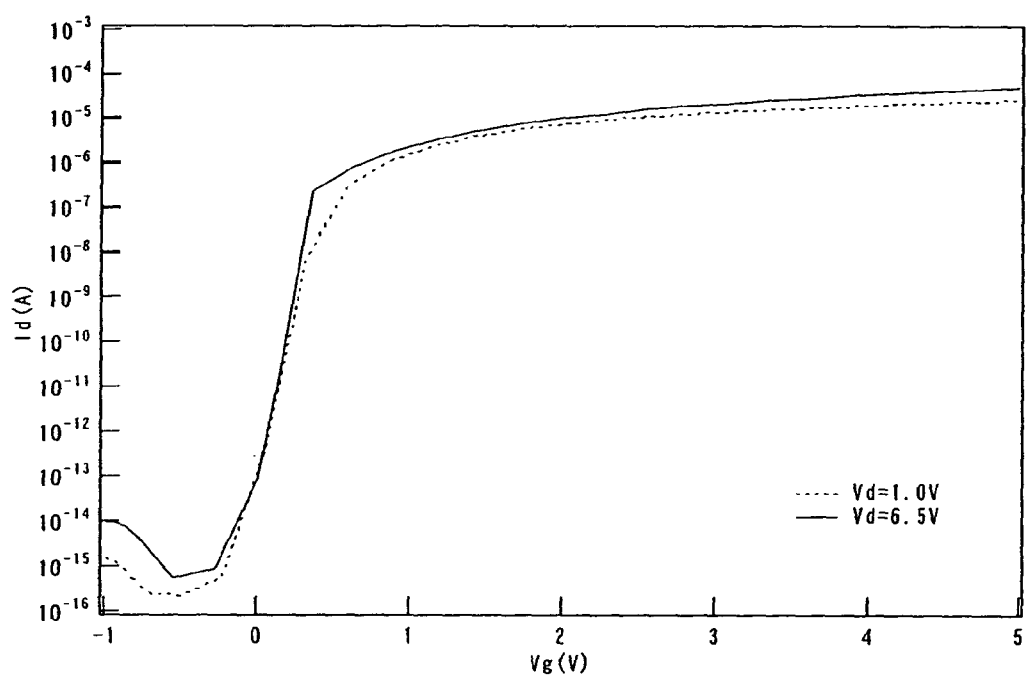
FIG. 7 is a view for showing drain current-drain voltage dependence of a TFT according to the present invention.

FIGS. 5 to 7 show the results of calculation of gate voltage dependence of drain current in TFTs of Types A to C.

FIG. 5 shows drain current-gate voltage dependence of the Type A TFT (FIG. 2A).

In a saturated region around Vg=0 V where a characteristic curve rises, drain current is ideally and desirably stabilized irrespective of drain voltage. If the drain current is not stabilized, hot carriers are generated in the vicinity of the drain region as referred to above. As is clear from FIG. 5, a current value of the saturated region is increased with the increase of drain voltage in the Type A TFT (FIG. 2A).

On the other hand, the Type C TFT (FIG. 1A) formed according to the present invention exhibits smaller drain voltage dependence of drain current in the saturated region as shown in FIG. 7. Accordingly it can be known that the characteristic of the Type C TFT is largely similar to that of the Type B TFT (FIG. 2C) (FIG. 6). Therefore, according to the present invention, even if a TFT is manufactured without using a doping apparatus, the TFT can be manufactured to have the same characteristics as those of a TFT which is manufactured with the use of a doping apparatus.

A method for manufacturing a bottom gate TFT according to this example is explained hereinafter with reference to FIGS. 1A and 1B.

An insulating film such as a silicon oxide film is formed over a glass substrate or a single crystalline semiconductor substrate to have a thickness of 150 nm as a substrate 101, and a metal film such as molybdenum (Mo) is formed thereover as a material for a gate electrode to have a thickness of 100 nm. A gate electrode 102 is formed by dry etching the metal film with resist.

A silicon oxide film is formed to have a thickness of 100 nm as a gate insulating film 103. An amorphous semiconductor film such as an amorphous silicon film is formed to have a thickness of 100 nm. A catalyst element such as nickel (Ni) which promotes crystallization of the amorphous semiconductor film is added to the amorphous silicon film to crystallize by heat treatment or laser irradiation. As the silicon film formed over the gate insulating film 103, not only the amorphous silicon but also a microcrystal can be formed. Thereafter, a boron element is ion doped at the density of $1 \times 10^{16}$ $cm^{-3}$ in order to control threshold value according to need.

A crystallized silicon film is dry etched to form an island shaped crystalline semiconductor film 104.

A semiconductor film containing an element belonging to group 15 in the periodic table is formed. In that case, it is important that the semiconductor film containing an element belonging to group 15 in the periodic table is formed to cover the island shaped crystalline semiconductor film 104. Thereafter, a conductive film such as molybdenum (Mo) is formed to have a thickness of 200 nm. An electrode 106 is formed by etching the conductive film. A source or drain region 105 is formed by etching the semiconductor film containing an element belonging to group 15 in the periodic table with the electrode 106 as a mask.

The present invention can apply to an amorphous semiconductor film, a polycrystalline semiconductor which is formed by crystallizing an amorphous semiconductor, or a polycrystalline semiconductor over a single crystal wafer, SOI wafer, a glass substrate, or an insulating film. The semiconductor film can be applied to an elemental substance such as silicon (Si) or germanium (Ge), a compound semiconductor such as GaAs, InP, SiC, ZnSe, or GaN, or a mixed crystal semiconductor such as SiGe or $Al_xGaAs_{1-x}$.

As the catalyst element which promotes crystallization, in addition to nickel (Ni), one element or a plurality of elements selected from the group consisting of germanium (Ge), iron (Fe), palladium (Pd), tin (Sn), lead (Pb), cobalt (Co), platinum (Pt), copper (Cu), and gold (Au) can be used.

In the case of forming a semiconductor film containing an element belonging to group 15 in the periodic table, an impurity serving as a donor such as phosphorus (P), arsenic (As), or antimony (Sb) is injected. In the case of forming a semiconductor film containing an element belonging to group 13 in the periodic table, an impurity serving as an acceptor such as boron (B), tin (Sn), or aluminum (Al) is injected.

As the insulating film, a single layer film such as a thermally-oxidized film, a silicon oxide film, silicon oxide film containing nitrogen, or a silicon nitride film; and a multilayer film which is a combination of the foregoing films can be used.

As the gate electrode, a single layer film such as a polycrystalline silicon film, molybdenum (Mo), tungsten (W), aluminum (Al), titanium (Ti), or tantalum (Ta); and a multilayer film which is a combination of the foregoing films can be used.

This example can be combined with any description in Embodiment if necessary.

Example 2

In this example, an example of a method for manufacturing a bottom gate TFT other than that in Example 1 is explained with reference to FIGS. 3A to 3E.

A conductive film is formed over a substrate 200 and a gate electrode 201 is formed by the conductive film. As the substrate 200, a glass substrate such as barium borosilicate glass or alumino borosilicate glass, a quartz substrate, a stainless substrate, or the like can be used. A substrate made from plastic as typified by PET, PES, or PEN, or synthetic resin having flexibility such as acrylic can be used as the substrate 200.

The gate electrode 201 is formed to have a structure composed of a single layered conductive film or two or more layered conductive films. As the conductive film, an element selected from the group consisting of tantalum (Ta), tungsten (W), titanium (Ti), and molybdenum (Mo); or a laminated layer composed of an alloy material containing the foregoing elements as its main component or a compound material such as nitrides of the foregoing elements can be used. Alternatively, the gate electrode 201 can be formed by using a semiconductor film as typified by a polycrystalline silicon film formed by doping an impurity element such as phosphorus (P). In this example, the gate electrode 201 is formed by using a film formed by stacking tantalum nitride (TaN) and tungsten (W) in thicknesses of 30 nm and 120 nm, respectively.

The gate electrode 201 can be integrally formed with a wiring. Alternatively, the gate electrode 201 can be formed separately from a gate wiring, thereafter, they can be electrically connected to each other.

After forming the gate electrode 201, a gate insulating film 202 is formed over the gate electrode 201 and the substrate 200. As the gate insulating film 202, an insulating film such as a silicon nitride film, a silicon nitride film containing oxygen, or a silicon oxide film containing nitrogen can be used. The gate insulating film 202 has a roll to prevent an alkali metal or an alkali earth metal such as Na contained in the substrate 200 from dispersing in the semiconductor film thereby causing adverse effects on the characteristics of the semiconductor element.

When using such the laminate layer as the gate insulating film 202, the capacity of a TFT which will be completed by the subsequent process is increased, whereas the threshold value of the TFT at operating is hardly changed compared to the case of using a silicon oxide film as a gate insulating film 202, and so the laminate layer is useful. The thin silicon nitride film, the silicon oxide film, and the silicon nitride film containing oxygen can be deposited by a CVD method in thicknesses of 5 nm, 100 nm, and 50 nm, respectively.

Here, an example of using a laminate film as the gate insulating film 202 is explained; however, a single layered insulating film can be used.

A semiconductor film containing an element selected from elements belonging to group 13 in the periodic table is formed over the gate insulating film 202. As the semiconductor film containing an element selected from elements belonging to group 13 in the periodic table, an amorphous semiconductor film, a microcrystalline semiconductor film, or a crystalline semiconductor film which is formed by crystallizing an amorphous semiconductor film with heat can be used.

In this embodiment, as the semiconductor film containing an element selected from elements belonging to group 13 in the periodic table, a crystalline semiconductor film formed by forming an amorphous semiconductor film and crystallizing the amorphous semiconductor film with a catalyst element which promotes crystallization. Hereinafter, a manufacturing process for obtaining the crystalline semiconductor film is explained.

Firstly, an amorphous semiconductor film 203 containing a minute amount of an element selected from elements belonging to group 13 in the periodic table is formed. As the amorphous semiconductor film 203, silicon (Si) or silicon germanium (SiGe) alloy may be used. In the case of using silicon germanium, germanium has preferably density of approximately 0.01 to 4.5 atomic %. In this example, an amorphous silicon film containing a minute amount of an element selected from elements belonging to group 13 in the periodic table such as boron (B) is formed to have a thickness of 100 nm by a plasma CVD method.

A thin oxide film is formed over a surface of the amorphous semiconductor film 203. The oxide film is formed since a solution containing a catalyst element which will be coated in the subsequent process is uniformly coated over the amorphous semiconductor film 203.

The thin oxide film is formed by oxidation treatment with water (ozone water) in the state of water in which ozone is dissolved, heat treatment in the oxidizing atmosphere, UV light irradiation, or the like. In this example, the thin oxide film is formed by coating ozone water.

A catalyst element which promotes crystallization of a semiconductor film is introduced to the surface of the amorphous semiconductor film 203. As a method for introducing the catalyst element, a spin coating method using water solution to which a catalyst element is dispersed or a plasma treatment with an electrode containing a catalyst element can be used.

As the catalyst element, one element or a plurality of elements selected from the group consisting of nickel (Ni), germanium (Ge), iron (Fe), palladium (Pd), tin (Sn), lead (Pb), cobalt (Co), platinum (Pt), copper (Cu), and gold (Au) can be used.

Figure 3A:
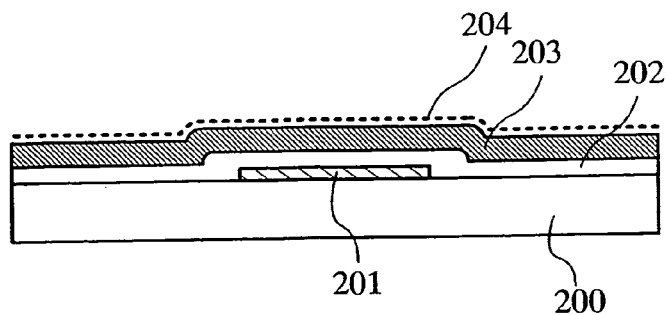
FIGS. 3A to 3E are views for showing a manufacturing process of a TFT according to the present invention.

In this example, nickel acetate solution 204 in liquid phase is coated over the surface of the amorphous semiconductor film 203 with nickel (Ni) as the catalyst element by a spin coating method (FIG. 3A).

Hydrogen in the amorphous semiconductor film 203 is withdrawn by exposing to the nitrogen atmosphere at 450 to 500° C. for 1 hour. This is due to threshold energy is decreased at the subsequent crystallization by forming deliberately dangling bonds in the amorphous semiconductor film 203.

Figure 3B:
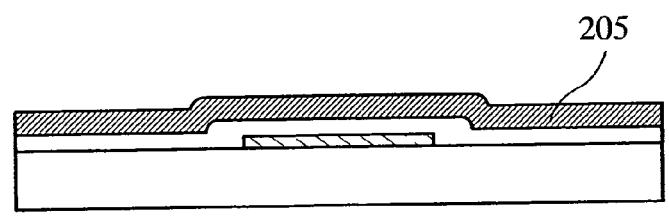

By heat treatment at 550 to 600° C. for 4 to 8 hours in nitrogen atmosphere, an amorphous semiconductor film 203 is crystallized to form a crystalline semiconductor film 205 (FIG. 3B). The temperature for crystallizing the amorphous semiconductor film 203 can be set comparably lower, 550 to 600° C., due to the catalyst element.

After introducing the catalyst element to the amorphous semiconductor film 203, the amorphous semiconductor film 203 can be crystallized by laser irradiation.

Laser light such as continuous oscillation laser light or a pulse oscillation laser light can be used for the laser irradiation. Specifically, as the continuous oscillation laser light, Ar laser light, Kr laser light, $CO_2$ laser light, YAG laser light, $YVO_4$ laser light, YLF laser light, $YAlO_3$ laser light, $GdVO_4$ laser light, $Y_2O_3$ laser light, ruby laser light, alexandrite laser light, Ti: sapphire laser light, helium cadmium laser light, or the like can be nominated.

As the pulse oscillation laser light, Ar laser light, Kr laser light, excimer laser light, $CO_2$ laser light, YAG laser light, $Y_2O_3$ laser light, $YVO_4$ laser light, YLF laser light, $YAlO_3$ laser light, $GdVO_4$ laser light, glass laser light, ruby laser light, alexandrite laser light, Ti: sapphire laser light, copper vapor laser light, gold vapor laser light, or the like can be nominated.

Such the pulse laser eventually becomes to have the same effects as those of the continuous oscillation laser as increasing oscillating frequency.

For example, in the case of using solid laser capable of continuous oscillation, a crystal having a large grain diameter can be obtained by emitting second harmonic wave laser light to fourth harmonic wave laser light. Typically, a second harmonic wave (532 nm) or a third harmonic wave (355 nm) of YAG laser (fundamental wave of 1064 nm) is preferably used. For example, laser light emitted from continuous oscillation YAG laser is converted into a harmonic wave by a nonlinear optical element and emitted to the amorphous semiconductor film 203. Energy density may be set approximately from 0.01 to 100 MW/cm$^2$ (preferably, from 0.1 to 10 MW/cm$^2$).

Laser light can be emitted in the inert gas atmosphere such as rare gas or nitrogen. Accordingly, roughness of a semiconductor surface due to laser irradiation and variation of threshold voltage due to variation of interface state density can be prevented.

Figure 3C:
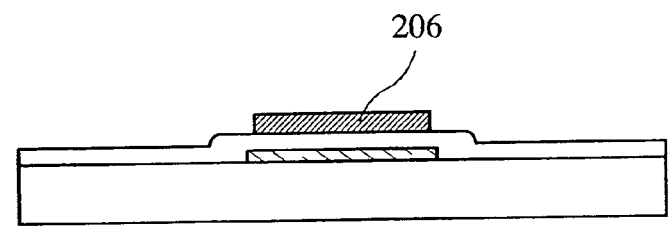

An island crystalline semiconductor film 206 is formed by the crystalline semiconductor film 205 (FIG. 3C). The island crystalline semiconductor film 206 serves as a channel formation region of a TFT.

A semiconductor film 207 introduced with an element selected from elements belonging to group 15 in the periodic table is formed over the gate insulating film 202 and the island crystalline semiconductor film 206 by a plasma CVD. In this example, phosphorus (P) is used as the element selected from elements belonging to group 15 in the periodic table.

The catalyst element used for crystal growth is removed (gettering) from the island crystalline semiconductor film 206. In this example, the semiconductor film 207 introduced with an element selected from elements belonging to group 15 in the periodic table is formed and heated at 550° C. for 4 hours in nitrogen atmosphere to move the catalyst element presented in the island crystalline semiconductor film 206 to the semiconductor film 207 introduced with an element selected from elements belonging to group 15 in the periodic table. By the heat treatment, the catalyst element is decreased in the island crystalline semiconductor film 206.

Figure 3D:
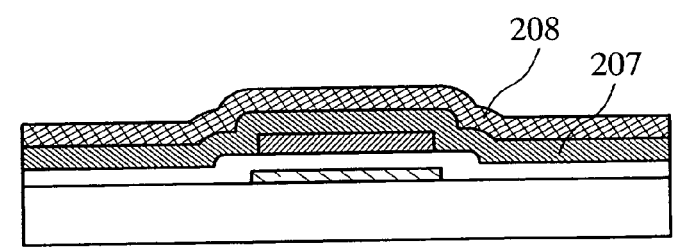

Thereafter, a conductive film 208 is formed over the semiconductor film 207 (FIG. 3D). In the case of using a metal film as the conductive film, the metal film will react to the semiconductor film 207 to form silicide in the subsequent process, and so electric conductivity is improved.

As the conductive film 208, an element selected from the group consisting of tantalum (Ta), tungsten (W), titanium (Ti), and molybdenum (Mo); or a laminate layer formed by stacking an alloy material or a compound material containing the foregoing elements as its main component can be used. In this example, tungsten (W) or molybdenum (Mo) is used for the conductive film.

Figure 3E:
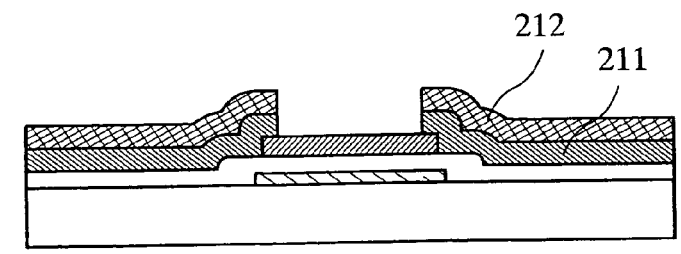

Then, a resist mask is formed over the conductive film, and a source or drain electrode 212 is formed by the conductive film. A source or drain region 211 is formed by etching the semiconductor film 207 with the source or drain electrode 212 as a mask (FIG. 3E). In this example, the semiconductor film 207 is wet etched with tetramethylammonium hydroxide (TMAH) solution. The etching time is controlled so that the island crystalline semiconductor film 206 which is a bottom layer is not completely eliminated. Of course, the semiconductor film 207 can be etched by dry etching.

The source or drain electrode 212 can be integrally formed with a wiring. Alternatively, the source or drain electrode 212 can be formed separately from a wiring, thereafter, they can be electrically connected to each other.

In this example, an n-channel TFT is manufactured. In the case of manufacturing a p-channel TFT, a semiconductor film introduced with an element selected from elements belonging to group 13 in the periodic table can be formed instead of forming the semiconductor film 207 introduced with an element selected from elements belonging to group 15 in the periodic table.

As the element selected from elements belonging to group 13 in the periodic table, boron (B) or gallium (Ga) can be used.

In the case that the source or drain region 211 is formed by using the semiconductor film introduced with an element selected from elements belonging to group 13 in the periodic table, an amount of impurities is controlled so that impurity density in the source or drain region 211 is higher than that in the channel formation region 206.

As noted above, a bottom gate TFT having the source or drain region 211 and the channel formation region 206 can be formed.

This example can be freely combined with any description in Embodiment and Example 1 if necessary.

Example 3

The present invention can be applied to not only a bottom gate TFT but a top gate TFT.

FIGS. 8A to 8D show a manufacturing process of a top gate TFT according to this example.

Firstly, a base film 302 is formed over a substrate 301. As the substrate 301, a glass substrate such as barium borosilicate glass or alumino borosilicate glass, a quartz substrate, a stainless substrate, or the like can be used. A substrate made from plastic as typified by PET, PES, or PEN, or synthetic resin having flexibility such as acrylic can be used as the substrate 301.

As the base film 302, an insulating film such as a silicon nitride film, a silicon nitride film containing oxygen, or a silicon oxide film containing nitrogen can be used. Alternatively, a laminate layer formed by stacking a thin silicon nitride film, a silicon oxide film, and a silicon nitride film containing oxygen can be used for the base film 302. The thin silicon nitride film, the silicon oxide film, and the silicon nitride film containing oxygen can be deposited by a CVD method in a thickness of 5, 100, and 50 nm, respectively.

An island semiconductor film 303 serving as a channel formation region is formed over the base film 302. The island semiconductor film 303 may be formed by the same material as that used for the island crystalline semiconductor film 206 shown in FIG. 3C. In this example, a catalyst element which promotes crystallization of a semiconductor film is introduced to an amorphous semiconductor film, for example, amorphous silicon film, and the amorphous semiconductor film is crystallized by laser irradiation to obtain a crystalline semiconductor film. Then, impurities imparting p-type conductivity, for example, boron (B), are introduced to the obtained crystalline semiconductor film, and an island semiconductor film 303 is formed by the crystalline semiconductor film.

A semiconductor film containing impurities imparting n-type conductivity (hereinafter, n-type impurities) is formed so as to cover the base film 302 and the island semiconductor film 303, and an n-type impurity semiconductor film 304 is formed by the semiconductor film. In this example, as the n-type impurities, a semiamorphous semiconductor film containing phosphorus (P), for example, a semiamorphous silicon film, is formed.

A semiamorphous semiconductor as typified by semiamorphous silicon is a film having an intermediate structure of an amorphous semiconductor and a semiconductor having a crystal structure (including a single crystal and a poly crystal). The semiamorphous semiconductor is a semiconductor which has the third state stable in free energy, and which is crystalline having a short distance order and lattice distortion. The semiamorphous semiconductor can be formed to have a grain diameter of from 0.5 to 20 nm to be dispersed in a non-single crystalline semiconductor. A raman spectrum is shifted to a lower wave number than 520 cm$^{-1}$. By X-ray diffraction, diffraction peaks (111) and (220) which may be derived from a Si crystalline lattice are observed. Hydrogen or halogen of 1 atomic % or more is contained in the semiamorphous semiconductor as neutralizer for terminating dangling bonds. Such the semiamorphous semiconductor is referred to as what is called semiamorphous semiconductor (SAS). A favorable semiamorphous semiconductor with increased stability can be obtained by further encouraging lattice distortion by means of adding rare elements such as helium, argon, krypton, or neon.

The semiamorphous semiconductor can be obtained by glow discharge decomposition of silicide gas. As the typical silicide gas, $Si_2H_6$, $SiH_2Cl_2$, $SiHCl_3$, $SiCl_4$, $SiF_4$, or the like in addition to $SiH_4$ can be used. The silicide gas can be diluted by $H_2$, or the $H_2$ and one or a plurality of rare gas elements selected from the group consisting of He, Ar, Kr, and Ne. The dilution rate is in the range of from 2 to 1000 times.

In this example, a semiconductor film containing n-type impurities is formed since an n-channel TFT is formed. In the case that a p-channel TFT is formed, a semiconductor film having containing impurities imparting p-type conductivity (hereinafter, p-type impurities) may be formed instead of forming the semiconductor film containing n-type impurities, alternatively, a semiconductor film introduced with p-type impurities may be formed after forming an intrinsic semiconductor film.

Figure 8A:
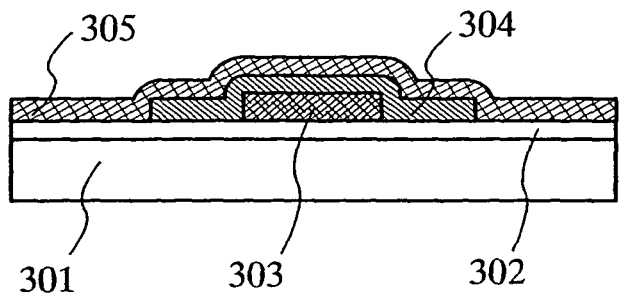
FIGS. 8A to 8D are views for showing a manufacturing process of a TFT according to the present invention.

After forming an n-type impurity semiconductor film 304, a first conductive film 305 is formed so as to cover the base film 302 and the n-type impurity semiconductor film 304. As the first conductive film 305, an element selected from the group consisting of tantalum (Ta), tungsten (W), titanium (Ti), and molybdenum (Mo); or a laminated layer composed of an alloy material containing the foregoing elements as its main component or a compound material such as nitrides of the foregoing elements can be used. The first conductive film 305 is formed by a semiconductor film as typified by a polycrystalline silicon film doped with an impurity element such as phosphorus (P). In this example, a laminate film formed by stacking tantalum nitride (TaN) and tungsten (W) in each thickness of 30 nm and 120 nm is formed as the first conductive film 305 (FIG. 8A).

Figure 8B:
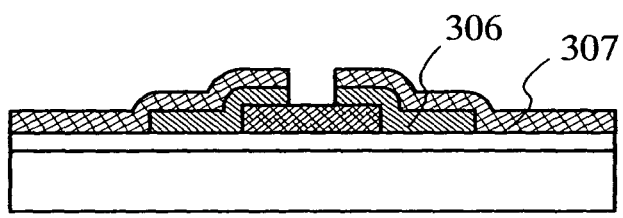

Then, a source or drain region 306 and a source or drain electrode 307 are formed by the n-type impurity semiconductor film 304 and the first conductive film 305 using a mask, respectively (FIG. 8B). The etching time is controlled so that the island crystalline semiconductor film 303 which is a bottom layer is not completely eliminated. Of course, dry etching can be used.

Figure 8C:
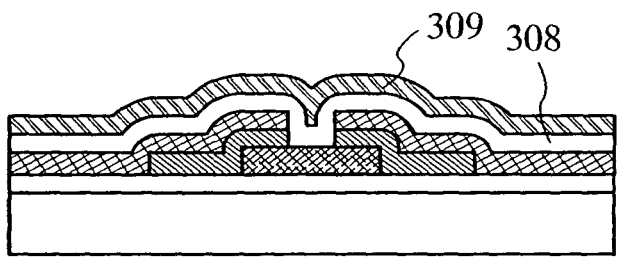

A gate insulating film 308 and a second conductive film 309 are formed so as to cover the island semiconductor film 303, the source or drain region 306, and the source or drain electrode 307 (FIG. 8C). The gate insulating film 308 and the second conductive film 309 can be formed by the same material as those used for the base film 302 and the first conductive film 305.

Figure 8D:
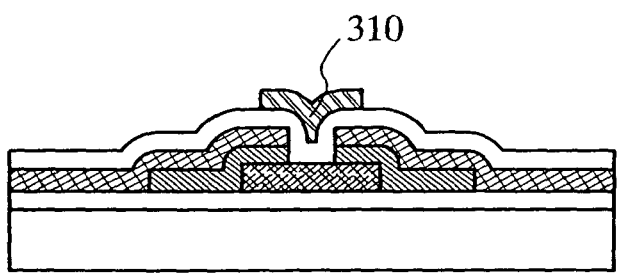

A gate electrode 310 is formed by the first conductive film 309 (FIG. 8D).

According to the above-mentioned manufacturing process, a top gate TFT is formed. In a top gate TFT according to this example, the channel formation region 303 and the source or drain region 306 are overlapped with each other not only in the film thickness direction but also the lateral direction. Therefore, a depletion layer can be spread also in the lateral direction, which leads to ease drain voltage. Reliability of such the TFT can be improved since hot carriers can be prevented from generating.

A doping apparatus is not used for forming a TFT with improved reliability, and so manufacturing costs can be reduced.

Example 4

In this example, an example of manufacturing a liquid crystal display device (LCD) by using the present invention is explained with reference to FIGS. 9A to 13B.

The manufacturing method for the liquid crystal display device explained in this embodiment is a method for manufacturing simultaneously a pixel portion including a pixel TFT and a TFT of a driver circuit unit provided in the periphery of the pixel portion. For ease of explanation, a CMOS circuit composed of an n-channel TFT and a p-channel TFT which is a basic unit is illustrated as the driver circuit.

Based on example 2, a CMOS circuit 548 composed of a bottom gate type n-channel TFT 545 and a bottom gate type p-channel TFT 546 and a bottom gate type n-channel TFT 547 are formed (FIG. 9A). In this example, the n-channel TFT 547 is used as the pixel TFT, whereas the CMOS circuit 548 is used as a basic unit of the driver circuit.

In FIG. 9A, reference numeral 501 denotes a substrate; 502 to 504, gate electrodes; 505, gate insulating film; 511 to 513, island semiconductor films containing elements belonging to group 13 (impurities imparting p-type conductivity) and channel formation regions for each TFT. Reference numeral 521 and 523 are semiconductor films containing elements belonging to group 15 (impurities imparting n-type conductivity) and source or drain regions of n-channel TFTs 545 and 547. A semiconductor film 522 is added with an element belonging to group 13 to be a source or drain region of the p-channel TFT 546.

Reference numeral 531 to 535 denote source or drain electrodes which are electrically connected to the source or drain region of each TFT. Especially, an electrode 532 electrically connects either of the source or drain region 521 of the n-channel TFT 545 to either of the source or drain region 522 of the p-channel TFT 546.

The n-channel TFTs 545 and 547, and the p-channel TFT 546 are not limited to those manufactured by the method described in Example 2. The n-channel TFTs 545 and 547, and the p-channel TFT 546 can be manufactured by the method described in Example 1, alternatively, Example 3 in the case of a top gate TFT.

A first interlayer insulating film 541 is formed so as to cover the TFTs 545 to 547.

As the first interlayer insulating film 541, an insulating film containing silicon, for example, a silicon oxide film (SiOx), a silicon nitride film (SiN), or a silicon oxide film containing nitrogen (SiON), or a laminate film of the foregoing films is formed by a plasma CVD or a sputtering method. Of course, the first interlayer insulating film 541 is not limited to a silicon oxide film containing nitrogen or a silicon nitride film, or a laminate film of the foregoing films; the first interlayer insulating film 541 can be formed by a single layered or a laminate layered insulating film containing other kinds of silicon.

The first interlayer insulating film 541 can be formed by a silicon nitride film or a silicon nitride film containing oxygen, heat treatment is carried out, and the island semiconductor films 511 to 513 and the semiconductor films 521 to 523 can be hydrolyzed by hydrogen from the first interlayer insulating film 541. That is, dangling bonds in the island semiconductor films 511 to 513 and the semiconductor films 521 to 523 can be terminated by the hydrogen.

A second interlayer insulating film 542 serving as a planarizing film is formed over the first interlayer insulating film 541.

As the second interlayer insulating film 542, a photosensitive or nonphotosensitive organic material (polyimide, acrylic, polyamide, polyimideamide, resist, or benzocyclobutene), siloxane, and a laminate structure of the foregoing materials can be used.

Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

As the organic material, positive photosensitive organic resin or negative photosensitive organic resin can be used.

In this example, the second interlayer insulating film 542 is made from siloxane by a spin coating method.

A contact hole reaching to the electrode 535 is formed by etching a part of the first interlayer insulating films 541 and the second interlayer insulating film 542. In forming the contact hole, carbon tetrafluoride ($CF_4$) of 50 sccm, oxygen ($O_2$) of 50 sccm, and helium (He) of 30 sccm are used as etching gas.

A conductive film is formed over the second interlayer insulating film 542. A pixel electrode 543 which is electrically connected to the electrode 535 is formed by the conductive film using a photomask (FIG. 9B).

Since a transparent liquid crystal display panel is manufactured in this example, the pixel electrode 543 is formed by using a transparent conductive film such as an indium tin oxide (ITO), indium tin oxide containing silicon oxide, zinc oxide (ZnO), tin oxide ($SnO_2$).

In the case of manufacturing a reflective liquid crystal display panel, the pixel electrode 543 may be formed by a metal material having light reflectivity such as Ag (silver), Au (gold), Cu (copper), W (tungsten), or Al (aluminum) by a sputtering method.

Figure 11:
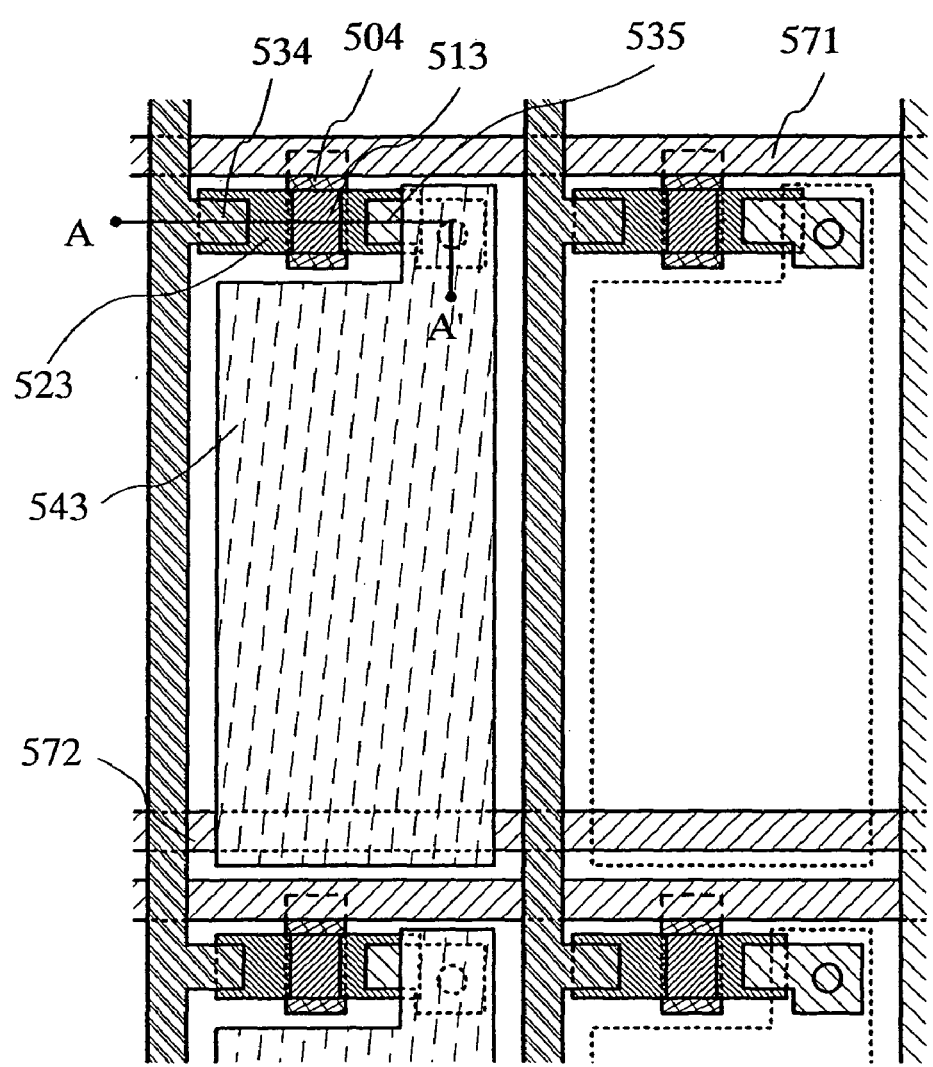
FIG. 11 is a view for showing a manufacturing process of a liquid crystal display device according to the present invention.

FIG. 11 is a top view for showing a pixel portion a part of which is enlarged. FIG. 11 shows the state in process of manufacturing a pixel electrode for showing that a pixel electrode is formed in a left pixel whereas a pixel electrode is not formed in a right pixel. FIG. 9B which shows a cross-section of the pixel TFT 547 is corresponding to FIG. 11 taken along line A-A'. In FIG. 11, like components are denoted by numerals as of FIG. 9B. A capacitor wiring 572 is provided. Retention volume is formed by the pixel electrode 543 and the capacitor wiring 572 which is overlapped with the pixel electrode 543 with the first interlayer insulating film 541 as a dielectric.

In this example, the second interlayer insulating film 542 is etched in a region where the pixel electrode 543 and a capacitor wiring 572 are overlapped, and retention volume is formed by the pixel electrode 543, the first interlayer insulating film 541, and the capacitor wiring 572. In the case that the second interlayer insulating film 542 can be used as a dielectric, the second interlayer insulating film 542 is not required to be etched. In that case, the first interlayer insulating film 541 and the second interlayer insulating film 542 serve as dielectrics.

In FIG. 11, the gate electrode 504 is connected to a gate wiring 571 which is formed separately from the gate electrode 504. An electrode 534 can be integrally formed with a source wiring. Alternatively, the electrode 534 can be formed separately from a source wiring, thereafter, they can be electrically connected to each other.

According to the above-mentioned process, a TFT substrate for a liquid crystal display panel provided with a reverse staggered pixel TFT 547, a CMOS circuit 548 formed by a reverse staggered n-channel TFT 545 and reverse staggered p-channel TFT 546, and the pixel electrode 543 is completed over the substrate 501.

An oriented film 551a is formed so as to cover the pixel electrode 543. The oriented film 551a may be formed by a droplet discharging method, a screen printing method, or an offset printing method. Thereafter, rubbing treatment is carried out over the surface of the oriented film 551a.

Figure 10:
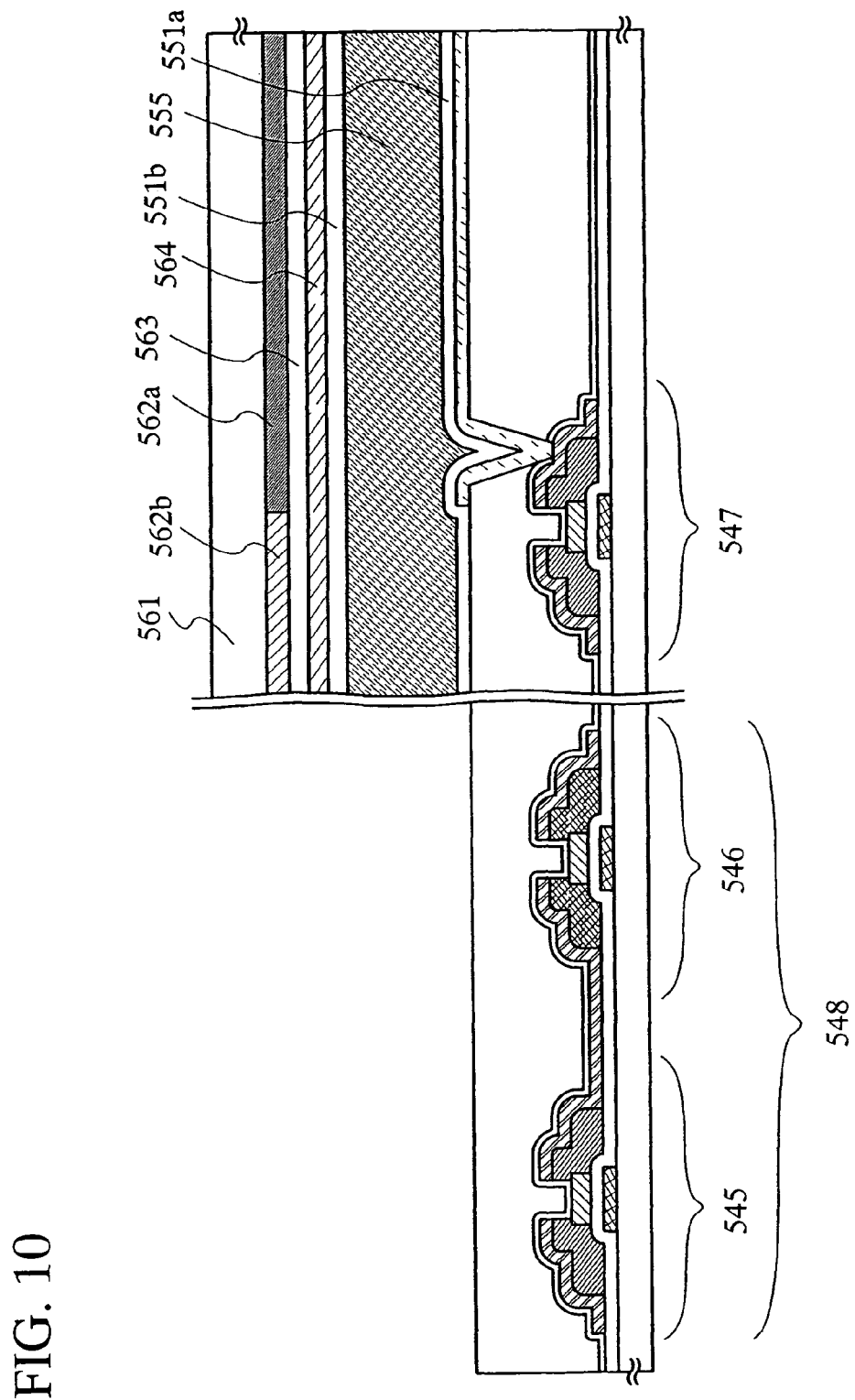
FIG. 10 is a view for showing a manufacturing process of a liquid crystal display device according to the present invention.

A color filter composed of a coloring layer 562a, a light shielding layer (black matrix) 562b, and an overcoat layer 563 is formed over a counter substrate 561, and a counter electrode 564 formed by a transparent electrode or a reflective electrode is formed thereover, then, the oriented film 551b is formed thereover (FIG. 10).

Figure 12A:
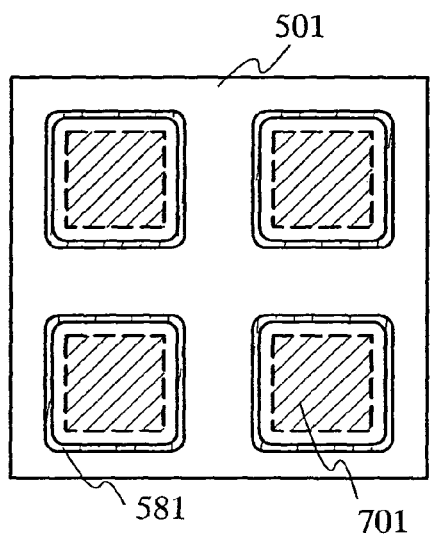
FIGS. 12A to 12D are views for showing a manufacturing process of a liquid crystal display device according to the present invention.
Figure 12B:
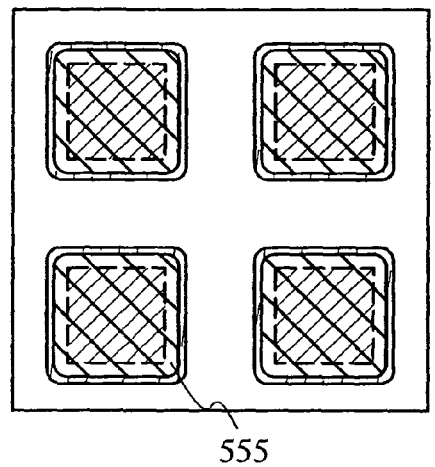

Then, sealant 581 which is a closed pattern is formed so as to surround a region overlapped with the pixel portion 701 by a droplet discharging method. Here, an example of drawing the sealant which is the closed pattern is described since liquid crystal 555 is discharged by drops. A dipping method by which a seal pattern having an opening portion is provided and liquid crystal is injected by utilizing capillary phenomenon after pasting a TFTF substrate can be used (FIG. 12A).

Figure 12C:
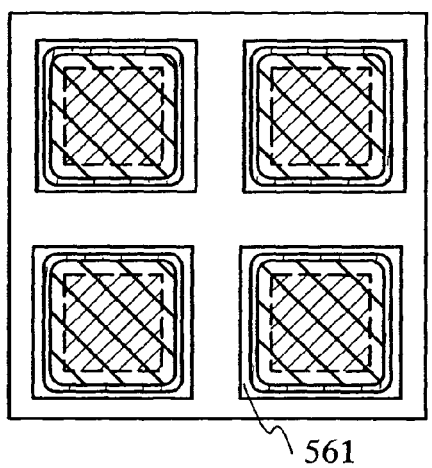

Then, the liquid crystal 555 is discharged by drops under reduced pressure so that air bubbles are not entered between the substrate 501 and the counter substrate 561 (FIG. 12B), and the two substrates are pasted to each other (FIG. 12C). The liquid crystal is discharged once or a plurality of times in the closed loop seal pattern. As an oriented mode of the liquid crystal, a TN mode in which the alignment of liquid crystal molecules are in twist alignment with twist angle of 90 degrees from light injection to light emission is often used. In the case that a liquid crystal display device in a TN mode is manufactured, both of the substrates are pasted so that the rubbing directions of the substrates are at right angles to each other.

The space between the substrates are kept by dispersing sphere-shaped spacers, by forming a columnar like spacer made from resin, or by adding filler into the sealant. The columnar like spacer is an organic resin material containing at least one material among acrylic, polyimide, polyimideamide, and epoxy as its main component, one material among silicon oxide, silicon nitride, or silicon oxide containing nitrogen, or an inorganic material formed by a laminate film formed by the foregoing materials.

Figure 12D:
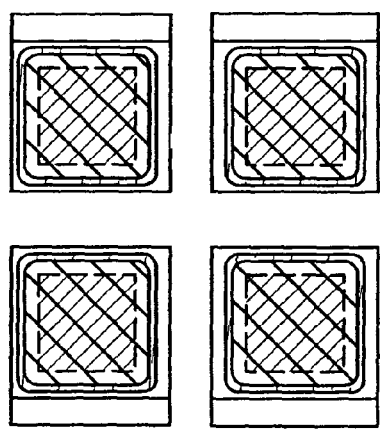

Then, the substrate is divided into some pieces. In the case of forming multiple devices from one substrate, the substrate is divided into each panel. In the case of forming one panel from one substrate, the dividing process can be eliminated by pasting a counter substrate which is preliminarily cut onto the substrate (FIG. 12D).

An FPC (Flexible Printed Circuit) 704 is pasted to the substrate via an anisotropic conductive layer by a known technique. A liquid crystal display device is completed by the above-mentioned processes. If necessary, an optical film is pasted to the substrate. In the case that a transparent liquid crystal display device is manufactured, a polarized plate is pasted onto both of an active matrix substrate and the counter substrate.

Figure 13A:
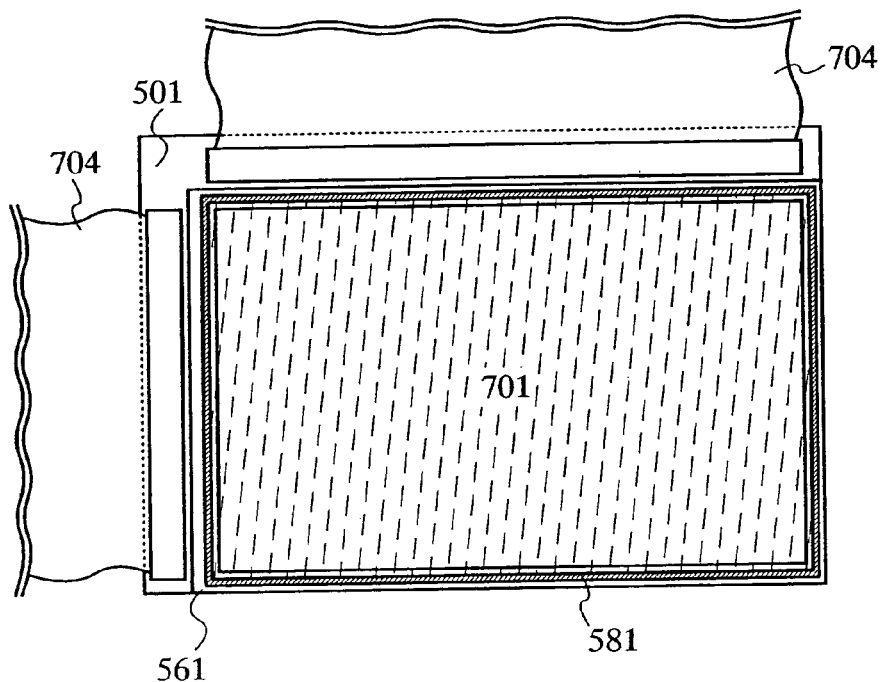
FIGS. 13A and 13B are views for showing a manufacturing process of a liquid crystal display device according to the present invention.
Figure 13B:
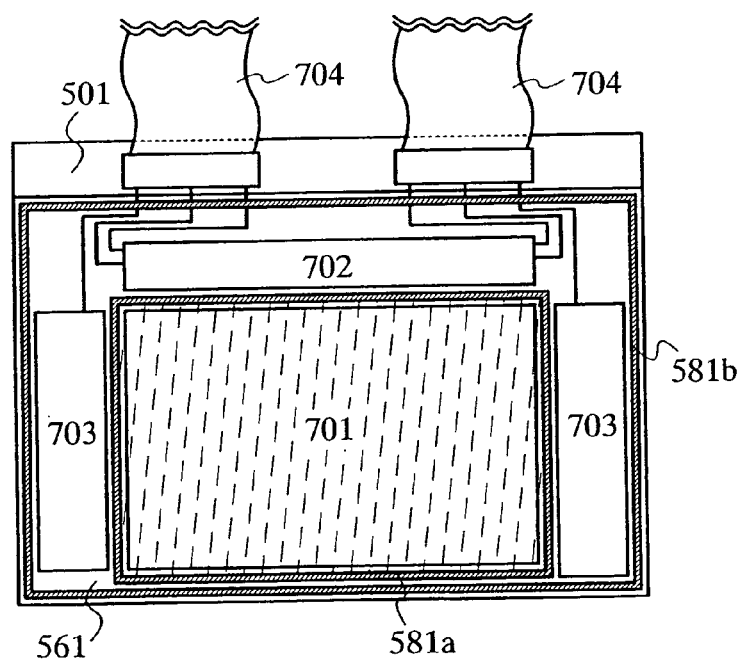

FIG. 10 shows a cross-sectional view and FIG. 13A shows a top view of the liquid crystal display device obtained by the above-mentioned processes. FIG. 13B shows an example of a top view of another liquid crystal display device.

In FIG. 13A, reference numeral 501 denotes a substrate; 561, a counter substrate; 701, pixel portion; 581, sealant; and 704, FPC. Further, liquid crystal is discharged by a droplet discharging method to paste a pair of substrates 501 and 561 to each other with the sealant 581 under reduced pressure.

In FIG. 13B, reference numeral 702 denotes a source signal line driver circuit; 703, a gate signal line driver circuit; 581*a*; first sealant; and 581*b*, second sealant. Liquid crystal is discharged by a droplet discharging method to paste a pair of substrates 501 and 561 to each other with the first sealant 581*a* and the second sealant 581*b*. Since the liquid crystal is unnecessary for driver circuit units 702, 703, only the pixel portion 701 holds the liquid crystal and the second sealant 581*b* is provided to reinforce the panel as a whole.

As above-mentioned, the manufacturing processes for a TFT can be shortened compared to the conventional manufacturing processes in the example, and so the manufacturing processes for a liquid crystal display device can be shortened. The liquid crystal display device manufactured according to this example can be used as a display portion of various kinds of electronic devices.

In this example, the TFT is formed to have a single gate structure; however, the present invention is not limited thereto. The TFT can be formed to have a multigate structure having a plurality of channel formation regions, for example, a double gate TFT can be formed.

This example can be freely combined with any description in Embodiment and Examples 1 to 3 if necessary.

Example 5

This example explains an example of using a droplet discharging method for discharging liquid crystal by drops. In this example, an example of manufacturing four panels from a large substrate 1310 is explained with reference to FIGS. 14A to 17B.

Figure 14A:
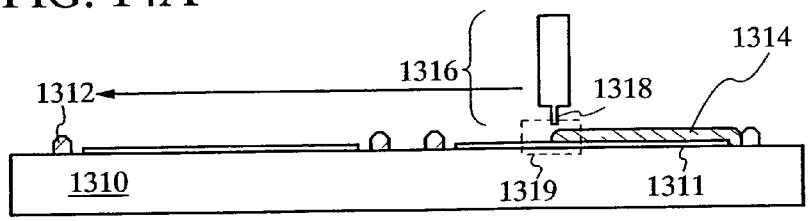
FIGS. 14A to 14D are views for showing a manufacturing process of a liquid crystal display device using a droplet discharging method according to the present invention.
Figure 14B:
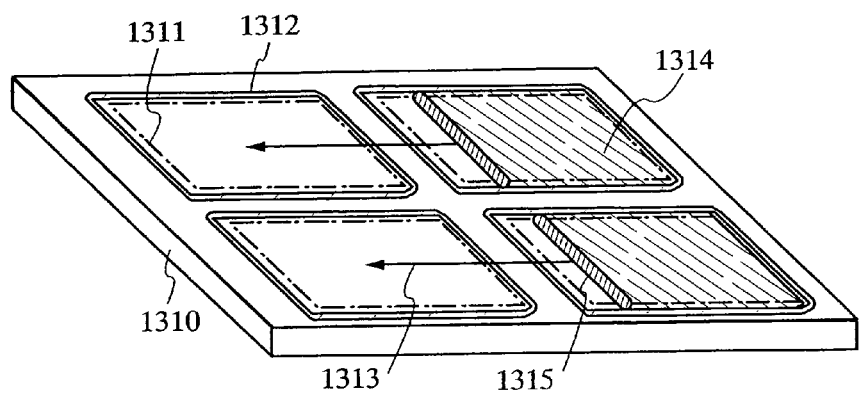

FIGS. 14A and 14B are cross-sectional views for showing mid-flow of forming a liquid crystal layer by using a dispenser (or ink jetting). A liquid crystal material 1314 is discharged, sprayed, or dropped from a nozzle 1318 of a liquid crystal discharging device 1316 so as to cover a pixel portion 1311 surrounded by sealant 1312. The liquid crystal discharging device 1316 is moved in the direction indicated by arrow in FIG. 14A. Further, an example of moving the nozzle 1318 is explained, however, the nozzle may be secured and the substrate may be moved to form the liquid crystal layer.

FIG. 14B is a perspective view. FIG. 14B illustrates that the liquid crystal material 1314 is selectively discharged, sprayed, or dropped only to the region surrounded by the sealant 1312; and a drop surface 1315 is moved along with a nozzle scanning direction 1313.

Figure 14C:
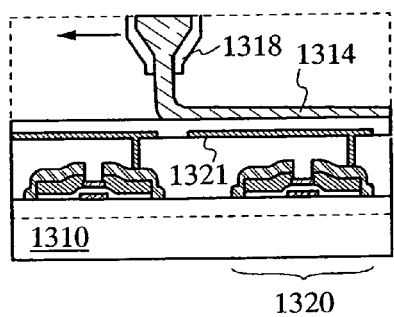
Figure 14D:
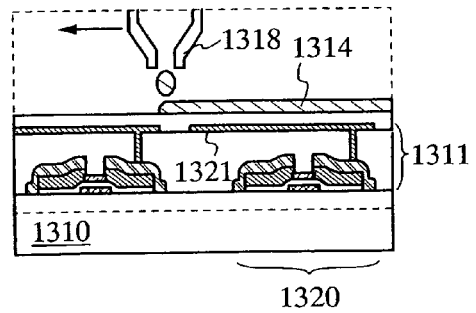

FIGS. 14C and 14D are enlarged cross-sectional views for showing a region encircled by dotted line 1319 illustrated in FIG. 14A. In the case that the liquid crystal material has high viscosity, the liquid crystal material is discharged continuously and adhered to the surface in the form of a kind of ribbon as shown in FIG. 14C. On the other hand, in the case that the liquid crystal material has low viscosity, the liquid crystal material is discharged intermittently, that is, droplets are dropped as shown in FIG. 14D.

In FIGS. 14C and 14D, reference numeral 1310 denotes a large substrate, 1320 denotes a pixel TFT, and 1321 denotes a pixel electrode. The pixel portion 1311 is composed of a pixel electrode arranged in a matrix configuration and a switching element connected to the pixel electrode, here, a TFT manufactured in accordance with Examples 1 to 4 and a retention volume.

A manufacturing flow of a panel is hereinafter explained with reference to FIGS. 15A to 16B.

Figure 15A:
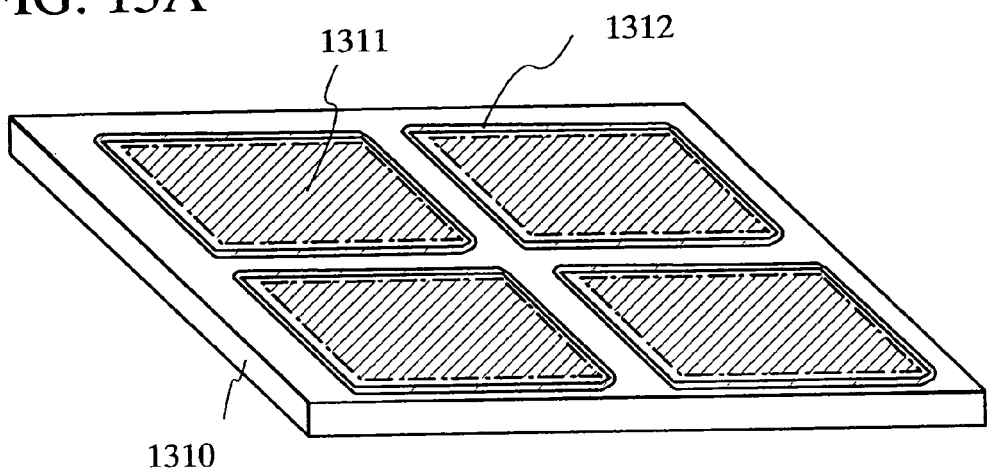
FIGS. 15A and 15B are views for showing a manufacturing process of a liquid crystal display device using a droplet discharging method according to the present invention.

A first substrate 1310 having an insulating surface over which a pixel portion 1311 is provided is prepared. The first substrate 1310 is preliminarily provided with an orientation film, performed with rubbing treatment, dispersed with a spherical spacer or provided with a columnar spacer, or provided with a color filter. Then, as illustrated in FIG. 15A, sealant 1312 is formed at the predetermined position (pattern surrounding the pixel portion 1311) over the first substrate 1310 in an inert gas atmosphere or under reduced pressure by a dispenser device or an ink jet device. As the semitransparent sealant 1312, a material including filler (diameter of from 6 to 24 μm) and having viscosity of 40 to 400 Pa·s is used. Further, the sealant that is not dissolved in liquid crystal that is to be in contact with the sealant is preferably selected. As the sealant, acrylic photo curing resin or acrylic heat curing resin may be used. The sealant 1312 can be formed by printing since it only has to form a simple pattern.

Figure 15B:
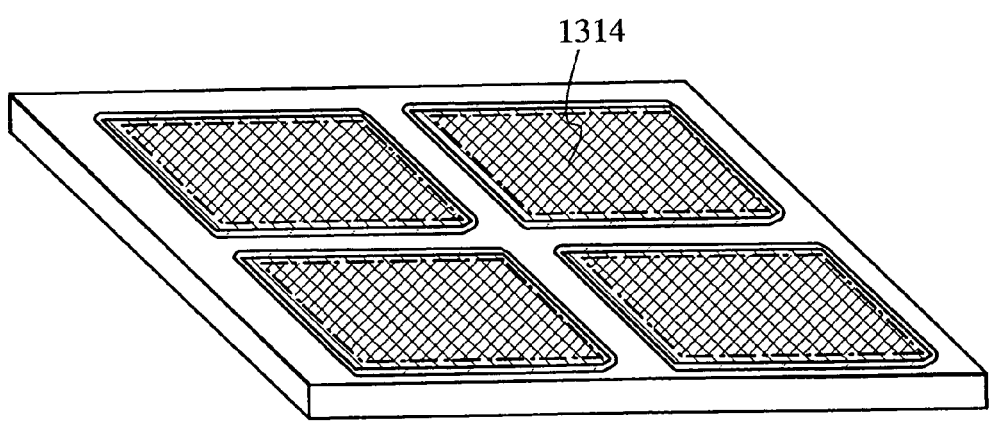

A liquid crystal material 1314 is dropped by ink jetting in the region surrounded by the sealant 1312 (FIG. 15B). As the liquid crystal 1314, a known liquid crystal material that has viscosity capable of being discharged by ink jetting is used. Since the viscosity of a liquid crystal material can be set by controlling temperature, a liquid crystal material is suitable for ink jetting. By ink jetting, a necessary amount of the liquid crystal material 1314 can be held without waste in the region surrounded by the sealant 1312.

Figure 16A:
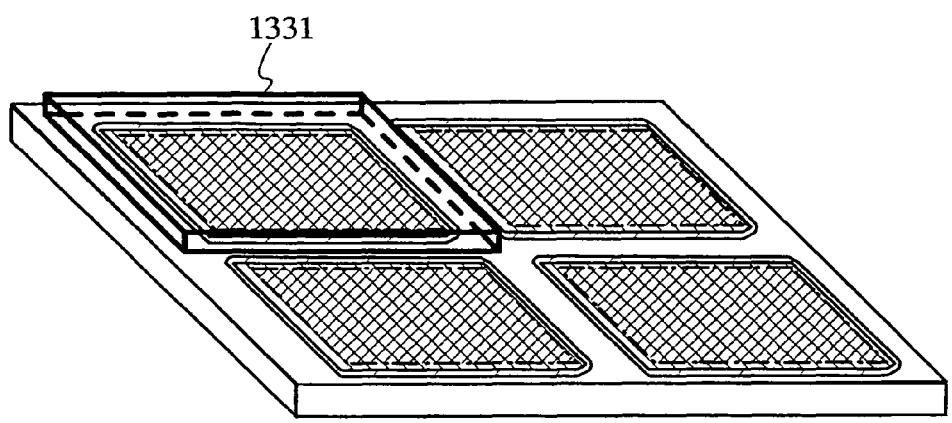
FIGS. 16A and 16B are views for showing a manufacturing process of a liquid crystal display device using a droplet discharging method according to the present invention.

Then, the first substrate 1310 provided with the pixel portion 1311 is pasted onto the second substrate 1331 provided with the opposing electrode or the oriented film under reduced pressure so that air bubbles are not entered between the two substrates (FIG. 16A). In this instance, the sealant 1312 is cured by ultraviolet irradiation or heat treatment simultaneously with the pasting. In addition to the ultraviolet irradiation, heat treatment can also be performed.

Figure 17A:
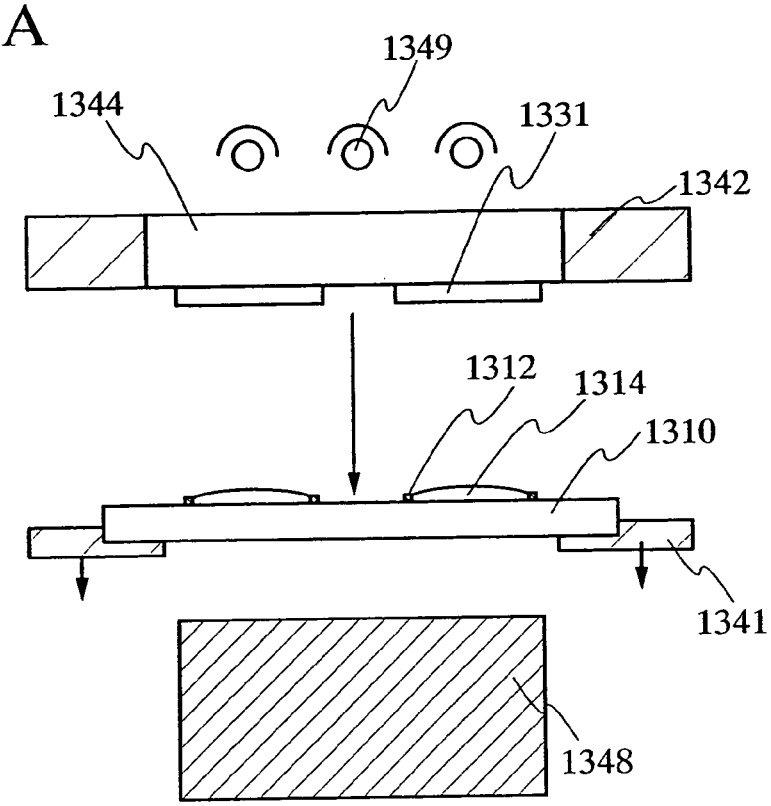
FIGS. 17A and 17B are views for showing a manufacturing process of a liquid crystal display device using a droplet discharging method according to the present invention.
Figure 17B:
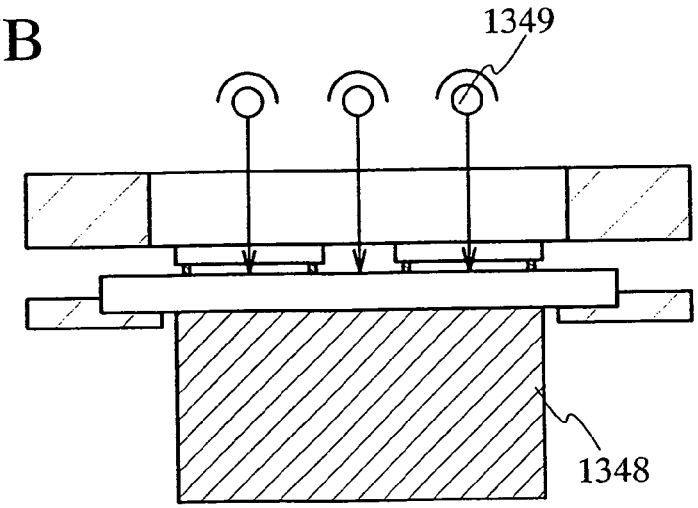

FIGS. 17A and 17B illustrate an example of a pasting device capable of performing UV irradiation or heat treatment in pasting or after pasting.

In FIGS. 17A and 17B, reference numeral 1341 denotes a first substrate support medium; 1342, a second substrate support medium; 1344, a window (a transparent window); 1348, a lower surface table; and 1349, a light source. In FIGS. 17A and 17B, like components are denoted by like numerals as of FIGS. 14A to 16B.

The lower surface table 1348 for curing sealant is installed with a heater. The second substrate support medium 1342 is provided with the window 1344 to pass ultraviolet light from the light source 1349. Although not shown, alignment of a substrate is performed through the window 1344. The second substrate 1331 serving as an opposing substrate is preliminarily cut into a desired size and secured to the second substrate support medium 1342 by a vacuum chuck. FIG. 17A illustrates the state of before being pasted.

In pasting, the first substrate support medium 1341 and the second substrate support medium 1342 are moved down, and the both substrates 1310 and 1331 are pasted together with a pressure, then, ultraviolet light is emitted to the pasted substrates to cure the sealant. FIG. 17B illustrates the state of after pasting.

Figure 16B:
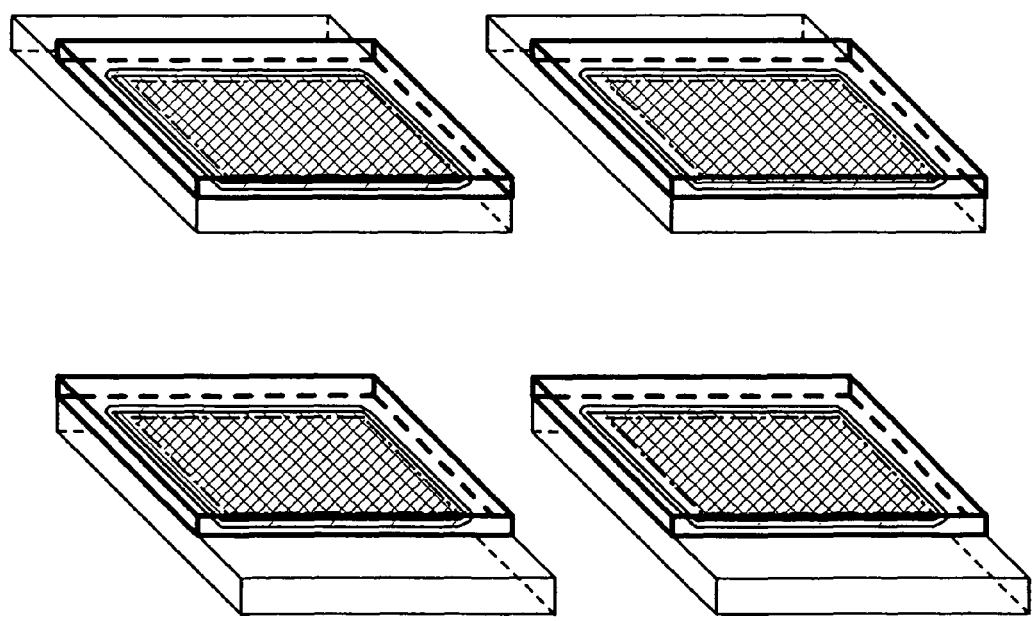

Then, the first substrate 1310 is cut by using a cutting device such as a scriber device, a breaker device, a roll cutter device, or the like (FIG. 16B). Accordingly, four panels are manufactured from one substrate. Then, an FPC is pasted to the panels by known technique.

As the first substrate 1310 and the second substrate 1331, a glass substrate or a plastic substrate can be used.

A liquid crystal display device using a large substrate is manufactured by the foregoing processes.

This example can be freely combined with any description in Embodiment, and Examples 1 to 4 if necessary.

Example 6

In this example, an example of manufacturing a dual emission EL (Electro-Luminescence) display device is explained with reference to FIGS. 18 to 20.

Figure 18:
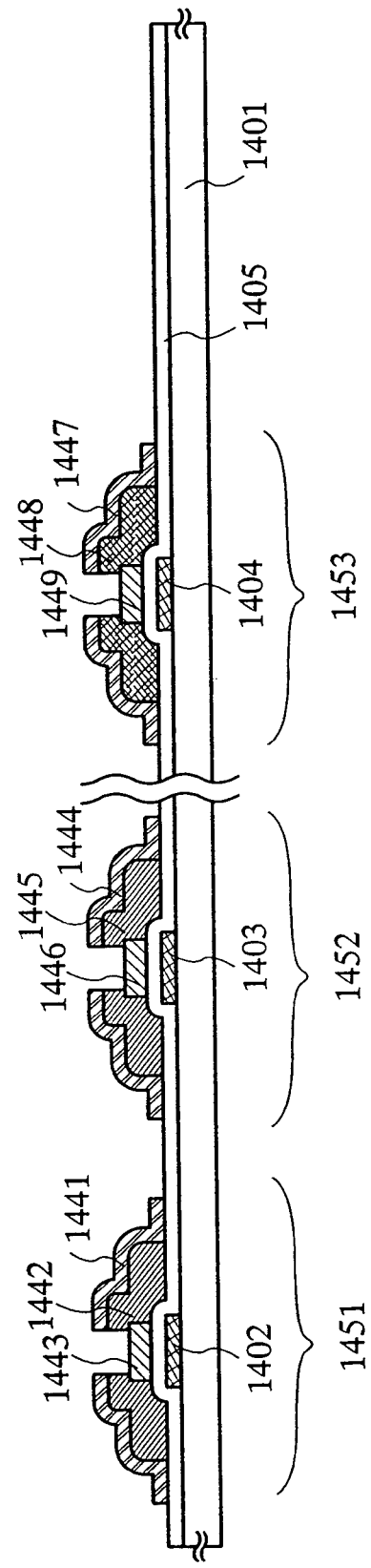
FIG. 18 is a view for showing a manufacturing process of an EL display device according to the present invention.

In accordance with Example 2, n-channel TFTs 1451, 1452 and a p-channel TFT 1453 are manufactured (FIG. 18). Manufacturing conditions, manufacturing processes, materials, and the like are the same as those used in Example 2.

Note that TFTs 1451 to 1453 can be formed in accordance with Examples 1 to 3. In that case, the manufacturing conditions, the manufacturing processes, the materials, and the like are the same as those used in Examples 1 and 3.

In FIG. 18, reference numeral 1401 denotes a substrate; 1402 to 1404, gate electrodes; and 1405, a gate insulating film. As the substrate 1401, a substrate having a light-transmitting property may be used.

The n-channel TFT 1451 includes a channel formation region 1443, a source or drain region 1442, and a source or drain electrode 1441. The n-channel TFT 1452 includes a channel formation region 1446, a source or drain region 1445, and a source or drain electrode 1444. The p-channel TFT 1453 includes a channel formation region 1449, a source or drain region 1448, and a source or drain electrode 1447 (FIG. 18).

In this example, the p-channel TFT 1453 is used as a pixel TFT of the dual emission EL display device. The n-channel TFTs 1451 and 1452 are used as a TFT of a driver circuit for driving a pixel TFT 1453. However, the pixel TFT is not necessarily a p-channel TFT but an n-channel TFT. The driver circuit is not necessarily a circuit composed of a plurality of n-channel TFTs but a circuit complementarily composed of an n-channel TFT and a p-channel TFT or a circuit composed of a plurality of p-channel TFTs.

Then, a first interlayer insulating film 1461 is formed so as to cover the TFTs 1451 to 1453.

As the first interlayer insulating film 1461, an insulating film containing silicon, for example, a silicon oxide film (SiOx), a silicon nitride film (SiN), or a silicon oxide film containing nitrogen (SiON), or a laminate film of the foregoing films is formed by a plasma CVD or a sputtering method. Of course, the first interlayer insulating film 1461 is not limited to a silicon oxide film containing nitrogen or a silicon nitride film, or a laminate film of the foregoing films; the first interlayer insulating film 1461 can be formed by a single layered or a laminate layered insulating film containing silicon.

A second interlayer insulating film 1462 serving as a planarized film is formed over the first interlayer insulating film 1461.

For forming the second interlayer insulating film 1462, a photosensitive or a nonphotosensitive organic material (polyimide, acrylic, polyamide, polyimideamide, resist, or benzocyclobutene) or siloxane is used.

Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

As the organic material, positive sensitive organic resin or negative sensitive organic resin can be used.

In this example, the second interlayer insulating film 1462 is made from siloxane by a spin coating method.

A third interlayer insulating film 1463 having a light transmitting property is formed over the second interlayer insulating film 1462. The third interlayer insulating film 1463 is formed as an etching stopper film for protecting a planarized film which is a second interlayer insulating film 1462 at forming a pixel electrode 1464 in a later process. At forming the pixel electrode 1464, the third interlayer insulating film 1463 is not required in the case that the second interlayer insulating film 1462 can be used as an etching stopper film.

Contact holes are provided to the first interlayer insulating film 1461, the second interlayer insulating film 1462, and the third interlayer insulating film 1463.

Figure 19A:
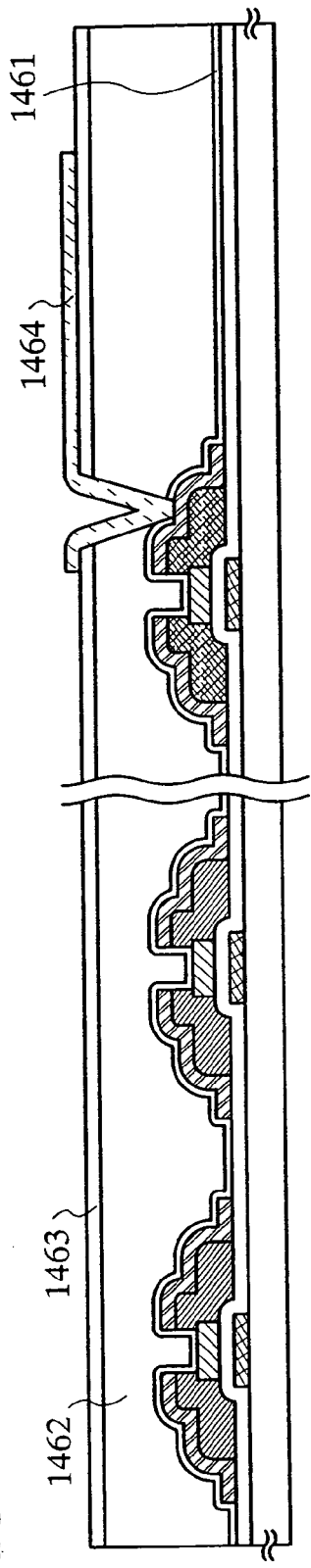
FIGS. 19A and 19B are views for showing a manufacturing process of an EL display device according to the present invention.

The pixel electrode (a transparent electrode, here) 1464, in other words, a pixel electrode of an organic light-emitting element is formed over the third interlayer insulating film 1463 to have a thickness in the range of from 10 to 800 nm. As the pixel electrode, in addition to indium tin oxide (ITO), for example, a transparent conductive material having a high work function (4.0 eV) such as IZO (indium zinc oxide) which is a mixture of indium tin oxide or indium oxide containing a silicon element and 2 to 20% zinc oxide can be used (FIG. 19A).

Then, an insulator 1465 (also referred to as a bank) which covers an edge of the pixel electrode is formed by using a new mask. As the insulator 1465, a photosensitive or nonphotosensitive organic material (polyimide, acrylic, polyamide, polyimideamide, resist, or benzocyclobutene) or an SOG film (such as a silicon oxide film containing an alkyl group) in a thickness of from 0.8 to 1 μm.

Then, a first organic compound containing layer 1471, a second organic compound containing layer 1472, a third organic compound containing layer 1473, a fourth organic compound containing layer 1474, and a fifth organic compound containing layer 1475 are formed by a vapor deposition method or a coating method.

Molybdenum oxide ($MoO_x$), 4,4'-bis[N-(1-naphthyl)-N-phenyl-amino]-biphenyl (α-NPD), and rubrene are selectively co-evaporated over the pixel electrode by using an evaporation mask to form the first organic compound containing layer 1471 (a hole injecting layer).

In addition to $MoO_x$, a material having a high hole injecting property such as copper phthalocyanine (CuPC), vanadium oxide ($VO_x$), ruthenium oxide ($RuO_x$), or tungsten oxide ($WO_x$) can be used. Alternatively, the hole injecting layer 1471 may be formed by coating a high-molecular weight material having a high hole injecting property such as poly (ethylenedioxythiophene)/poly(styrenesulfonic acid) solution (referred to as PEDOT/PSS).

In order to improve reliability of a light-emitting element, it is preferable to deaerate by performing vacuum heating before forming the first organic compound containing layer 1471. For example, it is preferable to perform heat treatment at temperatures of from 200 to 300° C. under low pressure atmosphere or inert atmosphere in order to remove gas included in the substrate before depositing an organic compound material. In the case that the interlayer insulating film and the bank are formed by a silicon oxide film having high heat resistance, heat treatment at higher temperature (410° C.) can be additionally performed.

The second organic compound containing layer (hole transporting layer) 1472 is formed by depositing selectively α-NPD with an evaporation mask over the hole injecting layer 1471. In addition to α-NPD, a material having a high hole transporting property typified by an aromatic amine based compound such as 4,4'-bis[N-(3-methylphenyl)-N-phenyl-amino]-biphenyl (TPD), 4,4',4''-tris(N,N-diphenyl-amino)-triphenylamine (TDATA), or 4,4',4''-tris[N-(3-methylphenyl)-N-phenyl-amino]-triphenylamine (MTDATA) can be used.

The third organic compound containing layer (light-emitting layer) 1473 is selectively formed. Each light-emitting material (R, G and B) is deposited selectively by aligning each evaporation mask for each of the colors to realize full-color display device.

$Alq_3$ (tris(8-quinolinolate) aluminum) is deposited selectively using an evaporation mask to form a fourth organic compound containing layer (electron transporting layer) 1474 over the light-emitting layer 1473. In addition to $Alq_3$, a material having a favorable electron transporting property as typified by metal complexes having a quinoline skeleton or benzoquinoline skeleton such as tris (5-methyl-8-quinolinolate) aluminum (abbreviated as $Almq_3$), bis(10-hydroxybenzo[h]-quinolinato) beryllium (abbreviated as $BeBq_2$), bis (2-methyl-8-quinolinolate)-4-phenyl phenolate-aluminum (abbreviated as BAlq), or the like can be used. Other examples include metal complexes having oxazole-based and thiazole-based ligand such as bis[2-(2-hydroxyphenyl)-benzoxazorato]zinc (abbreviated as $Zn(BOX)_2$) and bis[2-(2-hydroxyphenyl)-benzothiazorato]zinc (abbreviated as $Zn(BTZ)_2$). Further, in addition to metal complexes, 2-(4-biphenylyl)-5-(4-tert-butylphenyl)-1,3,4-oxadiazole (abbreviated as PBD), and 1,3-bis[5-(p-tert-butylphenyl)-1,3,4-oxadiazole-2-yl]benzene (abbreviated as OXD-7); 3-(4-tert-butylphenyl)-4-phenyl-5-(4-biphenylyl)-1,2,4-triazole (abbreviated as TAZ); and 3-(4-tert-butylphenyl)-4-(4-ethylphenyl)-5-(4-biphenylyl)-1,2,4-triazole (abbreviated as p-EtTAZ); bathophenanthroline (abbreviated as BPhen); bathocuproin (abbreviated as BCP); and the like can be used as the electron transporting layer 1474 since they have a favorable electron transporting property.

Next, 4,4-bis(5-methylbenzoxazol-2-yl)stilbene (abbreviated as BzOs) and lithium (Li) are co-evaporated to form the fifth organic compound containing layer (electron injecting layer) 1475 covering the electron transporting layer 1474 and the insulator 1465. Damages due to a sputtering method performed in forming the transparent electrode 1476 in a later process can be suppressed by using benzoxazole derivative (BzOs). In addition to BzOs: Li, a compound or the like having a high electron injecting property of an alkali metal or an alkali earth metal such as $CaF_2$, lithium fluoride (LiF) or cesium fluoride (CsF) can be used. Further, a mixture of $Alq_3$ and magnesium (Mg) can also be used.

The transparent electrode 1476, in other words, a pixel electrode 1476 of the organic light-emitting element, is formed over the electron injecting layer 1475 in a thickness of from 10 nm to 800 nm. Indium tin oxide including Si element, or indium zinc oxide (IZO) which is a mixture of zinc oxide (ZnO) of 2 to 20% and indium oxide can be used for forming the transparent electrode 1476 as well as indium tin oxide (ITO).

As described above, a light-emitting element is manufactured. Each material for the electrode 1464, the first organic compound containing layer to the fifth organic compound containing layer 1471 to 1475, and the pixel electrode 1476, of which the light-emitting element is composed, is appropriately selected. In addition, each thickness of the foregoing layers is adjusted. It is desired that the pixel electrodes 1464 to 1476 are formed from the same material to have almost the same thickness, preferably, a thin thickness of approximately 100 nm.

Figure 19B:
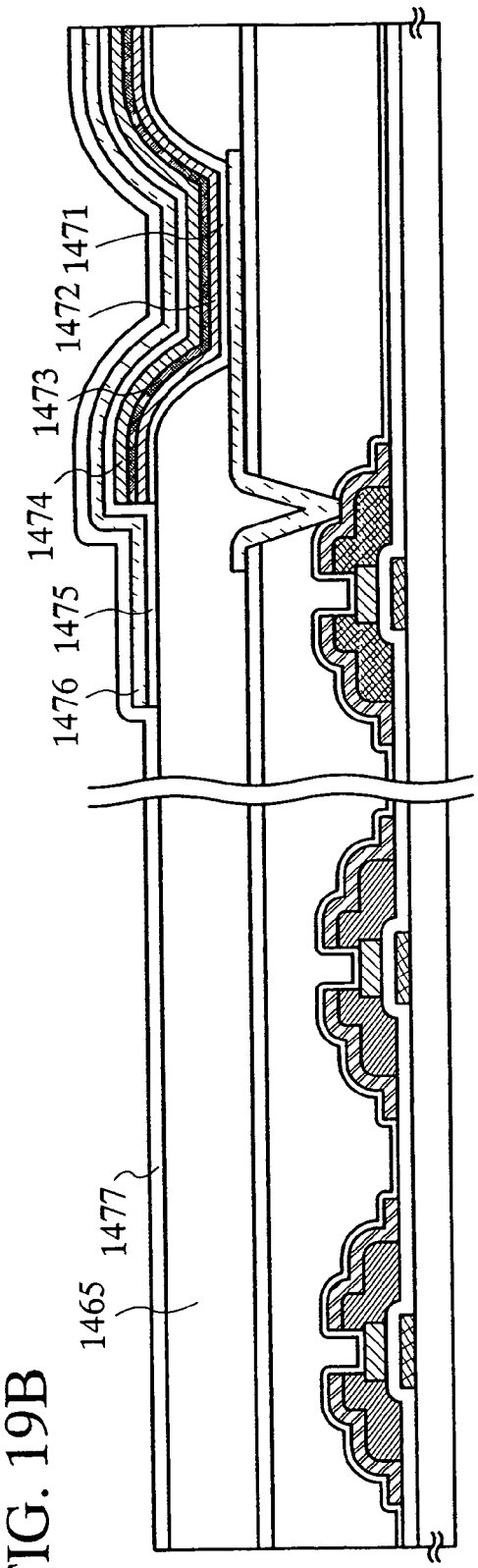

If necessary, a transparent protective layer 1477 is formed to prevent water from penetrating into the light-emitting element by covering the light-emitting element. A silicon nitride film, a silicon oxide film, or a silicon nitride film containing oxygen (an SiNO film having a composition ratio: N>O or an SiON film having a composition ratio: N<O), a thin film mainly containing carbon (for example, DLC film or a CN film) or the like, each of which can be obtained by a sputtering method or a CVD method, can be used as the transparent protective layer 1477 (FIG. 19B).

A second substrate 1481 is pasted onto the substrate 1401 with a sealing agent containing a gap material for keeping a gap between the substrates. The second substrate 1481 may also be formed by a glass substrate or a quartz substrate, each of which has a light-transmitting property. Further, the gap between a pair of the substrates may be provided with a drying agent as an air gap (an inert gas) or filled with a transparent sealing agent (an ultraviolet curing resin, a thermosetting epoxy resin, or the like).

In the light-emitting element, the pixel electrodes 1464 and 1476 are formed by a light-transmitting material, and light can be emitted in two directions from one light-emitting element, in other words, light can be emitted from both sides.

By forming a panel to have the foregoing structure, the light intensity of light-emission from a top face and a rear face can be almost the same.

Figure 20:
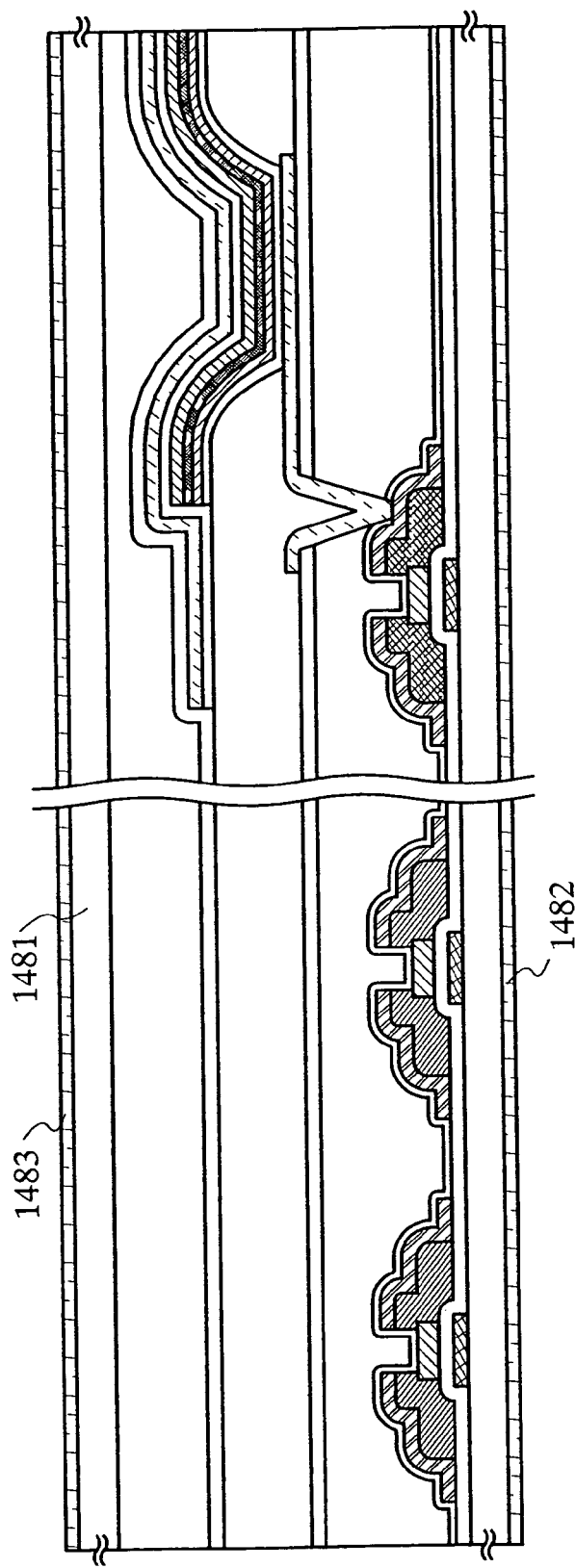
FIG. 20 is a view for showing a manufacturing process of an EL display device according to the present invention.

Lastly, optical films 1482 and 1483 (a polarizing plate or a circularly polarizing plate) are provided to improve contrast (FIG. 20).

Figure 21:
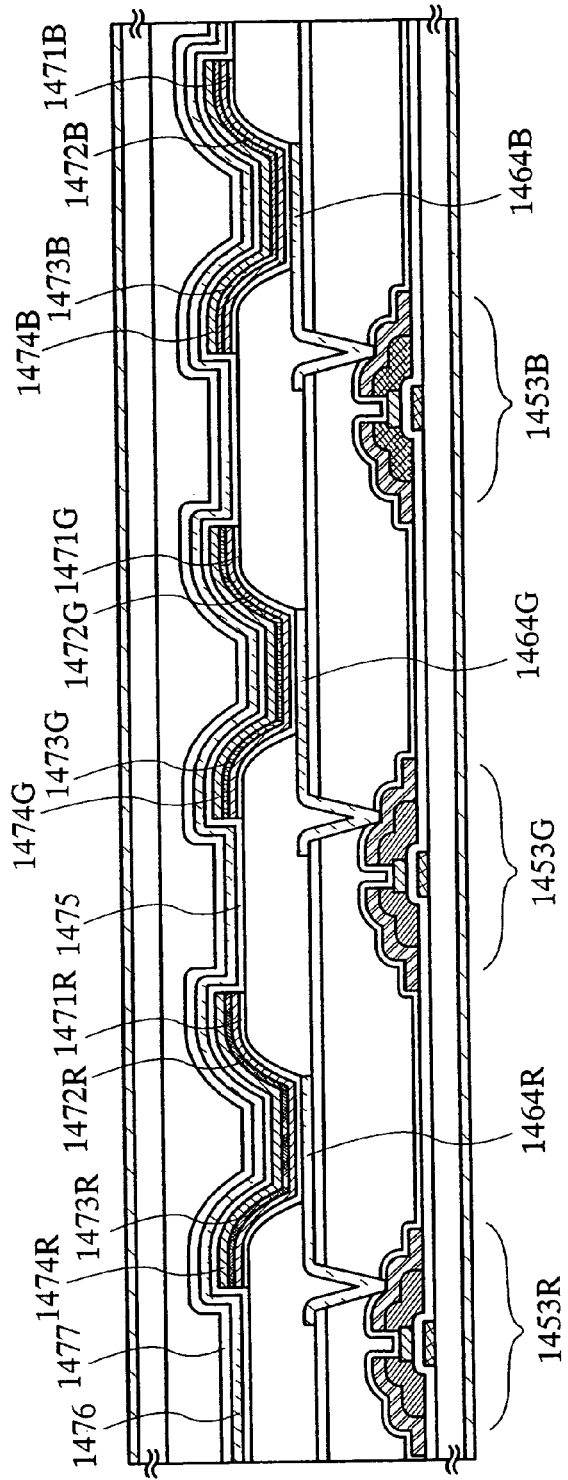
FIG. 21 is a view for showing a manufacturing process of an EL display device according to the present invention.

FIG. 21 shows an example of forming separately the pixel TFTs from each other in the pixel portion by RGB. In a red (R) pixel, a pixel TFT 1453R is connected to a pixel electrode 1464R, and a first organic compound containing layer (hole injecting layer) 1471R, a second organic compound containing layer (hole transporting layer) 1472R, a third organic compound layer (light-emitting layer) 1473R, a fourth organic compound containing layer (electron transporting layer) 1474R, a fifth organic compound layer (electron injecting layer) 1475, a transparent electrode (pixel electrode) 1476, and the transparent protective layer 1477 are formed.

In a green (G) pixel, a pixel TFT 1453G is connected to a pixel electrode 1464Q and a first organic compound containing layer (hole injecting layer) 1471G, a second organic compound containing layer (hole transporting layer) 1472G a third organic compound layer (light-emitting layer) 1473G, a fourth organic compound containing layer (electron transporting layer) 1474G, a fifth organic compound layer (electron injecting layer) 1475, a transparent electrode (pixel electrode) 1476, and the transparent protective layer 1477 are formed.

In a blue (B) pixel, a pixel TFT 1453B is connected to a pixel electrode 1464B, and a first organic compound containing layer (hole injecting layer) 1471B, a second organic compound containing layer (hole transporting layer) 1472B, a third organic compound layer (light-emitting layer) 1473B, a fourth organic compound containing layer (electron transporting layer) 1474B, a fifth organic compound layer (electron injecting layer) 1475, a transparent electrode (pixel electrode) 1476, and the transparent protective layer 1477 are formed.

With respect to the light-emitting layers 1473R, 1473G, and 1473B, a material such as $Alq_3$:DCM or $Alq_3$:rubrene: BisDCJTM is used as the light-emitting layer 1473R exhibiting red emission. A material such as Alq$_3$:DMQD (N,N'-dimethyl quinacridone) or Alq$_3$:coumarin 6 is used as the light-emitting layer 1473G exhibiting green emission. A material such as α-NPD or tBu-DNA is used as the light-emitting layer 1473B exhibiting blue emission.

In this example, the TFT is not limited to a single gate structure TFT. The TFT may be formed to be a multi-gate TFT having a plurality of channel formation regions, for example, a double gate TFT.

In this example, a dual emission panel is described. Alternatively, a top emission panel or a bottom emission panel which is a surface-emission panel can also be used.

In order to manufacture a top emission panel, a bottom pixel electrode of an organic light-emitting element may be formed by a material having a light-shielding property instead of a transparent electrode. For instance, in case of forming the bottom pixel electrode to have a three layered structure composed of a titanium nitride film, a film containing aluminum as its main component, and a titanium nitride film, the anode becomes capable of having high resistance as a wiring, having good ohmic contact, and serving as an anode. Alternatively, a pixel electrode of an organic light-emitting element may be formed by a single layer such as a titanium nitride film, a chromium film, a tungsten film, a Zn film, a Pt film; or a lamination layer composed of three or more layers.

A top pixel electrode of a top emission panel is preferably transparent or semi-transparent, and can be formed by a material that is used for forming the foregoing transparent electrode.

When a bottom emission panel is manufactured, the bottom pixel electrode of an organic light-emitting element can be formed by a material that is used for forming the foregoing transparent electrode.

A material having a light-shielding property and small work function (Al, Ag, Li, Ca, or alloys of the foregoing element such as MgAg, MgIn, AlLi, CaF$_2$, or CaN) may be used as a top pixel electrode of the bottom emission panel.

In manufacturing the top emission panel or a bottom emission panel, an organic compound containing layer in an organic light-emitting element can be appropriately varied depending on a material for each of the pixel electrodes.

Light emitted from a light-emitting element includes light emission radiated in returning to a ground state from a singlet excited state (fluorescence) and light emission radiated in returning to a ground state from a triplet excited state (phosphorescence). In this example, either or both of the light can be used.

This example is implemented by using a process explained in Example 2 has been already explained. If necessary, this example can be freely combined with any description in Embodiment, and Examples 1, 3 to 5.

Example 7

In Example 7, an example of an integrated circuit which is used for identification of an object according to the present invention is explained with reference to FIGS. 22A to 25B.

In Example 7, an example of an electrically isolated TFT as a semiconductor element is illustrated; however, a semiconductor element used for an integrated circuit is not limited thereto, and any kind of circuit elements can be used. For example, a recording element, a diode, a photoelectric conversion element, a resistance element, a coil, a capacitor element, or an inductor can be typically given, in addition to a TFT.

Further, an ID chip indicates an integrated circuit utilized to identify an object in this specification, and information for identification is recorded in the ID chip. An ID chip can transmit or/and receive information with a control system or a reading device by a radio wave or an electromagnetic wave. A production area, an expiration date, distribution channel, or the like of an object to which an ID chip is attached can be found by information included in an ID chip. In addition, in the case of applying to a medical and chemical field, safe can be managed by attaching an ID chip to a medicine or a patient.

Figure 22A:
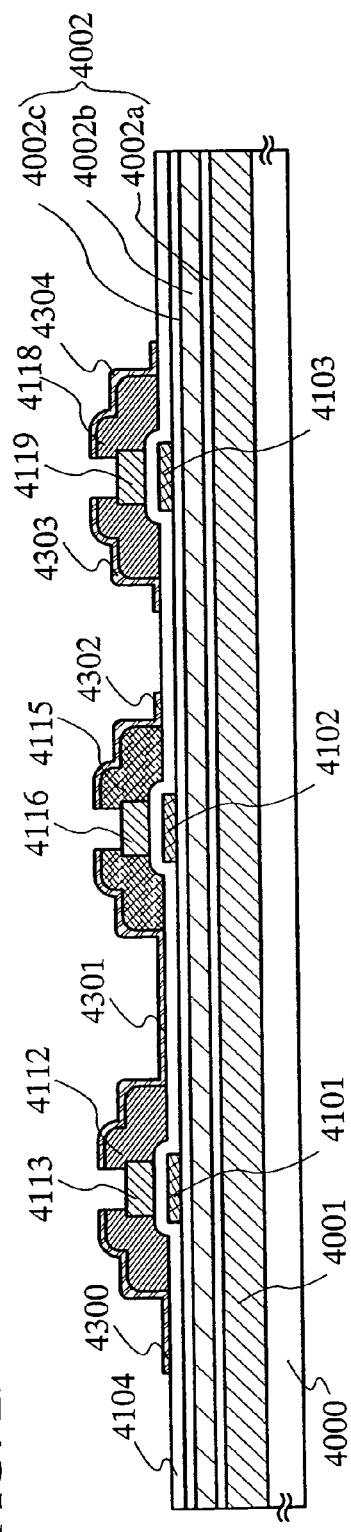
FIGS. 22A and 22B are views for showing a manufacturing process of an ID chip according to the present invention.

As illustrated in FIG. 22A, a release layer 4001 is formed over a heat-resistant substrate (first substrate) 4000 by a sputtering method. A glass substrate such as barium borosilicate glass or alumino borosilicate glass, a quartz substrate, a ceramic substrate, or the like can be used as the first substrate 4000. In addition, a metal substrate including a stainless steel substrate or a semiconductor substrate with an insulating film formed over its surface may be used. Although a flexible substrate such as a plastic substrate which is formed from a synthetic resin such as plastic is generally inferior to the above substrates in the heat resistance, the flexible substrate can be used when the substrate can resist the heat temperature in the manufacturing process.

The release layer 4001 can be formed of a layer containing silicon such as amorphous silicon, poly-crystalline silicon, single-crystal silicon, or microcrystal silicon (including semi-amorphous silicon) as a main component. The release layer 4001 can be formed by a sputtering method, a low pressure CVD method, a plasma CVD method, or the like. In this embodiment, the release layer 4001 is formed of the amorphous silicon in approximately 50 nm thick by a low pressure CVD method. The material of the release layer 4001 is not limited to silicon, and a material that can be selectively etched off may be used. It is preferable that the release layer 4001 has the thickness from 50 nm to 60 nm. When the release layer 4001 is formed of the semi-amorphous silicon, it may be formed in a thickness from 30 nm to 50 nm.

Next, a base film 4002 is formed over the release layer 4001. The base film 4002 is provided in order to prevent alkali-earth metal or alkali metal such as Na in the first substrate 4000 from diffusing into the semiconductor film. The alkali-earth metal and the alkali metal have an adverse effect on the characteristic of a semiconductor element such as a TFT when they are in the semiconductor. Another purpose for providing the base film 4002 is to protect the semiconductor element in the following process of stripping the semiconductor element. The base film 4002 may be a single insulating film or may include a plurality of insulating films. Accordingly, the base film 4002 is formed of an insulating material such as silicon oxide, silicon nitride, or silicon nitride containing oxygen which can suppress the diffusion of the alkali-earth metal or the alkali metal into the semiconductor film.

In this example, the base film 4002 is formed by sequentially stacking a silicon oxide film containing nitrogen (SiON film) having a thickness of 100 nm, a silicon nitride film containing oxygen (SiNO film) having a thickness of 50 nm, and a silicon oxide film containing nitrogen (SiON film) having a thickness of 100 nm as a first layered bottom film (bottom layered base film) 4002a, a second layered base film (middle layered base film) 4002b, and a third layered base film (top layered base film) 4002c, respectively. However, the material, the thickness, and the number of the stacked films are not limited to the above description. For example, the bottom layered base film 4002a can be formed by a siloxane-based resin having a thickness from 0.5 μm to 3 μm by a spin coating method, a slit coating method, a droplet discharging method, or the like instead of the SiON film. The middle layered base film 4002b can be formed by a silicon nitride film (SiN$_x$) instead of the SiNO film. The top layered base film 4002c can be formed by a silicon oxide film instead of the SiON film. The thickness of each film is desirably in the range of 0.05 μm to 3 μm, and the thickness may be selected arbitrarily from this range.

Alternatively, the bottom layered base film 4002a which is closest to the release layer 4001 may be formed of the SiON film or the silicon oxide film, the middle layered base film 4002b may be formed of siloxane-based resin, and the top layered base film 4002c may be formed of the silicon oxide film.

The silicon oxide film can be formed by a thermal CVD method, a plasma CVD method, a normal-pressure CVD method, a bias ECRCVD method, or the like with a mixed gas of $SiH_4$ and $O_2$ or a mixed gas of TEOS (tetraethoxysilane) and $O_2$, and the like. The silicon nitride film can be formed by a plasma CVD method with a mixed gas of $SiH_4$ and $NH_3$ typically. The silicon oxide film containing nitrogen (SiON: O>N) and the silicon nitride film containing oxygen (SiNO: N>O) can be formed by a plasma CVD method with a mixed gas of $SiH_4$ and $N_2O$ typically.

After forming the base film 4002, a TFT is formed by the same manufacturing process as that in Example 2. Unless otherwise stated, manufacturing conditions, manufacturing processes, deposition materials, or the like are the same as those in Example 2 (FIG. 22A).

In this example, n-channel TFTs 4011, 4013 and a p-channel TFT 4012 are formed over the substrate 4000.

In the n-channel TFT 4011, a gate electrode 4101, a gate insulating film 4104, a channel formation region 4113, and a source or drain region 4112 are formed over the base film 4002.

In p-channel TFT 4012, a gate electrode 4102, a gate insulating film 4104, a channel formation region 4116, a source or drain region 4115 are formed over the base film 4002.

In the n-channel TFT 4013, a gate electrode 4103, a gate insulating film 4104, a channel formation region 4119, a source or drain region 4118 are formed over the base film 4002.

Wirings 4300, 4301 are connected to the source or drain region 4112 of the n-channel TFT 4011. Wirings 4301, 4302 are connected to the source or drain region 4115 of the p-channel TFT 4012. Wirings 4303, 4304 are connected to a source or drain region 4118 of the n-channel TFT 4013. Further, the wiring 4304 is, but not shown, also connected to the gate electrode 4103 of the n-channel TFT 4013. The n-channel TFT 4013 can be used as a memory element of random number ROM.

Thereafter, a first interlayer insulating film 4200 is formed to protect the TFTs 4011 to 4013 and the wirings 4300 to 4304. For forming the first interlayer insulating film, silicon nitride, silicon oxide containing nitrogen, aluminum nitride, aluminum oxide, silicon oxide, or the like, each of which can prevent alkali metal or alkali earth metal from penetrating into the TFTs 4011 to 4013 is preferably used. Specifically, a silicon nitride film containing nitrogen (SiON film) having a thickness of approximately 600 nm can be used as the first interlayer insulating film 4200. In that case, a hydrogen treatment process can be performed after forming the SiON film. As noted above, three layered insulating films of silicon nitride containing oxygen (SiNO film), silicon nitride film (SiNx film), and a silicon oxide film containing nitrogen (SiON) are formed over the TFTs 4011 to 4013; however, its structure or its material is not limited thereto. By using the foregoing structure, the TFTs 4011 to 4013 are covered by the base film 4002 and the first interlayer insulating film 4200, and so alkali metal or alkali earth metal such as Na is dispersed in a semiconductor film used in a semiconductor element and is able to further prevent adverse effects on characteristics of the semiconductor element.

A second interlayer insulating film 4201 is formed over a first interlayer insulating film 4200. As a material for the second interlayer insulating film 4201, organic resin having heat resistance such as polyimide, acrylic, or polyamide can be used. In addition to the foregoing resin, a low dielectric material (low-k material) or resin containing siloxane can be used.

Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

The second interlayer insulating film 4201 can be formed by a spin coating method, a dipping method, a spray coating method, a droplet discharging method (an ink-jet method, a screen printing method, an offset printing method, or the like), a doctor knife method, a roller coating method, a curtain coating method, a knife coating method, or the like depending on the material. In addition, an inorganic material may be used, and in this case, silicon oxide, silicon nitride, silicon oxynitride, PSG (phosphorous glass), BPSG (phosphorous boron glass), an alumina film, or the like can be used. Further, the second interlayer insulating film 4201 may be formed by stacking the above insulating films.

Figure 22B:
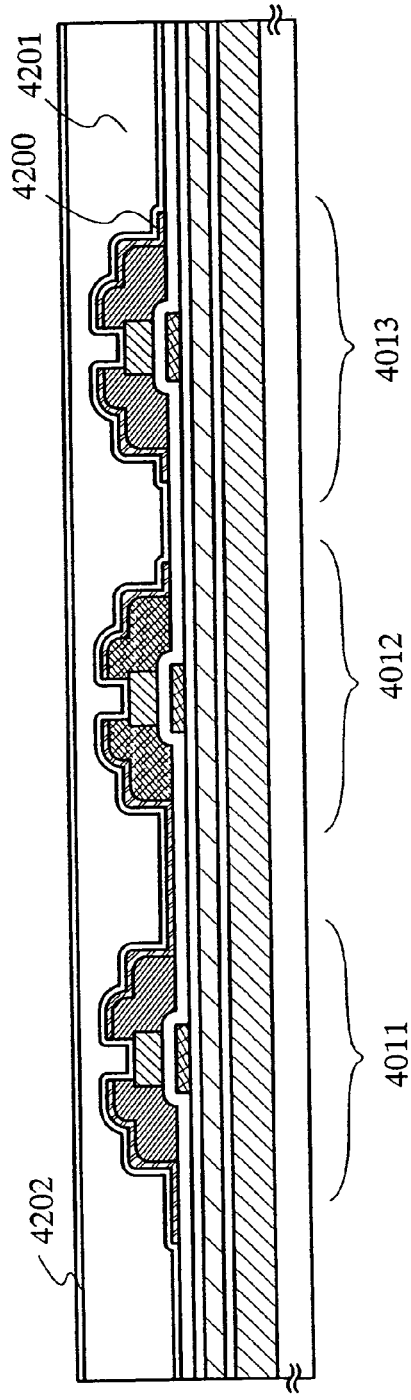

In this example, a third interlayer insulating film 4202 is formed over the second interlayer insulating film 4201 (FIG. 22B). The third interlayer insulating film 4202 can be formed of a film including carbon such as DLC (diamond-like carbon) or CN (carbon nitride), silicon oxide, silicon nitride, or silicon oxide containing nitrogen by a plasma CVD method, an atmospheric-pressure plasma CVD method, or the like. In addition, the third interlayer insulating film 4202 may be formed of a photosensitive or non-photosensitive organic material such as polyimide, acrylic, polyamide, benzocyclobutene, or a resist, a siloxane-based resin, or the like.

A filler may be mixed into the second interlayer insulating film 4201 or the third interlayer insulating film 4202 in order to prevent the second interlayer insulating film 4201 or the third interlayer insulating film 4202 from stripping and damaging.

Figure 23A:
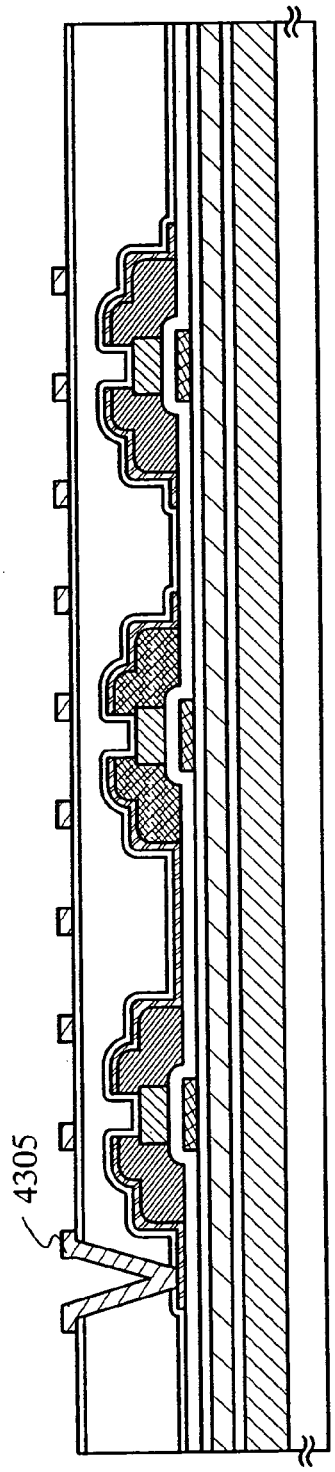
FIGS. 23A and 23B are views for showing a manufacturing process of an ID chip according to the present invention.

A contact hole is formed to the first to third interlayer insulating films 4200 to 4202. A conductive material film is formed over the third interlayer insulating film 4202 and an antenna 4305 is formed by the conductive material film (FIG. 23A). The antenna 4305 can be made from metal such as Ag, Au, Cu, Pd, Cr, Mo, Ti, Ta, W, Al, Fe, Co, Zn, Sn, or Ni, or a conductive material including one or a plurality of metal compounds.

The antenna 4305 is connected to the wiring 4300. Although the antenna 4305 is directly connected to the wiring 4300 in FIG. 23A, the ID chip of the present invention is not limited to this constitution. For example, the antenna 4305 may be electrically connected to the wiring 4202 by using a wiring separately formed.

The antenna 4305 can be formed by a printing method, a photolithography method, a vapor deposition method, a droplet discharging method, or the like. In this example, the antenna 4305 is formed of a single conductive film. However, the antenna 4305 can be formed by stacking a plurality of conductive films. For example, the antenna 4305 may be formed of a wiring such as Ni coated with Cu by electroless plating.

A droplet discharging method is a method for forming a predetermined pattern by discharging a droplet including a predetermined composition from a small nozzle. An ink-jet method is given as an example of a droplet discharging method. On the other hand, a printing method includes the screen printing method, the offset printing method, and the like. When the printing method or the droplet discharging method is employed, the antenna 4305 can be formed without using a mask for an exposure. In addition, the droplet discharging method and the printing method do not waste a material which is removed by etching in the photolithography method. Further, since an expensive mask for the exposure is not required to use, the cost spent on manufacturing the ID chip can be reduced.

In the case of using a droplet discharging method or various printing methods, for example, a conductive particle or the like obtained by coating Cu with Ag can be used. When the antenna 4305 is formed by a droplet discharging method, it is desirable to perform treatment for improving the adhesiveness of the antenna 4305 to a surface of the third interlayer insulating film 4302.

Several methods capable of improving the adhesiveness are given as follows: one is that a metal or a metal compound which can improve the adhesiveness to a conductive film or an insulating film due to the catalyst action is attached to the surface of the third interlayer insluting film 4202; another is that an organic-based insulating film, metal, or metal compound having high adhesiveness to a conductive film or an insulating film is attached to the surface of the third interlayer insulating film 4202; and further another is that a plasma treatment is performed to the surface of the third interlayer insulating film 4202 under the atmospheric pressure or reduced pressure so that the surface thereof is modified. Sc, Ti, V, Cr, Mn, Fe, Co, Ni, Cu, or Zn which is a 3d transition element, or the like in addition to titanium or titanium oxide is given as an example of the metal having high adhesiveness to the conductive film or the insulating film. Oxide, nitride, oxynitride, or the like of the above-mentioned metal is given as an example of the metal compound. For example, polyimide, a siloxane-based resin, or the like is given as an example of the organic-based insulating film.

When the metal or the metal compound attached to the third interlayer insulating film 4202 is conductive, the sheet resistance is controlled so that the antenna can operate normally. Specifically, the average thickness of the conductive metal or metal compound may be in the range of from 1 nm to 10 nm. In addition, the metal or the metal compound may be insulated partially or totally by oxidization. Furthermore, the metal or the metal compound attached to the region in which the adhesiveness is not required may be removed selectively by etching. The metal or the metal compound may be attached selectively only to a particular region by a droplet discharging method, a printing method, or a sol-gel method instead of attaching preliminary allover the substrate. The metal or the metal compound does not need to be in a state of completely continuous film over the surface of the third interlayer insulating film 4202 but may be dispersed to some extent.

Figure 23B:
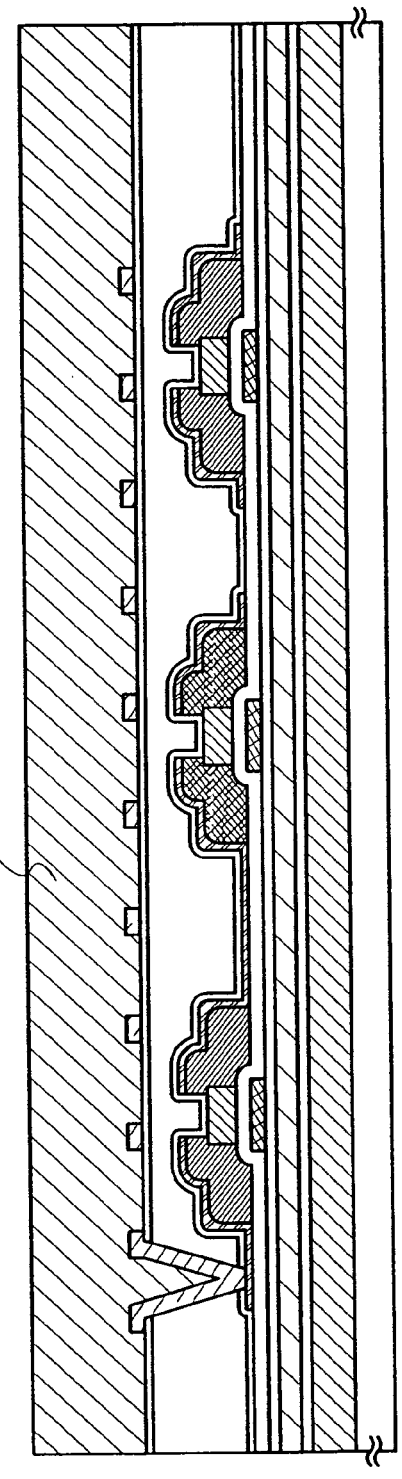

Then, as illustrated in FIG. 23B, after forming the antenna 4305, a protective layer 4400 is formed over the third interlayer insulating film 4202 so as to cover the antenna 4305. The protective layer 4400 is formed of the material that can protect the antenna 4305 when the release layer 4001 is etched off afterward. For example, the protective layer 4400 can be formed by entirely coating an epoxy-based resin, an acrylate-based resin, or a silicon-based resin soluble in water or alcohol.

In this example, the protective layer 4400 is formed in such a way that a water-soluble resin (VL-WSHL10 manufactured by Toagosei Co., Ltd) is coated in 30 μm thick by a spin coating method to be exposed for 2 minutes in order to cure the resin tentatively, and then the backside of the substrate is irradiated with UV light for 2.5 minutes, then, the topside of the substrate is irradiated with UV light for 10 minutes, totally, 12.5 minutes, in order to cure the resin completely. In the case where a plurality of organic resins is stacked, the adhesiveness may become too high or the organic resins may melt partially depending on the solvent during being coated or baked. Therefore, when the third interlayer insulating film 4202 and the protective layer 4400 are formed of the organic resins that can be dissolved in the same solvent, it is preferable to form an inorganic insulating film (a $SiN_x$ film, a $SiN_xO_y$ film, an $AlN_x$ film, or an $AlN_xO_y$ film) over the third interlayer insulating film 4202 so that the protective layer 4400 can be removed smoothly in the following process.

Figure 24A:
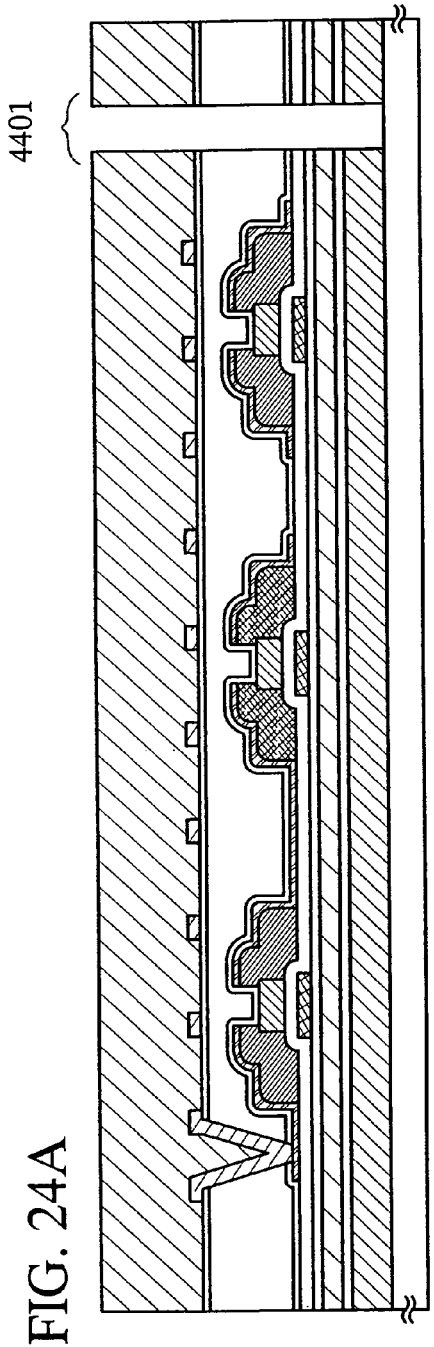
FIGS. 24A and 24B are views for showing a manufacturing process of an ID chip according to the present invention.

Next, as illustrated in FIG. 24A, a groove 4401 is formed in order to divide the ID chips. The groove 4401 may have the depth of such a degree that the release layer 4001 is exposed. The groove 4401 can be formed by a dicing method, a scribing method, or the like. Further, the groove 4401 is not necessarily formed when it is not required to divide the ID chips formed over the first substrate 4000.

Figure 24B:
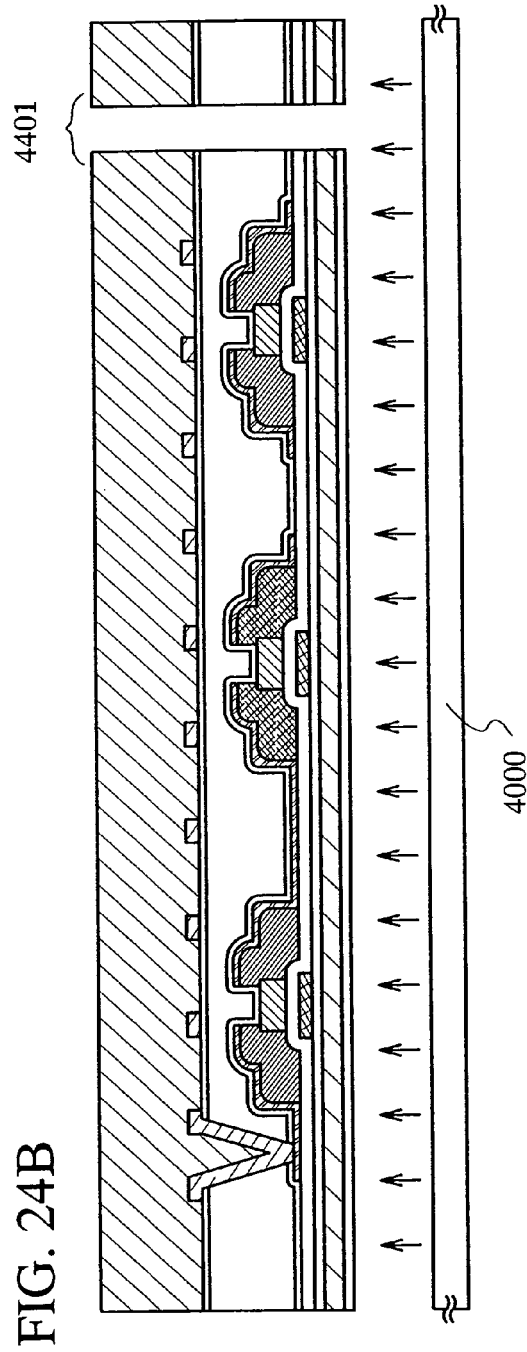

As illustrated in FIG. 24B, the release layer 4001 is etched off. In this embodiment, halogen fluoride is used as an etching gas and the gas is introduced from the groove 4401. In this embodiment, $ClF_3$ (chlorine trifluoride) is used under the condition where the temperature is 350° C., the flow rate is 300 sccm, the pressure is 6 Torr, and the etching time is 3 hours. Alternatively, the $ClF_3$ gas mixed with nitrogen may be used. The release layer 4001 can be selectively etched by using the halogen fluoride such as $ClF_3$ so that the first substrate 4000 can be stripped from the TFTs 4011 to 4013. The halogen fluoride may be gas or liquid.

Figure 25A:
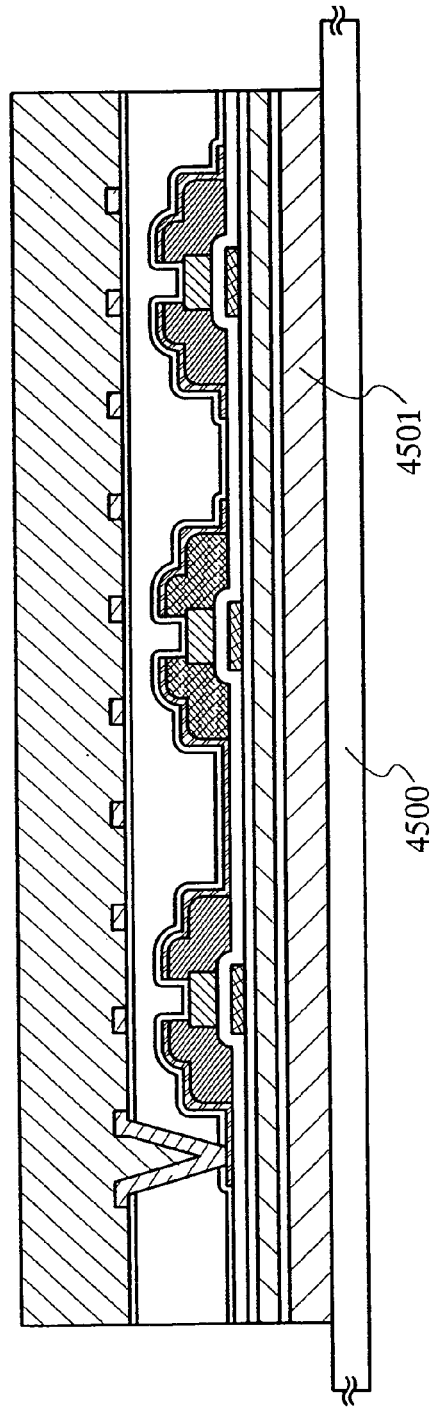
FIGS. 25A and 25B are views for showing a manufacturing process of an ID chip according to the present invention.

As illustrated in FIG. 25A, the released TFTs 4011 to 4013 and the antenna 4305 are attached to a second substrate 4500 by using an adhesive agent 4501. The adhesive agent 4501 is formed of the material that can attach the second substrate 4500 and the base film 4002 to each other. The adhesive agent 4501 may be, for example, a reactive-curing type, a thermosetting type, a photo-curing type such as a UV-curable type, or an anaerobic type.

The second substrate 4500 can be formed of a flexible organic material such as paper or plastic. Alternatively, a flexible inorganic material may be used as the second substrate 4500. The plastic substrate may be formed of ARTON including poly-norbornene that has a polar group (manufactured by JSR). In addition, polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, or the like can be given as an example of the material of the plastic substrate. It is desirable that the second substrate 4500 has heat conductivity as high as approximately 2 W/mK to 30 W/mK in order to diffuse the heat generated in the integrated circuit.

Figure 25B:
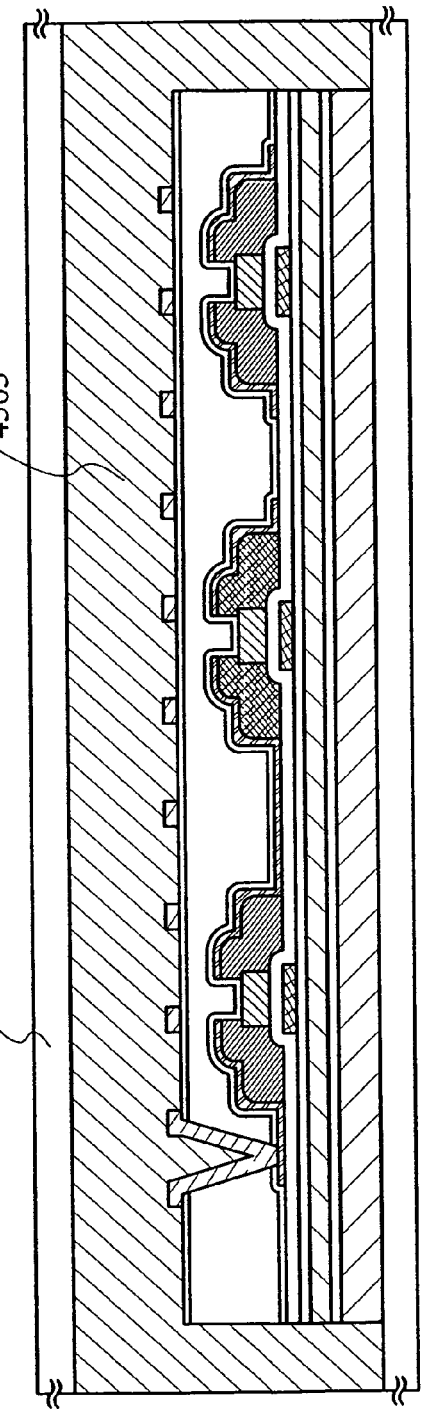

As illustrated in FIG. 25B, after removing the protective layer 4400, an adhesive agent 4503 is coated over the third interlayer insulating film 4202 so as to cover the antenna 4305, and then the cover member 4502 is attached. The flexible organic material such as paper or plastic can be used as the cover member 4502 in the same manner as the second substrate 4500. The thickness of the adhesive agent 4503 may range from 10 μm to 200 μm.

The adhesive agent 4503 is formed of the material which can attach the cover member 4502 to the third interlayer insulating film 4202 and the antenna 4305. The adhesive agent 4503 can be, for example, a reactive-curing type, a thermosetting type, a photo-curing type such as an UV-curing type, or an anaerobic type.

According to the foregoing processes, the ID chip is completed. Through the above manufacturing method, an extremely thin integrated circuit having the total thickness in the range from 0.3 to 3 μm, typically approximately 2 μm, can be formed between the second substrate 4500 and the cover member 4502. The thickness of the integrated circuit includes not only the thickness of the semiconductor element but also the thickness of the insulating films and the interlayer insulating films formed between the adhesive agent 4501 and the adhesive agent 4503. The integrated circuit included in the ID chip can be formed to occupy an area of approximately 5 mm square (square measure of 25 mm$^2$) or less, more preferably approximately from 0.3 mm square (0.09 mm$^2$) to 4 mm square (16 mm$^2$).

The mechanical strength of the ID chip can be increased by providing the integrated circuit to the center of the space between the second substrate 4500 and the cover member 4502 as much as possible. Specifically, it is desirable to control the thickness of the adhesive agents 4501 and 4503 so that the distance x between the second substrate 4500 and the center in the direction of the thickness of the integrated circuit satisfies $$\frac{1}{2}d - 30 \ \mu m < x < \frac{1}{2}d + 30 \ \mu m$$

in which d is the distance between the second substrate 4500 and the cover member 4503.

It is more preferable to control the thickness of the adhesive agents 4501 and 4502 so as to satisfy $$\frac{1}{2}d - 10 \ \mu m < x < \frac{1}{2}d + 10 \ \mu m.$$

Although the cover member 4502 is used in FIG. 25B, the present invention is not limited to this. Only the processes up to the process shown in FIG. 25A may be performed.

Although this Example 7 described the example in which the release layer is provided between the first substrate 500 having high heat resistance and the integrated circuit and the integrated circuit is removed from the first substrate by etching the release layer, a method for manufacturing the ID chip according to the present invention is not limited to this structure. For example, a metal oxide film may be provided between the integrated circuit and the substrate having high heat resistance, and the metal oxide film may be weakened by crystallization so that the integrated circuit is peeled. Alternatively, the release layer made from an amorphous semiconductor including hydrogen may be provided between the integrated circuit and the substrate having high heat resistance, and the release layer can be removed by laser irradiation so that the integrated circuit is peeled. Alternatively, the integrated circuit may be peeled from the substrate by removing mechanically the substrate having high heat resistance with the integrated circuit formed thereover or by etching the substrate away with solution or gas.

When an organic resin is used for forming the adhesive agent 4501 in contact with the base film 4002 in order to secure the flexibility of the ID chip, the diffusion of the alkali-earth metal or the alkali metal such as Na from the organic resin into the semiconductor film can be prevented by using a silicon nitride film or a silicon nitride oxide film as the base film 4002.

In the case that an object to be attached with an ID chip has a curved surface and the second substrate 4500 of the ID chip bends so as to have a curved surface as if the curved surface is drawn by moving a generating line of a conical surface, a cylindrical surface, or the like, it is desirable to conform the direction of the generating line to the direction in which carriers move in the TFTs 4011 to 4013. With the above structure, it is possible to prevent the characteristics of the TFTs 4011 to 4013 from being affected even if the second substrate 4500 is bended. The area of the island-shaped semiconductor film with the proportion of 1 to 30% in the integrated circuit can suppress the change of the characteristics of the TFTs 4011 to 4013 due to the bending of the second substrate 4500.

Although Example 7 described an example of forming the antenna to share one substrate with the integrated circuit, the present invention is not limited to this structure. The antenna and the integrated circuit which are formed over different substrates can be pasted to each other afterward so that they are connected electrically to each other.

The frequency of an electric wave usually applied in the ID chip is 13.56 MHz or 2.45 GHz, and it is important to form the ID chip so that the ID chip can detect these frequencies in order to enhance the versatility.

The ID chip of this Example 7 has advantages that an electric wave is hard to be blocked compared to the ID chip formed over the semiconductor substrate and that attenuation of the signal due to the block of the electric wave can be prevented. Therefore, a semiconductor substrate is not required, and so the cost for manufacturing the ID chip can be drastically reduced. For example, a silicon substrate having a diameter of 12 inch is compared with a glass substrate having a size of 730×920 mm$^2$. The silicon substrate has an area of approximately 73000 mm$^2$, whereas the glass substrate has an area of approximately 671600 mm$^2$. Therefore, the glass substrate is approximately 9.2 times larger than the silicon substrate. From the glass substrate having the size of approximately 671600 mm$^2$, approximately 671600 pieces of ID chips each of which is 1 mm square can be obtained when the area consumed by dividing the substrate is ignored. The number of ID chips is approximately 9.2 times larger than that formed using the silicon substrate. Moreover, the business investment for the mass production of the ID chip can be decreased to be ⅓ of that for manufacturing the ID chip using the silicon substrate since the number of steps can be decreased. Moreover, after stripping the integrated circuit from the glass substrate, the glass substrate can be used again. Even after considering all the costs for compensating a damaged glass substrate and washing the surface of the glass substrate, the cost can be decreased to a large degree compared with the case of using the silicon substrate. Even when the glass substrate is disposed without being reused, the cost of the glass substrate having a size of 730×920 mm$^2$ is about a half of that of the silicon substrate having a diameter of 12 inch. Therefore, it is understood that the cost for the ID chip can be reduced drastically.

As a result, when the glass substrate having a size of 730× 920 mm$^2$ is used, the price of the ID chip can be made approximately 1/30 of that formed over the silicon substrate having a diameter of 12 inch. Since the ID chip is expected to be used as a disposable chip, the inexpensive ID chip of the present invention is very advantageous in this application.

This example described an example of peeling the integrated circuit and pasting the peeled integrated circuit onto a flexible substrate; however, the present invention is not limited thereto. In the case that a substrate having heat resistance which can withdraw heat treatment in a manufacturing process of the integrated circuit is used, the integrated circuit is not necessarily peeled.

This example can be freely combined with any description in Embodiment and Examples 1 to 6.

Example 8

Given as examples of such electronic devices provided with a module explained in the foregoing embodiment mode are: a camera such as a video camera or a digital camera, a goggles-type display (head mounted display), a navigation system, a sound reproduction device (a car audio system, an audio set and the like), a personal computer, a game machine, a portable information terminal (a mobile computer, a cellular phone, a portable game machine, an electronic book, or the like), and an image reproduction device including a recording medium (more specifically, a device which can reproduce a recording medium such as a digital versatile disc (DVD) and so forth, and includes a display for displaying the reproduced image). The droplet discharging method explained in the foregoing embodiment mode is preferably used for manufacturing a large television or the like having a large screen. FIGS. 26A and 31E show various specific examples of such electronic devices.

Figure 26:
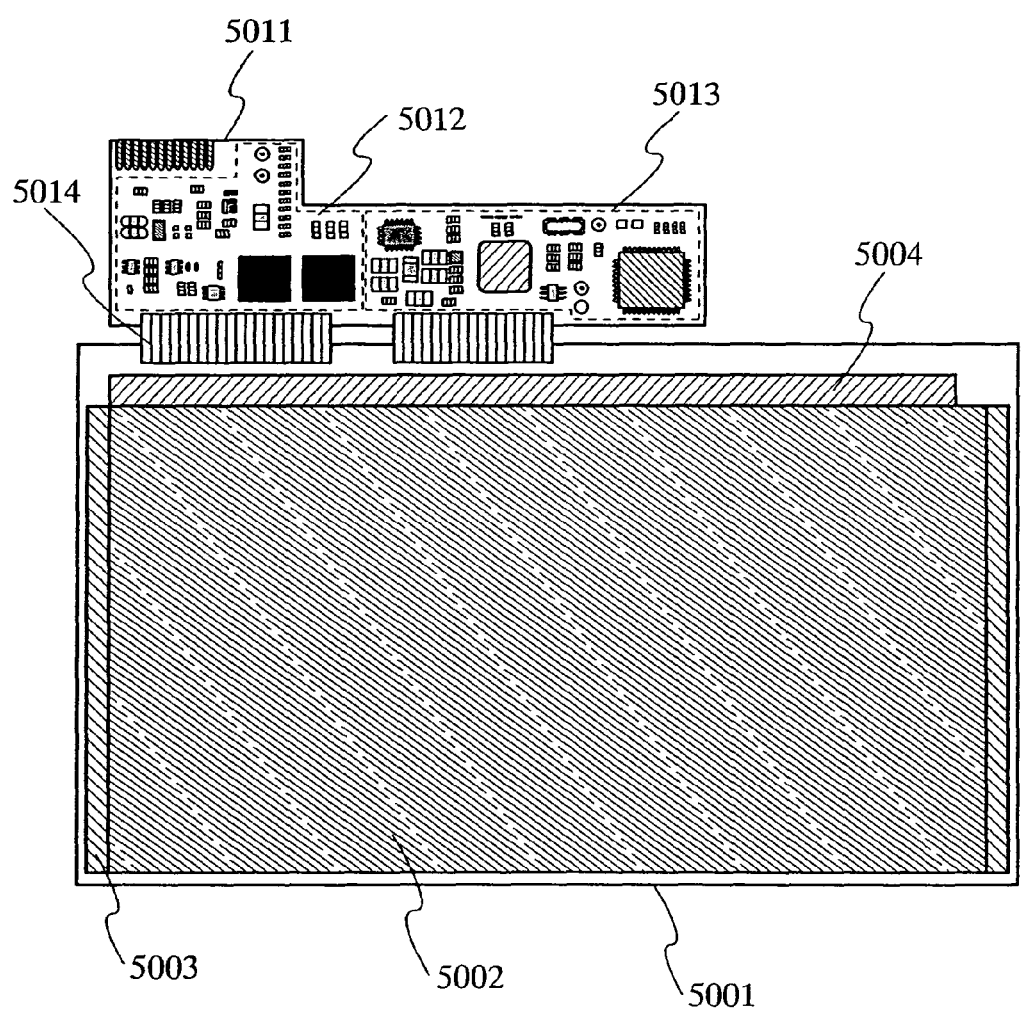
FIG. 26 is an example of an electronic device applied with the present invention.

FIG. 26 shows a liquid crystal module or an EL module which is formed by combining a display panel 5001 and a circuit substrate 5011. The circuit substrate 5001 is provided with a control circuit 5012, a signal dividing circuit 5013, and the like, and is electrically connected to the display panel 5001 via a connecting wiring 5014.

The display panel 5001 is provided with a pixel portion 5002 having a plurality of pixels, a scanning line driver circuit 5003, and a signal line driver circuit 5004 for supplying a video signal to a selected pixel. The display panel 5001 may be manufactured in accordance with Example 4 or 5 in the case of manufacturing a liquid crystal module, whereas the display panel 5001 may be manufactured in accordance with Example 6 in the case of manufacturing an EL module. A control driver circuit unit such as the scanning line driver circuit 5003 or the signal line driver circuit 5004 can be manufactured by using a TFT formed according to the present invention.

Figure 27:
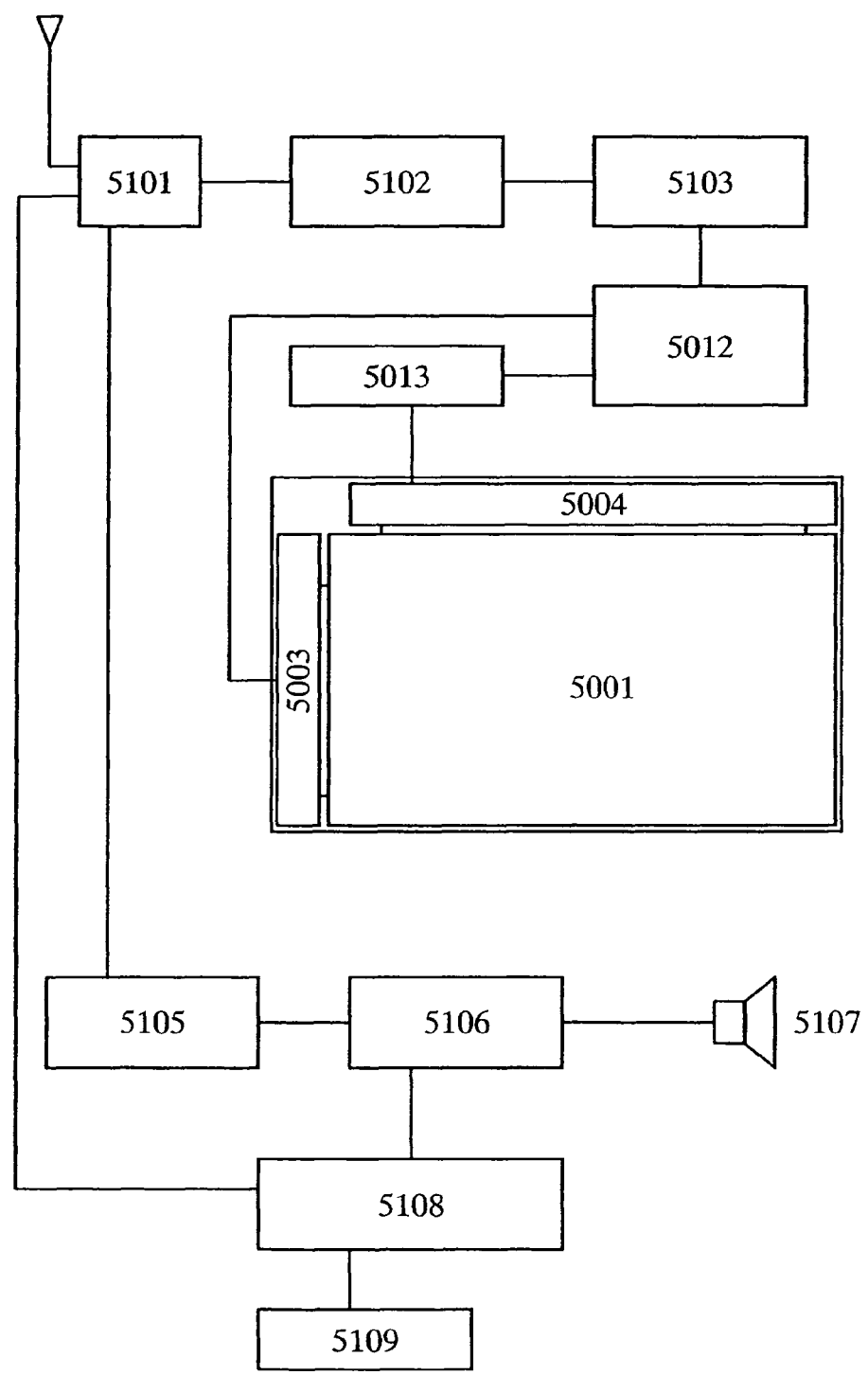
FIG. 27 is an example of an electronic device applied with the present invention.

A liquid crystal television receiver or an EL television receiver can be completed by using the liquid crystal module or the EL module shown in FIG. 26B. FIG. 27 is a block diagram for showing a main structure of the liquid crystal television receiver or the EL television receiver. A tuner 5101 receives a video signal and a voice signal. The video signal is processed by a video signal amplifier circuit 5102, a video signal processing circuit 5103 which converts signals outputted from the video signal amplifier circuit 5102 into color signals corresponding to red, green, and blue, and a control circuit 5012 which converts the video signal into input specifications. In the control circuit 5012, signals are outputted to a signal line driver circuit and a scan line driver circuit. In the case of digital driving, a signal separation circuit 5013 may be provided at the side of the signal line driver circuit and an input digital signal is separated into m pieces to be supplied.

A voice signal among the signals received by the tuner 5101 is sent to an audio signal amplifier circuit 5105, and the output is supplied to a speaker 5107 via an audio signal processing circuit 5106. A control circuit 5108 receives control information of a reception station (reception frequency) or volume to send the signals to the tuner 5101 or the sound signal processing circuit 5106.

Figure 28A:
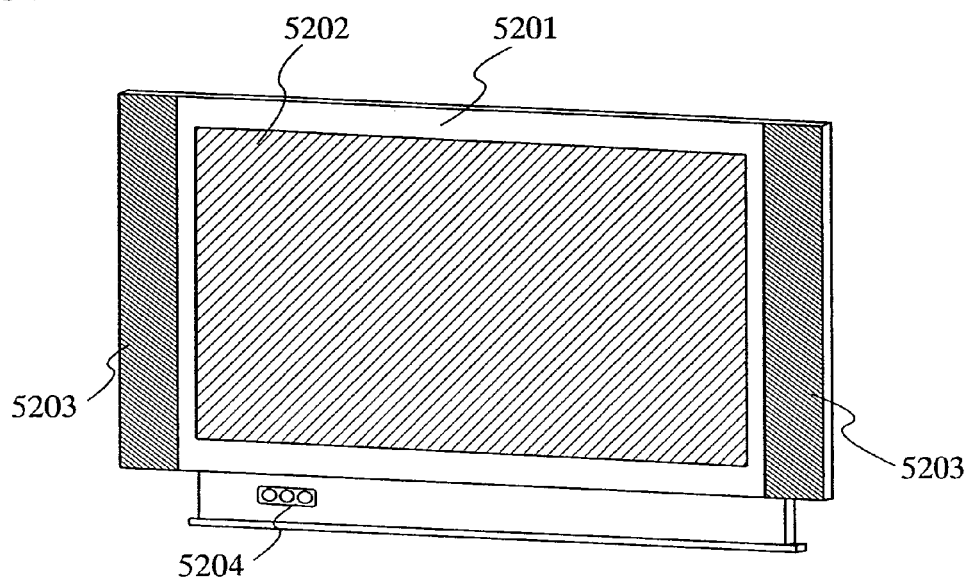
FIGS. 28A and 28B are examples of electronic devices applied with the present invention.

As shown in FIG. 28A, a television receiver can be completed by installing the liquid crystal module or the EL module. A display screen 5202 is formed by the liquid crystal module or the EL module. The television receiver is appropriately provided with a speaker 5203, an operation switch 5204, and the like.

Figure 28B:
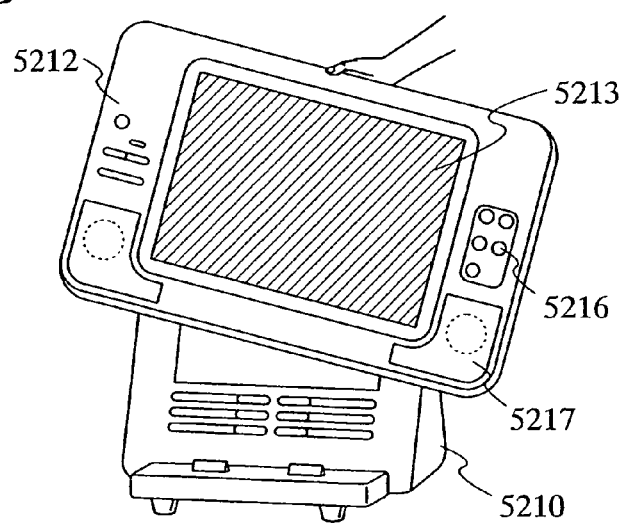

FIG. 28B shows a television receiver having a portable wireless display. A housing 5212 is installed with a battery and a signal receiver. The battery drives a display portion 5213 and a speaker portion 5217. The battery can be repeatedly charged by a battery charger 5210. The battery charger 5210 can send and receive a video signal and send a received video signal to the signal receiver of the display. The housing 5212 is controlled by operation switches 5216. The device shown in FIG. 28B can be referred to as a video voice bidirectional communication device since a signal can be sent from the housing 5212 to the battery charger 5210 by operating the operation keys 5216 in the device. Further, the device can be referred to as a versatile remote control device since a signal can be sent from the housing 5212 to the battery charger 5210 by operating the operation keys 5216 and another electronic device is made to receive a signal which can be sent by the battery charger 5210, accordingly, communication control of another electronic device is realized. The present invention can be applied to the display portion 5213, a control circuit unit, and the like.

By applying the present invention to the television receiver shown in FIGS. 26 to 28B, the television receiver can be manufactured at lower costs than ever and manufacturing times, manufacturing costs, and the like can be suppressed.

Needless to say, the present invention is not limited to the television receiver. The present invention can be applied to various usages especially as a large display medium such as a monitor of a personal computer, an information display board in a railway station or an airport, an advertisement display board on the street, or the like.

Figure 29A:
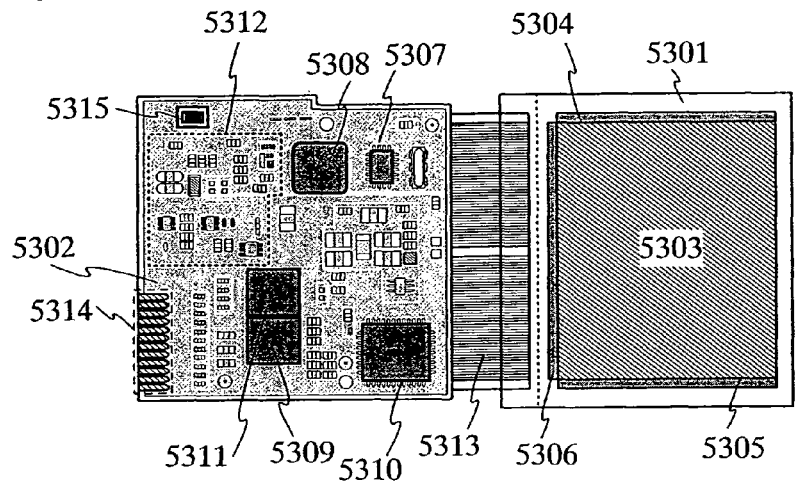
FIGS. 29A and 29B are examples of electronic devices applied with the present invention.

FIG. 29A shows a module formed by combining a display panel 5301 and a printed wiring board 5302. The display panel 5301 is provided with a pixel portion 5303 with a plurality of pixels, a first scanning driver circuit 5304, a second scanning driver circuit 5305, and a signal line driver circuit 5306 for supplying a video signal to a selected pixel.

A printed wiring board 5302 is provided with a controller 5307, a central processing unit (CPU) 5308, a memory 5309, a power source circuit 5310, a voice processing circuit 5311, and a sending and receiving circuit 5312. The printed wiring board 5302 is connected to the display panel 5301 via a flexible printed circuit (FPC) 5313. The printed wiring board 5302 can be formed to have a structure in which a capacitor element, a buffer circuit, and the like are formed to prevent noise from causing in power source voltage or a signal or the rising of a signal from dulling. The controller 5307, the voice processing circuit 5311, the memory 5309, the CPU 5308, the power source circuit 5310, and the like can be mounted to the display panel 5301 by using a COG (Chip on Glass) method. By means of the COG method, the size of the printed wiring board 5302 can be reduced.

Various control signals are inputted or outputted via an interface (I/F) 5314 which is provided to the printed wiring board 5302. An antenna port 5315 for sending and receiving to/from an antenna is provided to the printed wiring board 5302.

Figure 29B:
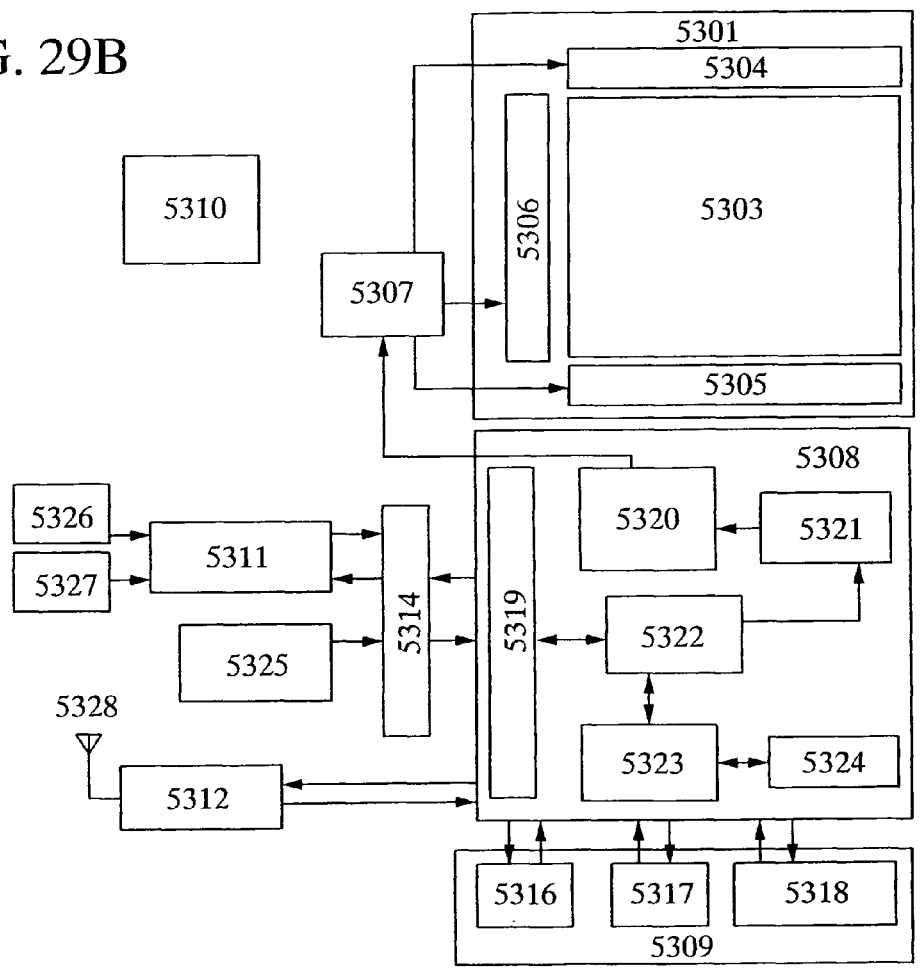

FIG. 29B is a block diagram for showing the module shown in FIG. 29A. The module includes a VRAM 5316, a DRAM 5317, a flash memory 5318, and the like as a memory 5309. The VRAM 5316 stores data on an image displayed on a panel, the DRAM stores image data or voice date, and the flash memory stores various programs.

The power source circuit 5310 supplies electricity for operating the controller 5307, the CPU 5308, the voice processing circuit 5311, the memory 5309, and the sending and receiving circuit 5312. A current source may be provided to the power source circuit 5310 depending on a panel specification.

The CPU 5308 includes a control signal generation circuit 5320, a decoder 5321, a resistor 5322, an arithmetic circuit 5323, a RAM 5324, an interface for a CPU 5308, and the like. Various signals inputted to the CPU 5308 via the interface 5319 is once inputted to a resister 5322, and inputted to the arithmetic circuit 5323, the decoder 5321, or the like. The arithmetic circuit 5323 carries out an operation to specify the location to which various instructions are sent. On the other hand, the signal inputted to the decoder 5321 is decoded and inputted to the control signal generation circuit 5320. The control signal generation circuit 5320 produces a signal including various instructions based on the inputted signal to send the produced signal to the memory 5309, the sending and receiving circuit 5312, the voice processing circuit 5311, and the controller 5307.

The memory 5309, the sending and receiving circuit 5312, the voice processing circuit 5311, and the controller 5307 operate in accordance with the instruction which of each received. Hereinafter, the operation is briefly explained.

The signal inputted from an input means 5325 is sent to the CPU 5308 mounted to the printed wiring board 5302 via the interface 5314. The control signal generation circuit 5320 converts image data stored in the VRAM 5316 into a predetermined format to send the converted data to the controller 5307 depending on the signal sent from the input means 5325 such as a pointing mouse or a key board.

The controller 5307 carries out data processing for the signal including the image data sent from the CPU 5308 along with the panel specification to supply the signal to the display panel 5301. Further, the controller 5307 produces a Hsync signal, a Vsync signal, a clock signal CLK, an alternating voltage (AC Cont), and a switching signal L/R based on power source inputted from the power source circuit 5310 or various signals inputted from the CPU 5308 to supply the signals to the display panel 5301.

The sending and receiving circuit 5312 processes a signal which is to be transmitted by an antenna 5328 as an electric wave, specifically, the sending and receiving circuit 5312 includes a high-frequency circuit such as isolator, a band pass filter, a VCO (Voltage Controlled Oscillator), an LPF (Low Pass Filter), a coupler, or a balun. A signal including voice information among signals transmitted in the sending and receiving circuit 5312 is sent to the voice processing circuit 5311 depending on an instruction from the CPU 5308.

The signal including voice information which is sent depending on an instruction from the CPU 5308 is demodulated in the voice processing circuit 5311 and is sent to a speaker 5327. A voice signal sent from a microphone 5326 is modulated in the voice processing circuit 5311 and is sent to the sending and receiving circuit 5312 depending on an instruction from the CPU 5308.

The controller 5307, the central processing unit (CPU) 5308, the power source circuit 5310, the voice processing circuit 5311, and the memory 5309 can be mounted as a package according to this example. This example can be applied to any circuit except a high-frequency circuit such as isolator, a band pass filter, a VCO (Voltage Controlled Oscillator), an LPF (Low Pass Filter), a coupler, or a balun.

Figure 30:
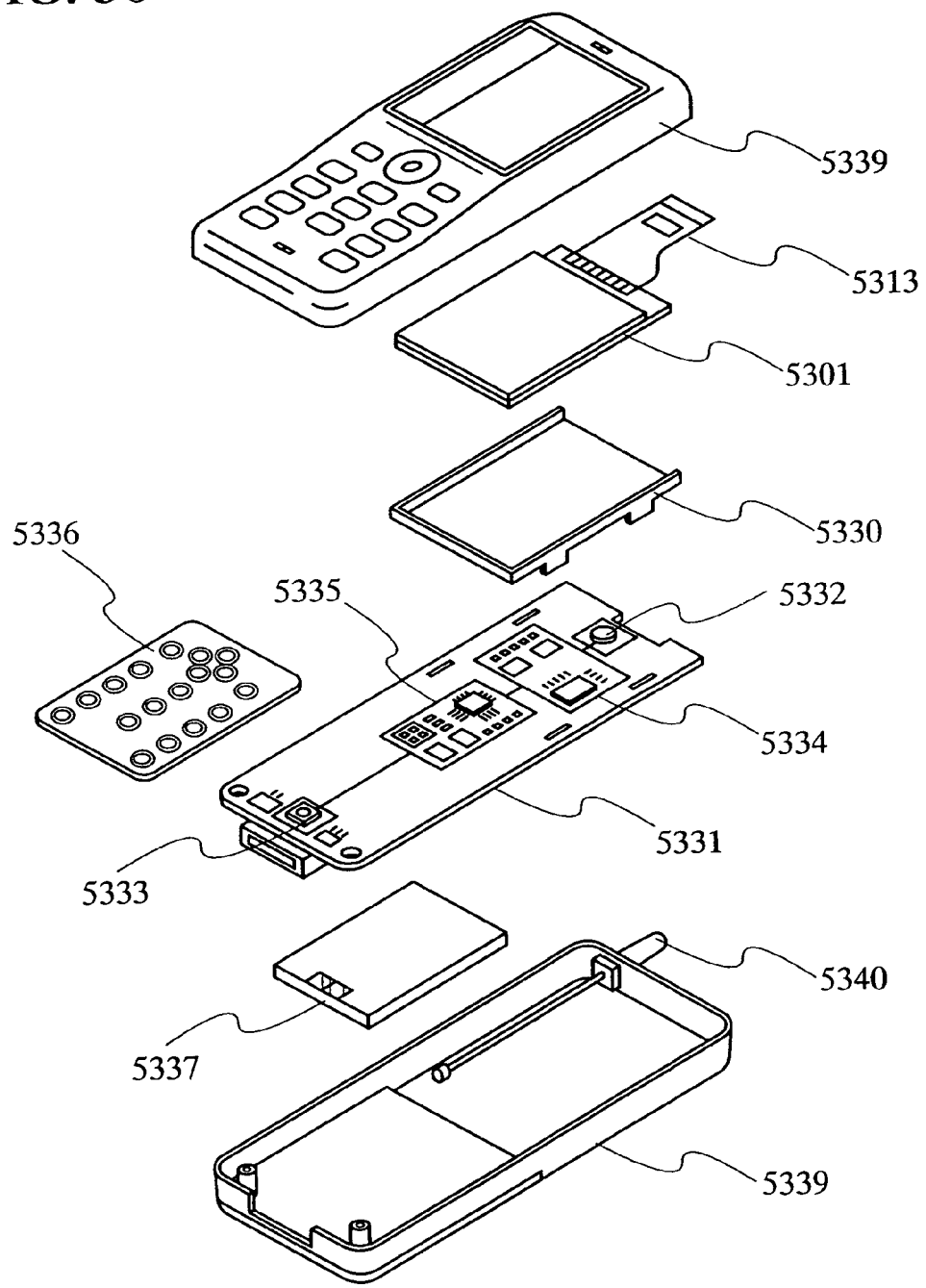
FIG. 30 is an example of an electronic device applied with the present invention.

FIG. 30 shows one embodiment of a cellular phone including a module shown in FIGS. 29A and 29B. A display panel 5301 which is detachable is incorporated into a housing 5330. The shape or the size of the housing 5330 can be appropriately changed depending on the size of the display panel 5301. The housing 5330 which fixes the display panel 5301 is fitted into a printed substrate 5331 so as to be incorporated as a module.

The display panel 5301 is connected to the printed substrate 5331 via the FPC 5313. The printed substrate 5331 is provided with a speaker 5332, a microphone 5333, a sending and receiving circuit 5334, and a signal processing circuit 335 including a CPU, a controller, and the like. Such a module, an input means 5336, a battery 5337, and an antenna 5340 are combined with each other to be stored in a housing 5339. A pixel portion of the display panel 5301 is arranged so as to be visible from an opening window which is provided to the housing 5339.

The cellular phone according to this example can be transformed into various modes depending on its functions or usages. For example, the cellular phone can have the foregoing operation and effect even when the cellular phone is manufactured to have a plurality of display panels or be foldable by dividing the housing into a plurality of pieces appropriately with a hinge.

By applying the present invention to the cellular phone shown in FIGS. 29A, 29B, and 30, the cellular phone can be manufactured by less numbers of processes, and so manufacturing time, manufacturing costs, and the like can be suppressed. By pasting an ID chip manufactured in accordance with the method described in Example 7 onto the cellular phone, a channel of distribution can be clarified.

Figure 31A:
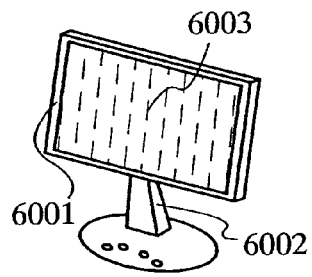
FIGS. 31A to 31E are examples of electronic devices applied with the present invention.

FIG. 31A shows a liquid crystal display or an OLED display which is composed of a housing 6001, a support medium 6002, a display portion 6003, and the like. The present invention can be applied to the display portion 6003 by using the liquid crystal module or an EL module shown in FIG. 26, or a display panel shown in FIG. 29A. Further, the present invention can be applied to a control circuit unit or the like.

By using the present invention, the display can be manufactured by less numbers of processes, and so manufacturing-time, manufacturing costs, and the like can be suppressed. By pasting an ID chip manufactured in accordance with the method described in Example 7 onto the cellular phone, a channel of distribution can be clarified.

Figure 31B:
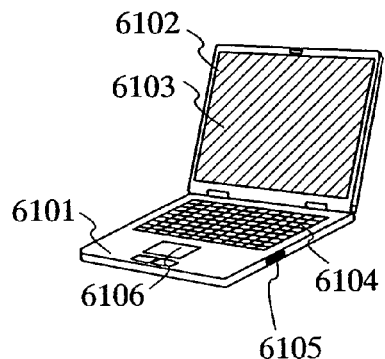

FIG. 31B is a computer including a main body 6101, a housing 6102, a display portion 6103, a keyboard 6104, an external connection port 6105, a pointing mouse 6106, and the like. The present invention can be applied to the display portion 6103 by using the liquid crystal module or an EL module, or a display panel shown in FIG. 29A. Further, the present invention can be applied to a control circuit unit or the like.

By using the present invention, the display can be manufactured by less numbers of processes, and so manufacturing time, manufacturing costs, and the like can be suppressed. By pasting an ID chip manufactured in accordance with the method described in Example 7 onto the cellular phone, a channel of distribution can be clarified.

Figure 31C:
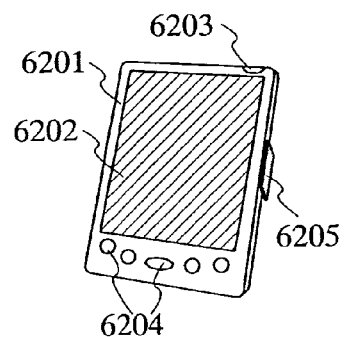

FIG. 31C shows a portable computer including a main body 6201, a display portion 6202, a switch 6203, operation keys 6204, an infrared port 6205, and the like. The present invention can be applied to the display portion 6202 by using the liquid crystal module or an EL module, or a display panel shown in FIG. 29A. Further, the present invention can be applied to a control circuit unit or the like.

By using the present invention, the display can be manufactured by less numbers of processes, and so manufacturing time, manufacturing costs, and the like can be suppressed. By pasting an ID chip manufactured in accordance with the method described in Example 7 onto the cellular phone, a channel of distribution can be clarified.

Figure 31D:
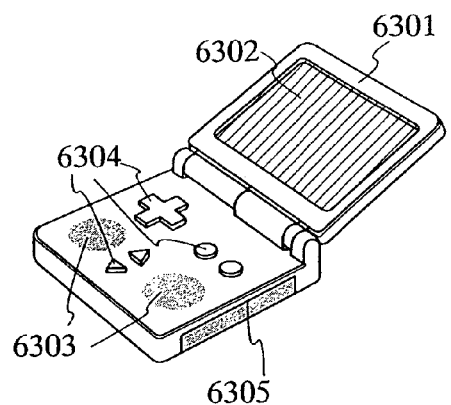
Figure 31E:
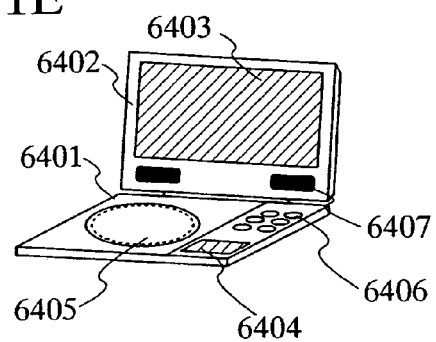

FIG. 31D shows a portable game machine including a main body 6301, a display portion 6302, a speaker portion 6303, operation keys 6304, a recording medium insert portion 6305, and the like. The present invention can be applied to the display portion 6302 by using the liquid crystal module or an EL module, or a display panel shown in FIG. 29A. Further, the present invention can be applied to a control circuit unit or the like.

By using the present invention, the display can be manufactured by less numbers of processes, and so manufacturing time, manufacturing costs, and the like can be suppressed. By pasting an ID chip manufactured in accordance with the method described in Example 7 onto the cellular phone, a channel of distribution can be clarified.

FIG. 31E shows a portable image reproduction device having a recording medium (specifically, a DVD reproduction device) including a main body 6401, a housing 6402, a display portion A 6403, a display portion B 6404, a recording medium (DVD or the like) reading portion 6405, operation keys 6406, a speaker portion 6407, and the like. The display portion A mainly displays image information, whereas the display portion B mainly displays character information. The present invention can be applied to the display portion A 6403, the display portion B 6404, and the control circuit unit or the like by using the liquid crystal module or an EL module, or a display panel shown in FIG. 29A. Further, the present invention can be applied to a control circuit unit or the like. The image reproduction device having a recording medium includes a domestic game machine or the like.

According to the present invention, the image reproducing device can be manufactured by less numbers of processes, and so manufacturing time, manufacturing costs, and the like can be suppressed. By pasting an ID chip manufactured in accordance with the method described in Example 7 onto the cellular phone, a channel of distribution can be clarified.

A display device used for these electronic devices can use not only a glass substrate but also a heat resistance plastic substrate depending on its size, strength, or intended use. Accordingly, the display device can be further lightened.

The example explained in this example is one example among many. It is written in addition that this example is not limited to these intended uses.

This example can be implemented by combining any description in Embodiment and Examples 1 to 7.

Example 9

Example 2 explains a bottom gate TFT which is different from that explained in Examples 1 and 2 and a method for manufacturing the same with reference to FIGS. 32A to 32D and 33A to 33D. The bottom gate TFT according to this example is manufactured in accordance with the description in Examples 1 and 2 unless otherwise noted.

Figure 32A:
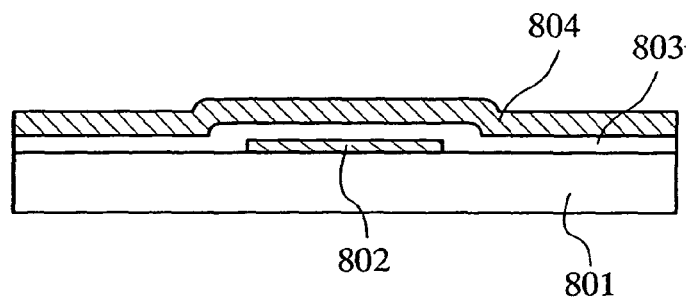
FIGS. 32A to 32D are views for showing a manufacturing process of a TFT according to the present invention.
Figure 32B:
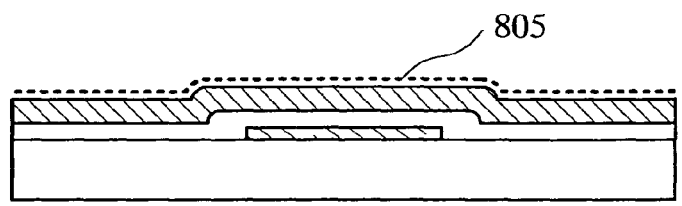
Figure 32C:
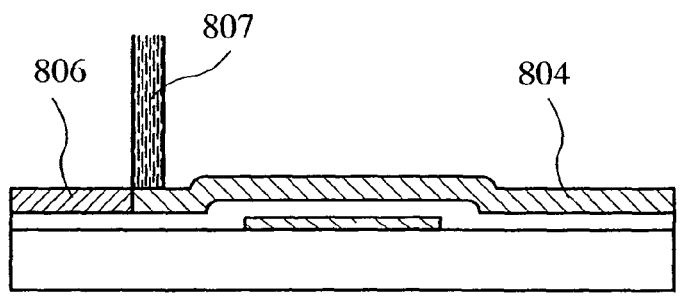
Figure 32D:
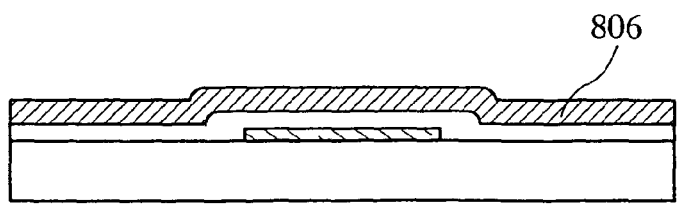

A gate electrode 802, a gate insulating film 803, and an amorphous semiconductor film 804 are formed over a substrate 801 (refer to FIG. 32A). The same materials and manufacturing processes can be selected as those used in Examples 1 and 2 for the gate electrode 802, the gate insulating film 803, and the amorphous semiconductor film 804. In this example, a glass substrate is used as the substrate 801, and molybdenum (Mo) is formed to have a thickness of 100 nm as the gate electrode 802. After forming the gate electrode 802, a silicon oxide film is formed to have a thickness of 100 nm as a gate insulating film 803. As an amorphous semiconductor film 804, an amorphous silicon film is formed to have a thickness of 100 nm. The amorphous silicon film may include an element selected from elements belonging to group 13, for example, boron (B).

Then, the amorphous semiconductor film 804 is crystallized. As a method for crystallization, a method of introducing a catalyst element 805 into the amorphous semiconductor film 804, heating, and crystallizing (refer to FIG. 32B); or a method of crystallizing the amorphous semiconductor film 804 by emitting laser beam 807 (FIG. 32C) can be nominated. Needless to say, the amorphous semiconductor film 804 can be crystallized by emitting the laser beam 807 after being introduced with the catalyst element 805.

A crystalline semiconductor film 806 is obtained by crystallizing the amorphous semiconductor film 804 (refer to FIG. 32D), and a protective film is formed over a region to be served as a channel formation region of the crystalline semiconductor film 806. The protective film 808 may be formed by an insulating film, for example, a silicon oxide film, a silicon nitride film, or the like. In this example, a silicon oxide film is formed to have a thickness of 50 nm as the protective film 808 and etched with HF solution or the like (refer to FIG. 33A).

The crystalline semiconductor film 806 is etched by using the protective film 808 as a mask. A crystalline semiconductor film 809 having steps and a channel formation region 821 is formed by the etching (refer to FIG. 33B).

Figure 33A:
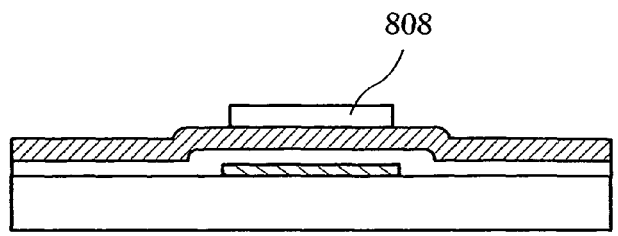
FIGS. 33A to 33D are views for showing a manufacturing process of a TFT according to the present invention.
Figure 33B:
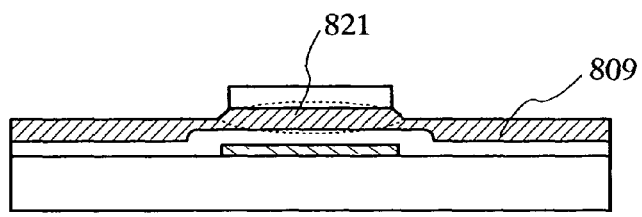
Figure 33C:
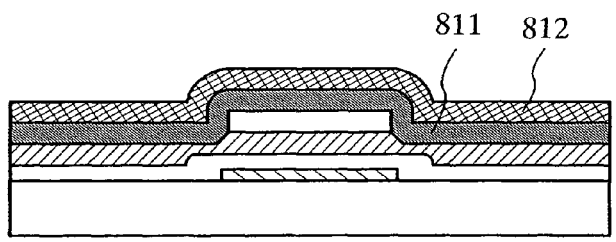
Figure 33D:
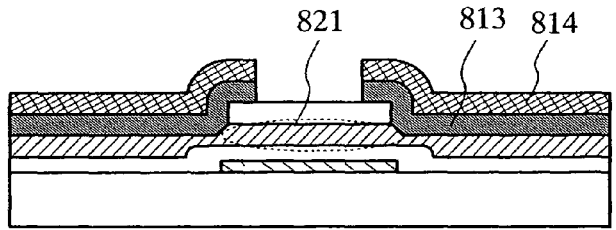

Then, a semiconductor film 811 containing an impurity belonging to group 15 in the periodic table and a conductive film 812 are formed over the crystalline semiconductor film 809 having steps and the protective film 808 (refer to FIG. 33C). In this example, phosphorus is used as the impurity belonging to group 15. As the conductive film 812, molybdenum (Mo) is formed to have a thickness of 200 nm. The semiconductor film 811 and the conductive film 812 are not limited thereto, and can be selected in accordance with description in Examples 1 and 2.

Moreover, a source or drain electrode 814 is obtained by etching the conductive film 812. Then, a source or drain region 813 is formed by etching the semiconductor film 811 with the source or drain electrode 814 as a mask (refer to FIG. 33D). A depletion layer due to drain voltage can be extended in a crosswise direction from a drain region to a source region according to such the structure, and so a drain electric field can be relieved.

It has already been explained that this example is implemented by utilizing the processes described in Examples 1 and 2. If necessary, this example can be freely combined with any description in Embodiment and Examples 3 to 8.

A TFT with improved reliability and a semiconductor device having such the TFT can be manufactured without using a doping apparatus according to the present invention, and so manufacturing costs can be reduced.

This application is based on Japanese Patent Application serial no. 2004-314346 filed in Japan Patent Office on 2004 Oct. 28, the contents of which are hereby incorporated by reference.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A semiconductor device comprising:
a gate electrode over a substrate;
a gate insulating film over the gate electrode;
an island semiconductor film containing an element belonging to group 13 in a periodic table over the gate insulating film, wherein the island semiconductor film is formed of a silicon film;
a first semiconductor film containing an element belonging to group 15 in a periodic table being in direct contact with a first part of a top surface of the island semiconductor film containing the element belonging to group 13, a first side face of the island semiconductor film containing the element belonging to group 13, and a first top surface of the gate insulating film;
a second semiconductor film containing an element belonging to group 15 in a periodic table being in direct contact with a second part of the top surface of the island semiconductor film containing the element belonging to group 13, a second side face of the island semiconductor film containing the element belonging to group 13, and a second top surface of the gate insulating film;
a first electrode over the first semiconductor film containing the element belonging to group 15;
a second electrode over the second semiconductor film containing the element belonging to group 15; and
an insulating film over the first electrode and the second electrode,
wherein the island semiconductor film containing the element belonging to group 13 is a channel formation region,
wherein the first semiconductor film containing the element belonging to group 15 is a source region, and
wherein the second semiconductor film containing the element belonging to group 15 is a drain region.

2. The semiconductor device according to claim 1, wherein the island semiconductor film comprises a crystalline semiconductor film.

3. The semiconductor device according to claim 1, wherein the first and second semiconductor films are silicon films.

4. The semiconductor device according to claim 1, wherein the substrate has flexibility.

5. The semiconductor device according to claim 1, wherein the first electrode covers an end of the first semiconductor film.

6. The semiconductor device according to claim 1,
wherein the first part of the top surface of the island semiconductor film is a first planer surface, and
wherein the second part of the top surface of the island semiconductor film is a second planer surface.

7. The semiconductor device according to claim 1,
wherein the first top surface of the gate insulating film is overlapped with the gate electrode, and
wherein the second top surface of the gate insulating film is overlapped with the gate electrode.

8. The semiconductor device according to claim 1,
wherein the island semiconductor film is a microcrystalline semiconductor film.

9. The semiconductor device according to claim 1,
wherein in the channel formation region, a broadening of a depletion layer along a crosswise direction is larger than a broadening of the depletion layer along a thickness direction, and
wherein the crosswise direction is a direction in parallel to the substrate.

10. A semiconductor device comprising:
a gate electrode over a substrate;
a first insulating film over the gate electrode;
an island semiconductor film containing a first element over the first insulating film, wherein the island semiconductor film is formed of a silicon film;
a first semiconductor film containing a second element being in direct contact with a first part of a top surface of the island semiconductor film containing the first element, a first side face of the island semiconductor film containing the first element, and a first top surface of the first insulating film;
a second semiconductor film containing the second element being in direct contact with a second part of the top surface of the island semiconductor film containing the first element, a second side face of the island semiconductor film containing the first element, and a second top surface of the first insulating film;
a first electrode over the first semiconductor film containing the second element;
a second electrode over the second semiconductor film containing the second element;
a second insulating film over the first electrode and the second electrode; and
a pixel electrode over the second insulating film and being electrically connected to the first electrode
wherein the island semiconductor film containing the first element is a channel formation region,
wherein the first semiconductor film containing the second element is a source region, and
wherein the second semiconductor film containing the second element is a drain region.

11. The semiconductor device according to claim 10, wherein the island semiconductor film is a crystalline semiconductor film.

12. The semiconductor device according to claim 10, wherein a conductivity type of the island semiconductor film containing the first element is opposite to that of the first and second semiconductor films containing the second element.

13. The semiconductor device according to claim 10, wherein the first and second semiconductor films are silicon films.

14. The semiconductor device according to claim 10, wherein the substrate has flexibility.

15. The semiconductor device according to claim 10, wherein the first electrode covers an end of the first semiconductor film.

16. The semiconductor device according to claim 10,
wherein the first part of the top surface of the island semiconductor film is a first planer surface, and
wherein the second part of the top surface of the island semiconductor film is a second planer surface.

17. The semiconductor device according to claim 10,
wherein the first top surface of the first insulating film is overlapped with the gate electrode, and
wherein the second top surface of the first insulating film is overlapped with the gate electrode.

18. The semiconductor device according to claim 10,
wherein the island semiconductor film is a microcrystalline semiconductor film.

19. The semiconductor device according to claim 10,
wherein in the channel formation region, a broadening of a depletion layer along a crosswise direction is larger than a broadening of the depletion layer along a thickness direction, and
wherein the crosswise direction is a direction in parallel to the substrate.

* * * * *